(12) United States Patent
Miyamoto et al.

(10) Patent No.: US 7,110,279 B2
(45) Date of Patent: Sep. 19, 2006

(54) MEMORY

(75) Inventors: Hideaki Miyamoto, Ogaki (JP);
Yoshiyuki Ishizuka, Inazawa (JP);
Naofumi Sakai, Anpachi-gun (JP)

(73) Assignee: Sanyo Electric Co., Ltd., Osaka (JP)

( * ) Notice: Subject to any disclaimer, the term of this patent is extended or adjusted under 35 U.S.C. 154(b) by 0 days.

(21) Appl. No.: 10/935,554

(22) Filed: Sep. 8, 2004

(65) Prior Publication Data

US 2005/0057958 A1 Mar. 17, 2005

(30) Foreign Application Priority Data

Sep. 11, 2003 (JP) ............................ 2003-319483
Apr. 22, 2004 (JP) ............................ 2004-126244

(51) Int. Cl.
*G11C 11/22* (2006.01)
*G11C 11/24* (2006.01)

(52) U.S. Cl. ...................................... 365/145; 365/149

(58) Field of Classification Search ................ 365/145, 365/149, 185.02, 194, 233, 233.5
See application file for complete search history.

(56) References Cited

U.S. PATENT DOCUMENTS

| | | | |
|---|---|---|---|
| 6,771,531 B1 * | 8/2004 | Nishihara | 365/145 |
| 6,788,564 B1 * | 9/2004 | Hamada | 365/145 |
| 6,809,949 B1 * | 10/2004 | Ho | 365/149 |
| 6,816,398 B1 * | 11/2004 | Sakai et al. | 365/145 |
| 6,891,742 B1 * | 5/2005 | Takano et al. | 365/145 |
| 6,920,060 B1 * | 7/2005 | Chow et al. | 365/145 |
| 6,940,742 B1 * | 9/2005 | Yamamura | 365/149 |

FOREIGN PATENT DOCUMENTS

| | | |
|---|---|---|
| JP | 06-349267 | 12/1994 |
| JP | 10-064255 | 3/1998 |
| JP | 2003-288784 | 10/2003 |

* cited by examiner

*Primary Examiner*—Trong Phan
(74) *Attorney, Agent, or Firm*—Arent Fox, PLLC.

(57) ABSTRACT

A memory capable of suppressing disturbance is provided. This memory activates each of a selected word line and a bit line corresponding to unrewritten storage means while keeping potential difference therebetween at a level not more than a prescribed value and differentiates the length of a period for applying a voltage for rewriting to each of the selected word line and a bit line corresponding to rewritten storage means from the length of a transition period of the potential of at least either the word line or the bit line corresponding to the unrewritten storage means when performing a rewrite operation on partial selected storage means or performing no rewrite operation on all selected storage means.

25 Claims, 21 Drawing Sheets

WRITE

STANDBY

MEMORY

BACKGROUND OF THE INVENTION

1. Field of the Invention

The present invention relates to a memory, and more particularly, it relates to a memory having storage means connected between word and bit lines.

2. Description of the Background Art

In general, volatile and nonvolatile memories are known as semiconductor memories. A DRAM (dynamic random access memory) is known as the volatile memory, while a flash EEPROM (electrically erasable and programmable read only memory) is known as the nonvolatile memory. The DRAM and the flash EEPROM allowing high integration are widely used.

FIG. 25 is an equivalent circuit diagram showing the structure of each memory cell 103 of a conventional DRAM. FIG. 26 is a sectional view showing the structure of each trench capacitor employed in the conventional DRAM. Referring to FIG. 25, each memory cell 103 of the conventional DRAM, i.e., a conventional volatile memory, is constituted of a selection transistor 101 and a capacitor 102. The capacitor 102 stores information of the memory cell 103 as charges. In order to read the information from the memory cell 103, a word line WL rises to turn on the selection transistor 101. Thus, a cell capacitance Ccell and a bit line capacitance Cbl are capacitively coupled with each other. Therefore, a bit line potential decided by the quantity of charges stored in the memory cell 103 can be read.

In order to ensure the cell capacitance Ccell of the capacitor 102 also when the memory cell 103 of the conventional DRAM having the aforementioned structure is refined, the trench capacitor formed by vertically extending upper and lower electrodes 102a and 102c and a dielectric film 102b constituting the capacitor 102 is employed as shown in FIG. 26. If refinement further progresses, however, it is difficult to ensure the cell capacitance Ccell of the capacitor 102 with the trench capacitor shown in FIG. 26. In other words, high integration of the DRAM by reduction of a design rule increasingly approaches the limit.

In the flash EEPROM (hereinafter referred to as a flash memory), i.e., the nonvolatile memory, memory cells of a stacked or split gate CHE (channel hot electron) write system are limited in refinement of the channel length. In memory cells of an FN (Fowler-Nordheim) write system such as a NAND form, the limit of refinement is equivalent to that in logic transistors. However, the flash memory requires a high voltage of 15 V to 20 V in operation, and when a power supply voltage for the logic transistors is progressively reduced, generation efficiency for generating the high voltage of 15 V to 20 V from the reduced power supply voltage is reduced. Therefore, power consumption is increased and the area of a charge pumping part is increased, disadvantageously hindering refinement.

On the other hand, a ferroelectric memory is known as one of nonvolatile memories recently watched with interest. This ferroelectric memory utilizes pseudo capacitance variation with the direction of polarization of a ferroelectric substance as a memory element. This ferroelectric memory, allowing data rewriting at a high speed with a low voltage in principle, is spotlighted as an ideal memory having the advantages of the DRAM, i.e., the high speed and the low voltage, and that of the flash memory, i.e., nonvolatility.

Memory cell systems for a ferroelectric memory are roughly classified into three types, i.e., a one-transistor one-capacitor system, a simple matrix system and a one-transistor system. FIG. 27 is an equivalent circuit diagram showing each memory cell 113 of a one-transistor one-capacitor ferroelectric memory. FIG. 28 is an equivalent circuit diagram showing a memory cell array of a simple matrix ferroelectric memory. FIG. 29 is a hysteresis diagram for illustrating operations of the simple matrix ferroelectric memory, and FIG. 30 is a hysteresis diagram for illustrating disturbance in the simple matrix ferroelectric memory. FIG. 31 is an equivalent circuit diagram showing memory cells of a one-transistor ferroelectric memory, and FIG. 32 is a hysteresis diagram for illustrating operations of the one-transistor ferroelectric memory. FIG. 33 is an equivalent circuit diagram for illustrating a voltage application state in writing in the one-transistor ferroelectric memory shown in FIG. 31, and FIG. 34 is an equivalent circuit diagram showing a voltage application state in a standby state of the one-transistor ferroelectric memory shown in FIG. 31.

As shown in FIG. 27, each memory cell 113 of the one-transistor one-capacitor ferroelectric memory is constituted of a selection transistor 111 and a ferroelectric capacitor 112, similarly to a DRAM cell. The memory cell 113 is different from the DRAM cell in the ferroelectric capacitor 112. In operation, a word line WL rises to turn on the selection transistor 111. Thus, a capacitance Ccell of the ferroelectric capacitor 112 and a bit line capacitance Cbl are connected with each other. Then, a plane line PL is pulse-driven for transmitting charges, varied in quantity with the direction of polarization of the ferroelectric capacitor 112, to a bit line BL. Data is read as the voltage of the bit line BL, similarly to the DRAM cell.

In the one-transistor one-capacitor ferroelectric memory, refinement of the ferroelectric capacitor 112 is limited due to the structure similar to that of the DRAM. Therefore, the one-transistor one-capacitor ferroelectric memory is limited in integration similarly to the DRAM.

The simple matrix ferroelectric memory is now described with reference to FIGS. 28 to 30. As shown in FIG. 28, memory cells 121 of the simple matrix ferroelectric memory are constituted of word lines WL, bit lines BL and ferroelectric capacitors 122 located on the intersections between the word lines WL and the bit lines BL.

First and second ends of the ferroelectric capacitors 122 are connected to the word lines WL and the bit lines BL respectively. This simple matrix ferroelectric memory, reading potentials resulting from capacitive coupling between the bit lines BL and the ferroelectric capacitors 122, must ensure capacitances similarly to the DRAM. However, the simple matrix ferroelectric memory, having the memory cells 121 constituted of only the ferroelectric capacitors 122 with no selection transistors, can be more increased in degree of integration than the one-transistor one-capacitor ferroelectric memory.

Operations of the simple matrix ferroelectric memory are described with reference to FIGS. 28 and 29. Table 1 shows voltages applied to the memory cells 121 in standby, reading and writing states respectively.

TABLE 1

|  | Standby | Read | Write "1" | Write "0" |
|---|---|---|---|---|
| Selected WL | 1/2VCC | VCC | 0 | VCC |
| NonselectedWL | 1/2VCC | 1/3VCC | 2/3VCC | 1/3VCC |
| Selected BL | 1/2VCC | 0→Floating | VCC | 0 |
| NonselectedBL | 1/2VCC | 2/3VCC | 1/3VCC | 2/3VCC |

As to a write operation, both ends of each ferroelectric capacitor 122 are at the same potential in the standby state.

In order to write data "0" in any memory cell 121, the ferroelectric memory applies voltages VCC and 0 V to the word line WL and the bit line BL corresponding to this memory cell 121 respectively. At this time, the ferroelectric memory applies the voltage VCC to the ferroelectric capacitor 122 of this memory cell 121. Thus, the ferroelectric memory shifts to a point A shown in FIG. 29. Thereafter the ferroelectric memory sets both ends of the ferroelectric capacitor 122 to the same potential for making a transition to "0" shown in FIG. 29. In order to write data "1" in any memory cell 121, on the other hand, the ferroelectric memory applies the voltages 0 V and VCC to the corresponding word line WL and the corresponding bit line BL respectively. At this time, the ferroelectric memory applies a voltage −VCC to the ferroelectric capacitor 122. Thus, the ferroelectric memory shifts to another point B shown in FIG. 29. Thereafter the ferroelectric memory sets both ends of the ferroelectric capacitor 122 to the same potential for making a transition to "1" shown in FIG. 29.

As to a read operation, the ferroelectric memory precharges the corresponding bit line BL at 0 V. Then, the ferroelectric memory activates the corresponding word line WL to the voltage VCC. Assuming that CFE represents the capacitance of the ferroelectric capacitor 122 and CBL represents the parasitic capacitance of the bit line BL, the voltage VCC is capacitively divided by the parasitic capacitance CFE and the capacitance CBL. The capacitance CFE of the ferroelectric capacitor 122 can be approximated as C0 or C1 in response to data held therein. Therefore, the potential of the bit line BL is expressed as follows:

$$V0 = \{C0/(C0+CBL)\} \times VCC \quad (1)$$

$$V1 = \{C1/(C1+CBL)\} \times VCC \quad (2)$$

The above expression (1) indicates the potential V0 of the bit line BL connected to the memory cell 121 holding data "0", while the above expression (2) indicates the potential V1 of the bit line BL connected to the memory cell 121 holding data "1".

A read amplifier determines the difference between the bit line potentials V0 and V1 according to the above expressions (1) and (2) thereby reading data. The data of the memory cell 121 is destroyed in this data reading, and hence the ferroelectric memory performs a write operation (restore operation) responsive to the read data after the data reading.

In the simple matrix ferroelectric memory, data disadvantageously disappear from nonselected cells. More specifically, the ferroelectric memory applies a voltage ⅓ VCC to all nonselected memory cells in writing and reading. As shown in FIG. 30, therefore, the quantity of polarization Q is reduced due to the hysteresis of a ferroelectric substance, leading to disappearance of the data.

The one-transistor ferroelectric memory is now described with reference to FIGS. 31 to 34. As shown in FIG. 31, memory cells 131 of the one-transistor ferroelectric memory are formed by connecting ferroelectric capacitors 132 to gates of MOS transistors 133. In this one-transistor ferroelectric memory, first and second ends of the ferroelectric capacitors 132 are connected to word lines WL and the gates of the MOS transistors 133 constituting cell transistors respectively. In the one-transistor ferroelectric memory, threshold voltages of the MOS transistors 133 vary with the directions of polarization of the ferroelectric capacitors 132, to vary memory cell currents. The ferroelectric memory reads data by determining the variation of the memory cell currents. In the one-transistor ferroelectric memory reading data by detecting the memory cell currents, the capacitances of the ferroelectric capacitors 132 may not be increased to some extent in consideration of bit line capacitances, dissimilarly to the one-transistor one-capacitor ferroelectric memory shown in FIG. 27. Therefore, the ferroelectric capacitors 132 can be so reduced in size that the one-transistor ferroelectric memory is suitable for refinement.

Operations of the one-transistor ferroelectric memory are now described. In a standby state, all word lines WL, all bit lines BL and all source lines SL are at the voltage 0 V. In a write operation for writing data "1" in any memory cell 131, the ferroelectric memory applies a step-up voltage Vpp to the word line WL corresponding to this memory cell 131. At this time, the ferroelectric memory applies a potential VCC capacitively divided with the gate capacitance of the MOS transistor 133 to the ferroelectric capacitor 132. Thus, the ferroelectric memory shifts to a point A shown in FIG. 32 despite the initial state. Thereafter the ferroelectric memory returns the word line WL to the voltage 0 V, for making a transition to data "1" shown in FIG. 32. In order to write data "0" in any memory cell 131, on the other hand, the ferroelectric memory applies the voltage 0 V and the step-up voltage Vpp to the corresponding word line WL and the corresponding bit line BL respectively. In this case, the ferroelectric memory applies a voltage −VCC to the ferroelectric capacitor 132. Thus, the ferroelectric memory shifts to a point B shown in FIG. 32. Thereafter the ferroelectric memory returns the bit line BL to the voltage 0 V, for making a transition to data "0" shown in FIG. 32.

The one-transistor ferroelectric memory performs a read operation by activating the corresponding word line WL to a voltage Vr not causing polarization inversion. Thus, the gate voltage of the cell transistor (MOS transistor) 133 varies with the written state. A current flowing through the cell transistor 133 varies with the gate voltage thereof, and hence the ferroelectric transistor reads the current difference through the corresponding bit line BL. In other words, the one-transistor ferroelectric memory may read not potential difference between the ferroelectric capacitor 132 and the bit line BL resulting from capacitive coupling but the current of the cell transistor 133, to require no polarization inversion in reading. Thus, the one-transistor ferroelectric memory is capable of nondestructive reading.

However, the one-transistor ferroelectric memory has a problem of disturbance of nonselected cells, similarly to the aforementioned simple matrix ferroelectric memory. The one-transistor ferroelectric memory also has a problem of the so-called reverse bias retention of data change resulting from a continuous reverse bias state to the ferroelectric capacitor 132. When the one-transistor ferroelectric memory applies the step-up voltage Vpp to any word line WL thereby writing data in the memory cell 131 corresponding to this word line WL as shown in FIG. 33 and thereafter returns to the standby state, a potential opposite to the direction of polarization is continuously applied as shown in FIG. 34. Therefore, the data holding time is disadvantageously reduced.

A method of reducing disturbance caused in nonselected memory cells of a one-transistor ferroelectric memory is proposed in general, as disclosed in Japanese Patent Laying-Open No. 10-64255 (1998), for example. In a data writing step disclosed in Japanese Patent Laying-Open No. 10-64255, the ferroelectric memory applies voltages +V, ⅓ V, 0 V and ⅔ V to a word line connected to a selected cell, the remaining word lines, a bit line connected to the selected cell and the remaining bit lines respectively as a first procedure. Then, the ferroelectric memory applies voltages 0 V, ⅓ V, ⅓ V and 0 V to the word line connected to the selected cell, the remaining word lines, the bit line connected to the selected cell and the remaining bit lines respectively as a second procedure. If applying voltages −V, −⅓ V, 0 V and −⅔ V to the word line connected to the selected cell, the remaining word lines, the bit line connected to the selected cell and the remaining bit lines respectively in the aforementioned first procedure, the ferroelectric memory applies voltages 0 V, −⅓ V, −⅓ V and 0 V to the word line connected to the selected cell, the remaining word lines, the bit line connected to the selected cell and the remaining bit lines respectively in the second procedure subsequent thereto. Thus, the ferroelectric memory applies voltages ⅓ V of different polarities to most nonselected cells throughout the first and second procedures, whereby disturbance can be remarkably reduced.

In the technique disclosed in the aforementioned Japanese Patent Laying-Open No. 10-64255, however, the ferroelectric memory applies no voltage to those of the non-selected cells sharing the word line and the bit line with the selected cell in the second procedure, and hence these cells are disadvantageously unavoidably disturbed. Further, Japanese Patent Laying-Open No. 10-64255 describes absolutely no method of reducing disturbance in reading.

SUMMARY OF THE INVENTION

The present invention has been proposed in order to solve the aforementioned problems, and an object of the present invention is to provide a memory capable of suppressing disturbance.

In order to attain the aforementioned object, a memory according to a first aspect of the present invention comprises a bit line, a word line arranged to intersect with the bit line and storage means connected between the bit line and the word line. The memory activates each of a selected word line and the bit line corresponding to unwritten storage means while keeping potential difference therebetween at a level not more than a prescribed value and differentiates the length of a period for applying a voltage for rewriting to each of the selected word line and the bit line corresponding to rewritten storage means from the length of a transition period of the potential of at least either the word line or the bit line corresponding to the unwritten storage means when performing a read operation on selected storage means connected to the selected word line and thereafter performing a rewrite operation on partial selected storage means or performing no rewrite operation on all selected storage means. The voltage for rewriting is desirably a voltage pulse. The term "transition period" indicates an interval of a point for changing the potential of at least either the word line or the bit line corresponding to the unwritten storage means in activation.

The memory according to the first aspect can apply a voltage of a first direction and a voltage having an electric field opposite to the first direction to at least nonselected storage means connected to a word line other than the selected word line by the same frequencies respectively throughout the aforementioned read and rewrite operations by adjusting the rewrite operation when performing the read operation on the selected storage means connected to the selected word line and thereafter performing the rewrite operation on the partial selected storage means as hereinabove described. Thus, the memory can inhibit at least the nonselected storage means connected to the word line other than the selected word line from disturbance in the read operation. Further, the memory activates each of the selected word line and the bit line corresponding to the unwritten storage means while keeping the potential difference therebetween at the level not more than the prescribed value so that the potential difference between the selected word line and the bit line corresponding to the unwritten storage means can be inhibited from exceeding the potential difference between the selected word line and the bit line corresponding to the unwritten storage means in the rewrite operation in the process of activating the selected word line and the bit line corresponding to the unwritten storage means by keeping the potential difference of the aforementioned prescribed value not more than the potential difference between the selected word line and the bit line corresponding to the unwritten storage means in the rewrite operation. Thus, the memory can inhibit the unwritten storage means from application of a voltage larger than that applied in the rewrite operation in the process of activating the selected word line and the bit line corresponding to the unwritten storage means also when timing for starting activating the selected word line and that for starting activating the bit line corresponding to the unwritten storage means are different from each other. Therefore, the memory can inhibit storage means not subjected to rewriting in the rewrite operation from disturbance.

Further, the memory according to the first aspect differentiates the length of the period for applying the voltage for rewriting to each of the selected word line and the bit line corresponding to the rewritten storage means from the length of the transition period of the potential of at least either the word line or the bit line corresponding to the unwritten storage means when performing rewriting on the selected storage means so that a period of a length necessary for performing rewriting on the selected storage means can be ensured by increasing the length of the period for performing rewriting on the selected storage means while increasing the speed for the read and rewrite operations of the memory due to the short transition period of the word line and the bit line corresponding to the unwritten storage means when increasing the length of the period for applying the voltage for rewriting to each of the selected word line and the bit line corresponding to the rewritten storage means beyond that of the aforementioned transition period, for example. Thus, the memory can reliably rewrite data in the selected storage means while increasing the operating speed thereof.

In the aforementioned memory according to the first aspect, the length of the period for applying the voltage is preferably larger than the length of the transition period of the voltage of at least either the word line or the bit line corresponding to the unwritten storage means. According to this structure, the memory can easily ensure the period of the length necessary for performing rewriting on the selected storage means by increasing the length of the period for performing rewriting on the selected storage means while increasing the speed for the read and rewrite operations of the memory due to the short transition period of the word line and the bit line corresponding to the unwritten storage means. Thus, the memory can easily reliably rewrite data in the selected storage means while increasing the operating speed thereof.

In the aforementioned memory according to the first aspect, the rewrite operation preferably consists of a plurality of operations, and the memory preferably applies a voltage supplying an electric field of a first direction and a voltage supplying another electric field opposite to the first direction to at least non-selected storage means other than the selected storage means by the same frequencies respectively throughout the read operation performed on the selected storage means connected to the selected word line and the rewrite operation consisting of the plurality of operations. According to this structure, the memory, applying the voltage supplying the electric field of the first direction and the voltage supplying the other electric field opposite to the first direction to at least all storage means connected to the word line other than the selected word line by the same frequencies respectively throughout the read and rewrite operations, can suppress polarization deterioration in at least all nonselected storage means connected to the word line other than the selected word line. Thus, the memory can suppress disturbance in the storage means throughout the read and rewrite operations.

In the aforementioned memory according to the first aspect, at least either the selected word line or the bit line corresponding to the unrewritten storage means preferably gradually rises to a voltage applied to the unrewritten storage means. According to this structure, the memory can activate either the selected word line or the bit line corresponding to the unrewritten storage means in advance of the other one while suppressing disturbance by gradually activating the same by a voltage capable of suppressing disturbance, for example. The wording "gradually activating" includes not only a case of activating the object stepwise but also a case of continuously activating the same.

In this case, at least either the selected word line or the bit line corresponding to the unrewritten storage means rises stepwise by not more than ⅓ of potential difference applied to the rewritten storage means. According to this structure, the memory, capable of inhibiting potential difference between the selected word line and the bit line corresponding to the unrewritten storage means from exceeding ⅓ of the potential difference applied to the rewritten storage means when performing rewriting, can suppress disturbance resulting from application of potential difference exceeding ⅓ of the potential difference applied to the rewritten storage means to the unrewritten storage means. Throughout the specification, the wording "⅓ of the potential difference applied to the rewritten storage means" indicates substantially ⅓ of the potential difference applied to the rewritten storage means in the rewrite operation. In other words, this wording also includes potential difference slightly larger or smaller than ⅓ of the potential difference instantaneously applied to the rewritten storage means by noise or the like.

In the aforementioned memory according to the first aspect, the bit line corresponding to the unrewritten storage means preferably rises to a voltage applied to the unrewritten storage means while keeping the potential difference between the bit line and the word line at a level not more than a prescribed value before the selected word line rises. According to this structure, the memory can inhibit the potential difference between the selected word line and the bit line corresponding to the unrewritten storage means from exceeding the potential difference between the selected word line and the bit line corresponding to the unrewritten storage means in the rewrite operation when activating the selected word line. Therefore, the memory can reliably inhibit the unrewritten storage means from application of potential difference larger than that applied in the rewrite operation.

In this case, the bit line corresponding to the unrewritten storage means preferably rises by ⅓ of potential difference applied to the rewritten storage means as a first stage and thereafter rises by ⅓ of the potential difference applied to the rewritten storage means as a second stage. According to this structure, the memory can activate the bit line corresponding to the unrewritten storage means stepwise by ⅓ of the potential difference applied to the rewritten storage means, capable of suppressing disturbance, thereby activating the unrewritten storage means in advance of the selected word line while suppressing disturbance.

In this case, the memory preferably applies a voltage of ⅓ of the potential difference applied to the rewritten storage means also to the selected word line when the bit line corresponding to the unrewritten storage means rises by ⅓ of the potential difference applied to the rewritten storage means as the first stage. According to this structure, the potential difference between the selected word line and the bit line corresponding to the unrewritten storage means reaches 0 V in the first stage, whereby the memory can set the potential difference applied to the unrewritten storage means to 0 V. Thus, the memory can suppress disturbance of the unrewritten storage means in the first stage.

In the aforementioned memory according to the first aspect, the storage means preferably includes a ferroelectric film arranged between the word line and the bit line on the intersectional position between the word line and the bit line. According to this structure, disturbance can be suppressed in a simple matrix ferroelectric memory.

A memory according to a second aspect of the present invention comprises a bit line, a word line arranged to intersect with the bit line and storage means connected between the bit line and the word line, for activating each of a selected word line and the bit line corresponding to unrewritten storage means while keeping potential difference therebetween at a level not more than a prescribed value and activating at least either the selected word line or the bit line corresponding to the unrewritten storage means stepwise by not more than ⅓ of potential difference applied to rewritten storage means when performing a read operation on selected storage means connected to the selected word line and thereafter performing a rewrite operation on partial selected storage means or performing no rewrite operation on all selected storage means. According to the present invention, the wording "⅓ of the potential difference applied to the rewritten storage means" indicates substantially ⅓ of the potential difference applied to the rewritten storage means in the rewrite operation. In other words, this wording also includes potential difference slightly larger or smaller than ⅓ of the potential difference instantaneously applied to the rewritten storage means by noise or the like.

The memory according to the second aspect can apply a voltage of a first direction and a voltage having an electric field opposite to the first direction to at least nonselected storage means connected to a word line other than the selected word line by the same frequencies respectively throughout the aforementioned read and rewrite operations by adjusting the rewrite operation when performing the read operation on the selected storage means connected to the selected word line and thereafter performing the rewrite operation on the partial selected storage means as hereinabove described. Thus, the memory can inhibit at least the nonselected storage means connected to the word line other than the selected word line from disturbance in the read operation. Further, the memory activates each of the selected word line and the bit line corresponding to the unrewritten storage means while keeping the potential difference therebetween at the level not more than the prescribed value so that the potential difference between the selected word line and the bit line corresponding to the unrewritten storage means can be inhibited from exceeding the potential difference between the selected word line and the bit line corresponding to the unrewritten storage means in the rewrite operation in the process of activating the selected word line and the bit line corresponding to the unrewritten storage means by keeping the potential difference of the aforementioned prescribed value not more than the potential difference between the selected word line and the bit line corresponding to the unrewritten storage means in the rewrite operation. Thus, the memory can inhibit the unrewritten storage means from application of a voltage larger than that applied in the rewrite operation in the process of activating the selected word line and the bit line corresponding to the unrewritten storage means also when timing for starting activating the selected word line and that for starting activating the bit line corresponding to the unrewritten storage means are different from each other. Therefore, the memory can inhibit storage means not subjected to rewriting in the rewrite operation from disturbance. Further, the memory can inhibit the potential difference between the selected word line and the bit line corresponding to the unrewritten storage means from exceeding ⅓ of the potential difference applied to the rewritten storage means when performing the rewrite operation by activating at least either the selected word line or the bit line corresponding to the unrewritten storage means stepwise by ⅓ of the potential difference applied to the rewritten storage means. Thus, the memory can suppress disturbance resulting from application of potential difference exceeding ⅓ of the potential difference applied to the rewritten storage means to the unrewritten storage means.

In the aforementioned memory according to the second aspect, the bit line corresponding to the unrewritten storage means preferably rises to a voltage applied to the unrewritten storage means while keeping the potential difference between the bit line and the word line at a level not more than a prescribed value before the selected word line rises. According to this structure, the memory can inhibit the potential difference between the selected word line and the bit line corresponding to the unrewritten storage means from exceeding the potential difference between the selected word line and the bit line corresponding to the unrewritten storage means in the rewrite operation when activating the selected word line. Thus, the memory can reliably inhibit the unrewritten storage means from application of potential difference larger than the potential difference applied in the rewrite operation.

In this case, the bit line corresponding to the unrewritten storage means preferably rises by ⅓ of potential difference applied to the rewritten storage means as a first stage and thereafter rises by ⅓ of the potential difference applied to the rewritten storage means as a second stage. According to this structure, the memory can activate the bit line corresponding to the unrewritten storage means stepwise by ⅓ of the potential difference applied to the rewritten storage means, capable of suppressing disturbance, thereby activating the unrewritten storage means in advance of the selected word line while suppressing disturbance.

In this case, the memory preferably applies a voltage of ⅓ of the potential difference applied to the rewritten storage means also to the selected word line when the bit line corresponding to the unrewritten storage means rises by ⅓ of the potential difference applied to the rewritten storage means as the first stage. According to this structure, the potential difference between the selected word line and the bit line corresponding to the unrewritten storage means reaches 0 V in the first stage, whereby the memory can set the potential difference applied to the unrewritten storage means to 0 V. Thus, the memory can suppress disturbance of the unrewritten storage means in the first stage.

In the aforementioned memory according to the second aspect, the storage means preferably includes a ferroelectric film arranged between the word line and the bit line on the intersectional position between the word line and the bit line. According to this structure, disturbance can be suppressed in a simple matrix ferroelectric memory.

A memory according to a third aspect of the present invention comprises a bit line, a word line arranged to intersect with the bit line, storage means connected between the bit line and the word line and a control circuit for activating each of a selected word line and the bit line corresponding to unrewritten storage means while keeping potential difference therebetween at a level not more than a prescribed value and differentiating the length of a period for applying a voltage for rewriting to each of the selected word line and the bit line corresponding to rewritten storage means from the length of a transition period of the potential of at least either the word line or the bit line corresponding to the unrewritten storage means when performing a read operation on selected storage means connected to the selected word line and thereafter performing a rewrite operation on partial selected storage means or performing no rewrite operation on all selected storage means. The voltage for rewriting is desirably a voltage pulse. The term "transition period" indicates an interval of a point for changing the potential of at least either the word line or the bit line corresponding to the unrewritten storage means in activation.

The memory according to the third aspect can apply a voltage of a first direction and a voltage having an electric field opposite to the first direction to at least nonselected storage means connected to a word line other than the selected word line by the same frequencies respectively throughout the aforementioned read and rewrite operations by adjusting the rewrite operation when performing the read operation on the selected storage means connected to the selected word line and thereafter performing the rewrite operation on the partial selected storage means through the control circuit as hereinabove described. Thus, the memory can inhibit at least the nonselected storage means connected to the word line other than the selected word line from disturbance in the read operation. Further, the memory activates each of the selected word line and the bit line corresponding to the unrewritten storage means while keeping the potential difference therebetween at the level not more than the prescribed value so that the potential difference between the selected word line and the bit line corresponding to the unrewritten storage means can be inhibited from exceeding the potential difference between the selected word line and the bit line corresponding to the unrewritten storage means in the rewrite operation in the process of activating the selected word line and the bit line corresponding to the unrewritten storage means by keeping the potential difference of the aforementioned prescribed value not more than the potential difference between the selected word line and the bit line corresponding to the unrewritten storage means in the rewrite operation. Thus, the memory can inhibit the unrewritten storage means from application of a voltage larger than that applied in the rewrite operation in the process of activating the selected word line and the bit line corresponding to the unrewritten storage means also when timing for starting activating the selected word line and that for starting activating the bit line corresponding to the unrewritten storage means are different from each other. Therefore, the memory can inhibit storage means not subjected to rewriting in the rewrite operation from disturbance.

Further, the memory according to the third aspect differentiates the length of the period for applying the voltage for rewriting to each of the selected word line and the bit line corresponding to the rewritten storage means from the length of the transition period of the potential of at least either the word line or the bit line corresponding to the unrewritten storage means when performing rewriting on the selected storage means so that a period of a length necessary for performing rewriting on the selected storage means can be ensured by increasing the length of the period for performing rewriting on the selected storage means while increasing the speed for the read and rewrite operations of the memory due to the short transition period of the word line and the bit line corresponding to the unrewritten storage means when increasing the length of the period for applying the voltage for rewriting to each of the selected word line and the bit line corresponding to the rewritten storage means beyond that of the aforementioned transition period, for example. Thus, the memory can reliably rewrite data in the selected storage means while increasing the operating speed thereof.

In the aforementioned memory according to the third aspect, the control circuit preferably includes a clock control circuit part for generating a first signal for setting a starting point and an end point of a transition period of the potential of at least either the word line or the bit line corresponding to the unrewritten storage means and a second signal for setting a starting point and an end point of a period for applying a voltage for rewriting to each of the selected word line and the bit line corresponding to the rewritten storage means in response to a clock signal. According to this structure, the memory can easily ensure a period of a length necessary for rewriting data in the selected storage means also when the pulse width of the clock signal is reduced and the lengths of the transition period and the period for applying the voltage for rewriting are reduced for increasing the speed for the read and rewrite operations thereof by generating the second signal for setting the starting point and the end point of the period for applying the voltage for rewriting in response to the clock signal so that the length of the period for applying the voltage for rewriting is larger than that of the transition period set by the first signal with the clock control circuit part. Thus, the memory can easily reliably rewrite data in the selected storage means while increasing the operating speed thereof.

In the aforementioned memory according to the third aspect, the control circuit preferably includes a delay circuit part for generating a first signal for setting a starting point and an end point of a transition period of the potential of at least either the word line or the bit line corresponding to the unrewritten storage means and a second signal for setting a starting point and an end point of a period for applying a voltage for rewriting to each of the selected word line and the bit line corresponding to the rewritten storage means. According to this structure, the memory can easily ensure a period of a length necessary for rewriting data in the selected storage means by increasing the length of the period for rewriting data in the selected storage means while increasing the speed for the read and rewrite operations thereof due to the short transition period by generating the second signal for setting the starting point and the end point of the period for applying the voltage for rewriting so that the length of the period for applying the voltage for rewriting is larger than that of the transition period set by the first signal with the delay circuit part. Thus, the memory can easily reliably rewrite data in the selected storage means while increasing the operating speed thereof.

In the aforementioned memory according to the third aspect, the length of the period for applying the voltage is preferably larger than the length of the transition period of the voltage of at least either the word line or the bit line corresponding to the unrewritten storage means. According to this structure, the memory can easily ensure a period of a length necessary for rewriting data in the selected storage means by increasing the period for performing rewriting on the selected storage means while increasing the speed for the read and rewrite operations thereof due to the short transition period of the word line and the bit line corresponding to the unrewritten storage means. Thus, the memory can easily reliably rewrite data in the selected storage means while increasing the operating speed thereof.

In the aforementioned memory according to the third aspect, the rewrite operation preferably consists of a plurality of operations, and the memory preferably applies a voltage supplying an electric field of a first direction and a voltage supplying another electric field opposite to the first direction to at least non-selected storage means other than the selected storage means by the same frequencies respectively throughout the read operation performed on the selected storage means connected to the selected word line and the rewrite operation consisting of the plurality of operations. According to this structure, the memory, applying the voltage supplying the electric field of the first direction and the voltage supplying the other electric field opposite to the first direction to at least all storage means connected to the word line other than the selected word line by the same frequencies respectively throughout the read and rewrite operations, can suppress polarization deterioration in at least all nonselected storage means connected to the word line other than the selected word line. Thus, the memory can suppress disturbance in the storage means throughout the read and rewrite operations.

In the aforementioned memory according to the third aspect, at least either the selected word line or the bit line corresponding to the unrewritten storage means gradually rises to a voltage applied to the unrewritten storage means. According to this structure, the memory can activate either the selected word line or the bit line corresponding to the unrewritten storage means in advance of the other one while suppressing disturbance by gradually activating the same by a voltage capable of suppressing disturbance, for example. The wording "gradually activating" includes not only a case of activating the object stepwise but also a case of continuously activating the same.

In this case, at least either the selected word line or the bit line corresponding to the unrewritten storage means rises stepwise by not more than $1/3$ of potential difference applied to the rewritten storage means. According to this structure, the memory, capable of inhibiting potential difference between the selected word line and the bit line corresponding to the unrewritten storage means from exceeding $1/3$ of the potential difference applied to the rewritten storage means when performing rewriting, can suppress disturbance resulting from application of potential difference exceeding $1/3$ of the potential difference applied to the rewritten storage means to the unrewritten storage means. Throughout the specification, the wording "$1/3$ of the potential difference applied to the rewritten storage means" indicates substantially $1/3$ of the potential difference applied to the rewritten storage means in the rewrite operation. In other words, this wording also includes potential difference slightly larger or smaller than $1/3$ of the potential difference instantaneously applied to the rewritten storage means by noise or the like.

In the aforementioned memory according to the third aspect, the bit line corresponding to the unrewritten storage means preferably rises to a voltage applied to the unrewritten storage means while keeping the potential difference between the bit line and the word line at a level not more than a prescribed value before the selected word line rises. According to this structure, the memory can inhibit the potential difference between the selected word line and the bit line corresponding to the unrewritten storage means from exceeding the potential difference between the selected word line and the bit line corresponding to the unrewritten storage means in the rewrite operation when activating the selected word line. Therefore, the memory can reliably inhibit the unrewritten storage means from application of potential difference larger than that applied in the rewrite operation.

In this case, the bit line corresponding to the unrewritten storage means preferably rises by ⅓ of potential difference applied to the rewritten storage means as a first stage and thereafter rises by ⅓ of the potential difference applied to the rewritten storage means as a second stage. According to this structure, the memory can activate the bit line corresponding to the unrewritten storage means stepwise by ⅓ of the potential difference applied to the rewritten storage means, capable of suppressing disturbance, thereby activating the unrewritten storage means in advance of the selected word line while suppressing disturbance.

In this case, the memory preferably applies a voltage of ⅓ of the potential difference applied to the rewritten storage means also to the selected word line when the bit line corresponding to the unrewritten storage means rises by ⅓ of the potential difference applied to the rewritten storage means as the first stage. According to this structure, the potential difference between the selected word line and the bit line corresponding to the unrewritten storage means reaches 0 V in the first stage, whereby the memory can set the potential difference applied to the unrewritten storage means to 0 V. Thus, the memory can suppress disturbance of the unrewritten storage means in the first stage.

In the aforementioned memory according to the third aspect, the storage means preferably includes a ferroelectric film arranged between the word line and the bit line on the intersectional position between the word line and the bit line. According to this structure, disturbance can be suppressed in a simple matrix ferroelectric memory.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Embodiments of the present invention are now described with reference to the drawings.

First Embodiment

Figure 1:
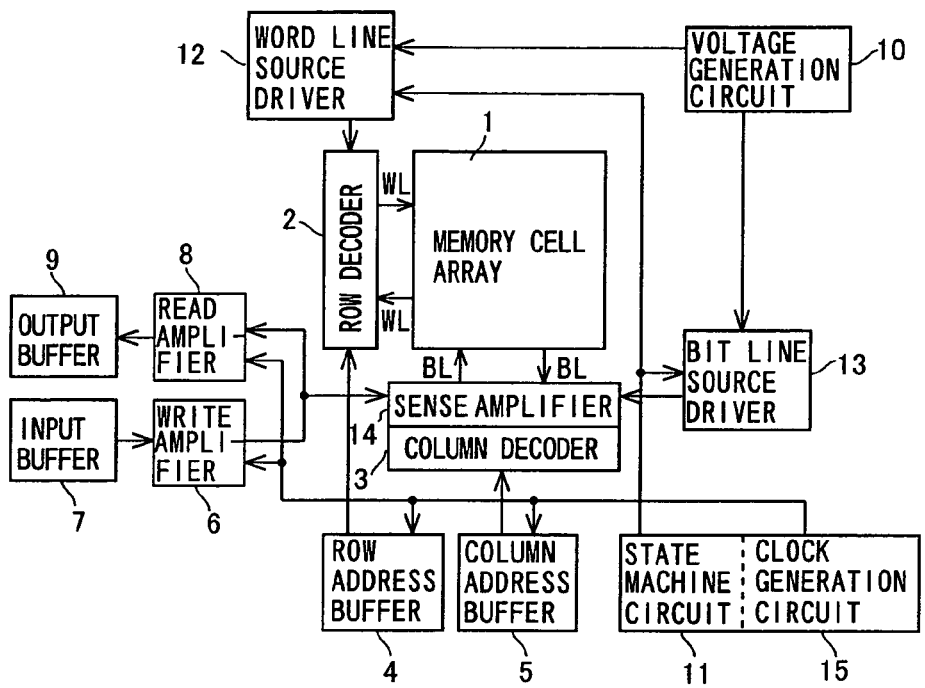
FIG. 1 is a block diagram showing the overall structure of a simple matrix ferroelectric memory according to a first embodiment of the present invention.

Referring to FIG. 1, the overall structure of a simple matrix ferroelectric memory according to a first embodiment of the present invention is described. The ferroelectric memory according to the first embodiment comprises a memory cell array 1, a row decoder 2, a column decoder 3, a row address buffer 4, a column address buffer 5, a write amplifier 6, an input buffer 7, a read amplifier 8, an output buffer 9, a voltage generation circuit 10, a state machine circuit 11, a word line source driver 12, a bit line source driver 13, a sense amplifier 14 and a clock generation circuit 15.

In the memory cell array 1, a plurality of word lines WL and a plurality of bit lines BL are arranged to intersect with each other while simple matrix memory cells consisting of only ferroelectric capacitors (not shown) are arranged on the intersectional positions between the word lines WL and the bit lines BL respectively. The ferroelectric capacitors constituting the memory cells are examples of the "storage means" in the present invention. The ferroelectric capacitors constituting the memory cells are constituted of the word lines WL, the bit lines BL and ferroelectric films (not shown) arranged between the word lines WL and the bit lines BL. The row and column decoders 2 and 3 are connected to the word lines WL and the bit lines BL of the memory cell array 1 respectively.

The row decoder 2 is connected with the word line source driver 12, which in turn is connected with the voltage generation circuit 10. The state machine circuit 11 is also connected to the word line source driver 12. The sense amplifier 14 is connected with the bit line source driver 13, which in turn is connected with the voltage generation circuit 10. This voltage generation circuit 10 is constituted to supply voltages ⅓ VCC, ⅔ VCC and VCC to the word line source driver 12 and the bit line source driver 13. The write and read amplifiers 6 and 8 are also connected to the sense amplifier 14. The read amplifier 8 is also connected to the output buffer 9, while the write amplifier 6 is also connected to the input buffer 7. The clock generation circuit 15 is connected to the row address buffer 4, the column address buffer 5, the write amplifier 6 and the read amplifier 8.

Figure 2:
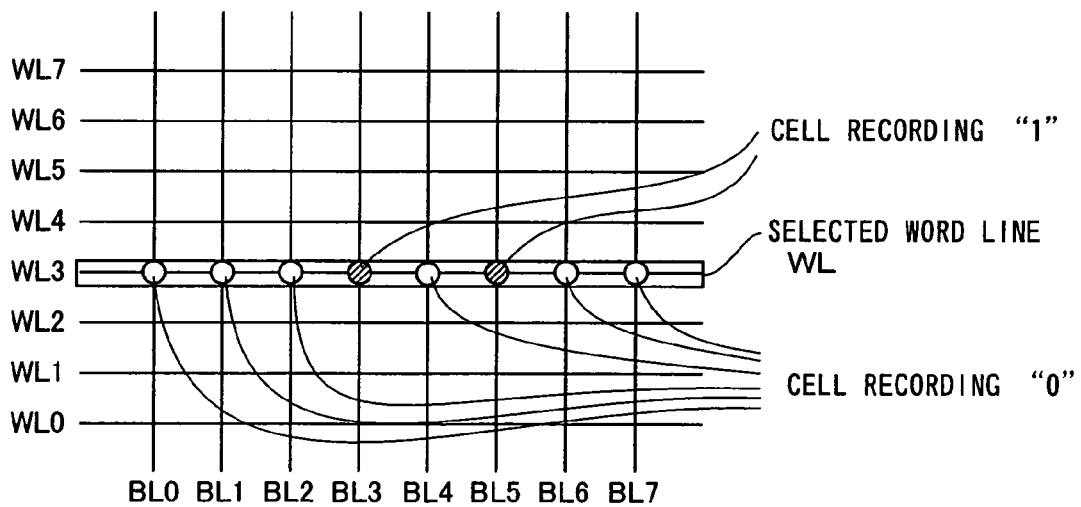
FIG. 2 illustrates a selected word line and data stored in memory cells connected to the selected word line in a memory cell array of the simple matrix ferroelectric memory according to the first embodiment of the present invention.
Figure 3:
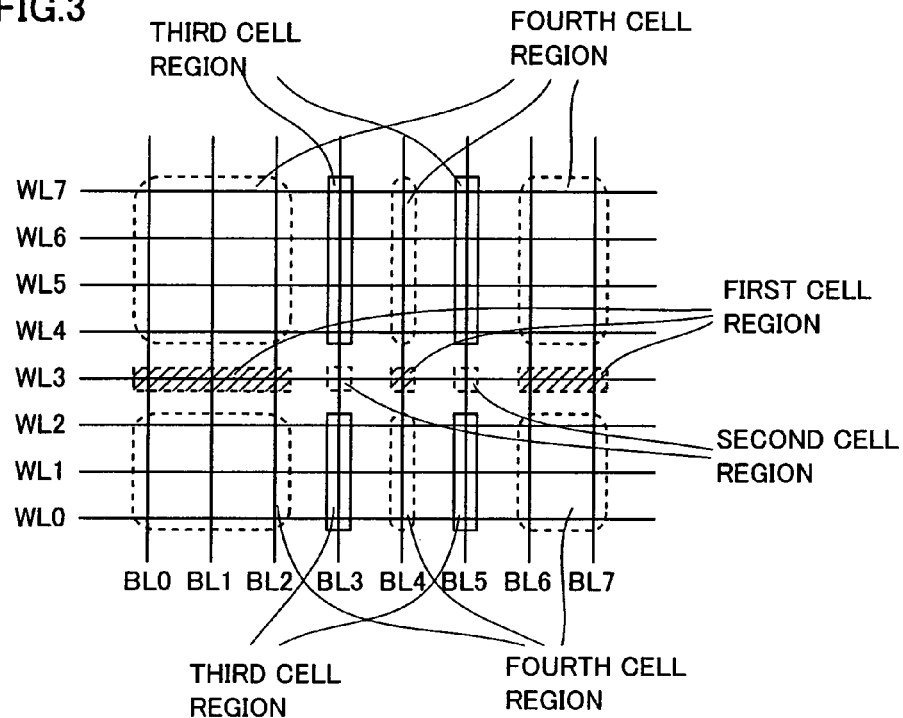
FIG. 3 illustrates definition of cell regions of the memory cell array of the simple matrix ferroelectric memory according to the first embodiment of the present invention.

Read-rewrite operations of the simple matrix ferroelectric memory according to the first embodiment are now described with reference to FIGS. 2 to 4. In the description of the first embodiment, it is assumed that a word line WL3 is selected while word lines WL0 to WL2 and WL4 to WL7 are nonselected, as shown in FIG. 2. It is also assumed that, among memory cells connected to the selected word line WL3, those connected to bit lines BL3 and BL5 store data "1" while memory cells connected to the remaining bit lines BL0 to BL2, BL4, BL6 and BL7 store data "0". The bit lines BL3 and BL5 connected with the memory cells storing the data "1" are referred to as "1" reading bit lines BL3 and BL5 while the bit lines BL0 to BL2, BL4, BL6 and BL7 connected with the memory cells storing the data "0" are referred to as "0" reading bit lines BL0 to BL2, BL4, BL6 and BL7. Further, groups of the memory cells storing the data "0" among those connected to the selected word line WL3 form first cell regions while those storing the data "1" form second cell regions, as shown in FIG. 3. In addition, groups of the memory cells connected to the "1" reading bit lines BL3 and BL5 among those connected to the nonselected word lines WL0 to WL2 and WL4 to WL7 form third cell regions while those connected to the "0" reading bit lines BL0 to BL2, BL4, BL6 and BL7 other than the bit lines BL3 and BL5 among those connected to the nonselected word lines WL0 to WL2 and WL4 to WL7 form fourth cell regions. The memory cells, connected to the selected word line WL3, included in the first and second cell regions are examples of the "selected storage means" in the present invention, and the memory cells included in the third and fourth cell regions are examples of the "nonselected storage means" in the present invention.

Figure 4:
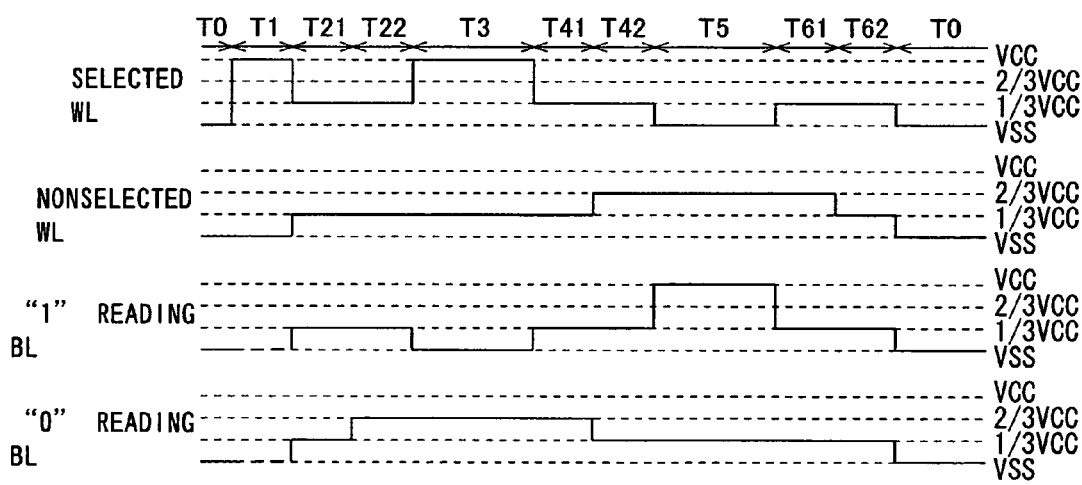
FIG. 4 is a voltage waveform diagram for illustrating read-rewrite operations of the memory according to the first embodiment of the present invention.

As shown in FIG. 4, the ferroelectric memory performs the read-rewrite operations in periods T0 to T62. All word lines WL and all bit lines BL are inactive (in standby states) in the period T0. The period T1 is for the read operation, and the periods T3 and T5 are for the rewrite operation. The memory applies electric fields of opposite directions to the memory cells in the periods T3 an T5 respectively. The periods T21, T22, T41, T42, T61 and T62 are those for successively varying the voltages of the word lines WL or the bit lines BL. The periods T1, T21 and T22 are examples of the "transition period" in the present invention. The operations in the periods T0 to T62 are now described with reference to FIGS. 3 and 4.

In the period T0 of the standby state, all word lines WL0 to WL7 and all bit lines BL0 to BL7 are at a voltage VSS (0 V). The memory makes a transition from the period T0 to the period T1 for reading in response to an externally input signal or the like. In this period T1, the memory steps up the voltage of the word line WL3 selected by an externally input address signal or the like to the level VCC. At this time, the nonselected word lines WL0 to WL2 and WL4 to WL7 hold the voltage VSS. In a prescribed period of the period T1, all bit lines BL (the "1" and "0" reading bit lines BL0 to BL7) enter high impedance states (open states) having indeterminate voltages between the levels VCC and VSS. Thus, the memory outputs a voltage corresponding to the data "0" or "1" recorded in the memory cells of the first and second cell regions connected to the selected word line WL3 and inputs the same in the sense amplifier 14 (see FIG. 1) through the bit lines BL0 to BL7. The memory compares the voltage input in the sense amplifier 14 with a separately formed reference potential and amplifies the difference therebetween in the sense amplifier 14 thereby determining whether the memory cells store the data "0" or "1".

In the prescribed period of the period T1 when the bit lines BL0 to BL7 are in the high impedance states, the memory applies different voltages to the memory cells of the first to fourth cell regions (see FIG. 3) respectively. More specifically, the memory applies a voltage VCC−Vr0 ("0" reading voltage) to the memory cells of the first cell regions. Further, the memory applies a voltage VCC−Vr1 ("1" reading voltage) to the memory cells of the second cell regions. In addition, the memory applies voltages −Vr1 and −Vr0 to the memory cells of the third and fourth cell regions respectively. After a lapse of the period of the high impedance states in the period T1, the memory sets all bit lines BL0 to BL7 to the voltage VSS. At this time, the memory applies the voltage VCC to the memory cells of the first and second cell regions while applying no voltage to the memory cells of the third and fourth cell regions.

Then, the memory makes a transition to the period T21 in response to an externally input signal or a signal generated therein. After the period T21, the memory makes a transition to each of the periods T22 to T62 in response to an externally input signal or a signal generated therein, similarly to the shifting from the period T1 to the period T21. When making this transition from the period T1 to the period T21, the memory according to the first embodiment simultaneously steps up the voltages of the selected word line WL3 and the "0" reading bit lines BL0 to BL2, BL4, BL6 and BL7 to the same voltage ⅓ VCC respectively. The memory also simultaneously steps up the voltages of the nonselected word lines WL0 to WL2 and WL4 to WL7 and the "1" reading bit lines BL3 and BL5 to the voltage ⅓ VCC respectively. Thus, the potential difference between the word lines WL and the bit lines BL in all memory cells of the first to fourth cell regions reaches 0 V in the period T21. If conversion of the voltages applied from the nonselected word lines WL0 to WL2 and WL4 to WL7, the "1" reading bit lines BL3 and BL5 and the "0" reading bit lines BL0 to BL2, BL4, BL6 and BL7 to the memory cells to the level ⅓ VCC slightly delays due to delay of the voltage transmission, the potential difference between all word lines WL, i.e., the selected word line WL3 and the nonselected word lines WL0 to WL2 and WL4 to WL7 and all bit lines BL, i.e., the "1" reading bit lines BL3 and BL5 and the "0" reading bit lines BL0 to BL2, BL4, BL6 and BL7 is in the range of not more than the level ⅓ VCC and hence the memory applies no voltage exceeding the level ⅓ VCC to all memory cells.

Then, the memory makes a transition to the period T22. In this period T22, the memory holds the voltages of the selected word line WL3, the nonselected word lines WL0 to WL2 and WL4 to WL7 and the "1" reading bit lines BL3 and BL5 at the level ⅓ VCC while stepping up the voltages of the "0" reading bit lines BL0 to BL2, BL4, BL6 and BL7 to the level ⅔ VCC. Thus, the memory steps up the voltages of the "0" reading bit lines BL0 to BL2, BL4, BL6 and BL7 in two stages over the period T1 to T22 according to the first embodiment. In the period T22, the memory applies the voltage −⅓ VCC to the memory cells of the first and fourth cell regions while holding the voltages applied to the memory cells of the second and third regions at 0 V.

Then, the memory makes a transition to the period T3 for performing a first rewrite operation on the memory cells. According to the first embodiment, the memory sets the length of the period T3 to twice the length of the periods T1 to T22, as show in FIG. 4. In the period T3, the memory steps up the voltage of the selected word line WL3 to the level VCC again. The memory further holds the voltages of the non-selected word lines WL0 to WL2 and WL4 to WL7 and the "0" reading bit lines BL0 to BL2, BL4, BL6 and BL7 at the levels ⅓ VCC and ⅔ VCC respectively while reducing the voltage of the "1" reading bit lines BL3 and BL5 to the level VSS. Thus, the memory applies the voltage VCC to the memory cells of the second cell regions connected to the "1" reading bit lines BL3 and BL5, thereby rewriting the data "0" in the memory cells of the second cell regions. The memory sets the period T3 to twice the length of the periods T1 to T22, whereby the memory can reliably rewrite the data "0" in the memory cells of the second cell regions. On the other hand, the memory applies the voltage ⅓ VCC to the memory cells of the first and third cell regions, while applying the voltage −⅓ VCC to the memory cells of the fourth cell regions.

Then, the memory makes a transition to the period T41. In this period T41, the memory reduces the voltage of the selected word line WL3 to the level ⅓ VCC while holding the voltages of the nonselected word lines WL0 to WL2 and WL4 to WL7 at the level ⅓ VCC. Further, the memory steps up the voltages of the "1" reading bit lines BL3 and BL5 to the level ⅓ VCC while holding the voltages of the "0" reading bit lines BL0 to BL2, BL4, BL6 and BL7 at the level ⅔ VCC. Thus, the memory applies the voltage −⅓ VCC to the memory cells of the first cell regions while applying the voltage 0 V to the memory cells of the second and third cell regions. The memory holds the voltage applied to the memory cells of the fourth cell regions at the level −⅓ VCC.

Then, the memory makes a transition to the period T42. In this period T42, the memory holds the voltage of the selected word line WL3 at the level ⅓ VCC while stepping up the voltages of the nonselected word lines WL0 to WL2 and WL4 to WL7 to the level ⅔ VCC. The memory holds the voltages of the "1" reading bit lines BL3 and BL5 at the level ⅓ VCC while reducing the voltages of the "0" reading bit lines BL0 to BL2, BL4, BL6 and BL7 to the level ⅓ VCC. Thus, the memory applies the voltage 0 V to the memory cells of the first cell regions while holding the voltage applied to the memory cells of the second cell regions at 0 V. Further, the memory applies the voltage ⅓ VCC to the memory cells of the third and fourth cell regions. Also when the voltages applied from the "0" reading bit lines BL0 to BL2, BL4, BL6 and BL7 and the nonselected word lines WL0 to WL2 and WL4 to WL7 to the memory cells reach the levels ⅓ VCC and ⅔ VCC respectively in slight delay due to delay in voltage transmission, the potential difference between all word lines WL, i.e., the selected word line WL3 and the nonselected word lines WL0 to WL2 and WL4 to WL7 and all bit lines BL, i.e., the "1" reading bit lines BL3 and BL5 and the "0" reading bit lines BL0 to BL2, BL4, BL6 and BL7 is in the range of not more than ⅓ VCC and hence the memory applies no voltage exceeding the level ⅓ VCC to all memory cells.

Then, the memory makes a transition to the period T5 for performing a second rewrite operation on the memory cells. According to the first embodiment, the memory sets the length of the period T5 to twice the length of the periods T1 to T22, T41 and T42, as shown in FIG. 4. In the period T5, the memory reduces the voltage of the selected word line WL3 to the level VSS while holding the voltages of the nonselected word lines WL0 to WL2 and WL4 to WL7 at the level ⅔ VCC. Further, the memory steps up the voltages of the "1" reading bit BL3 and BL5 to the level VCC while holding the voltages of the "0" reading bit lines BL0 to BL2, BL4, BL6 and BL7 at the level ⅓ VCC. Thus, the memory applies the voltage −⅓ VCC to the memory cells of the first cell regions while applying the voltage −VCC to the memory cells of the second cell regions. Thus, the memory rewrites the data "1" in the memory cells of the second cell regions. The memory sets the length of the T5 to twice the length of the periods T1 to T22, T41 and T42, whereby the memory can reliably rewrite the data "0" in the memory cells of the second cell regions. The memory applies the voltage −⅓ VCC to the memory cells of the first and third cell regions respectively while applying the voltage ⅓ VCC to the memory cells of the fourth cell regions. Thus, the memory applies the voltage −⅓ VCC, reverse to the voltage ⅓ VCC supplied in the first rewrite operation (period T3), to the memory cells of the first and third cell regions, while applying the voltage ⅓ VCC, reverse to the voltage −⅓ VCC applied in the first rewrite operation (period T3), to the memory cells of the fourth cell regions, thereby canceling disturbance in the memory cells of the first, third and fourth cell regions.

Then, the memory makes a transition to the period T61. In this period T61, the memory steps up the voltage of the selected word line WL3 to the level ⅓ VCC while holding the voltages of the nonselected word lines WL0 to WL2 and WL4 to WL7 at the level ⅓ VCC. Further, the memory reduces the voltages of the "1" reading bit lines BL3 and BL5 to the level ⅓ VCC while holding the voltages of the "0" reading bit lines BL0 to BL2, BL4, BL6 and BL7 at the level ⅓ VCC. Thus, the memory applies the voltage 0 V to the memory cells of the first and second cell regions. Further, the memory applies the voltage ⅓ VCC to the memory cells of the third cell regions, while holding the voltages applied to the memory cells of the fourth cell regions at the level ⅓ VCC.

Then, the memory makes a transition to the period T62. In this period T62, the memory holds the voltages of the selected word line WL3, the "1" reading bit lines BL3 and BL5 and the "0" reading bit lines BL0 to BL2, BL4, BL6 and BL7 at the level ⅓ VCC while reducing the voltages of the nonselected word lines WL0 to WL2 and WL4 to WL7 to the level ⅓ VCC. Thus, the voltages of all word lines WL0 to WL7 and all bit lines BL0 to BL7 reach the level ⅓ VCC. Therefore, the memory applies the voltage 0 V to all memory cells of the first to fourth cell regions.

Finally, the memory makes a transition to the standby period T0. In this period T0, the memory reduces the voltages of all word lines WL0 to WL7 and all bit lines BL0 to BL7 to the level VSS, thereby applying the voltage 0 V to all memory cells of the first to fourth cell regions. After this period T0, the memory holds all memory cells in the standby state of 0 V until starting subsequent read-rewrite operations (T1 to T62).

Figure 5:
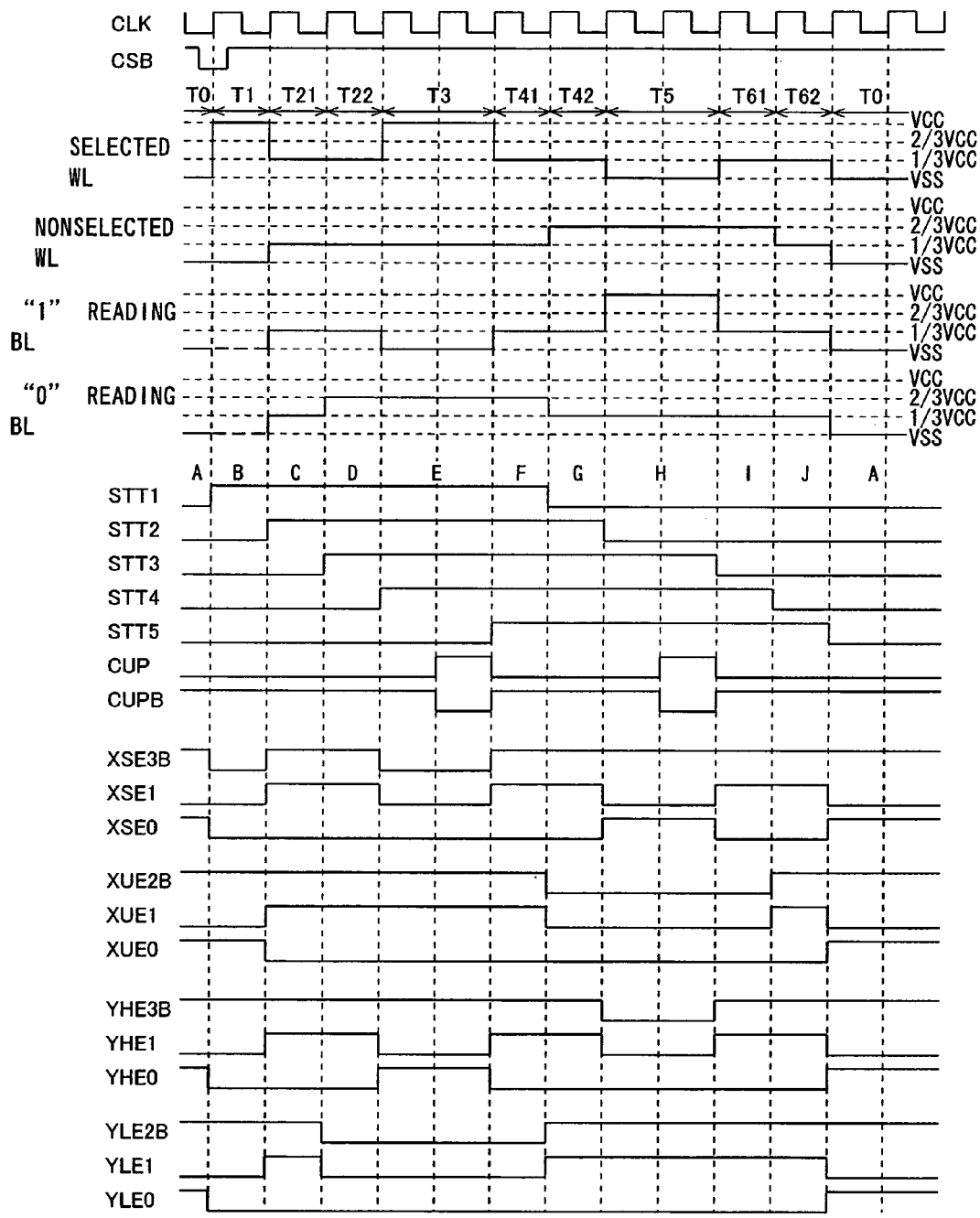
FIG. 5 is a voltage waveform diagram of internal signals employed for supplying voltages to word lines and bit lines of the memory according to the first embodiment of the present invention.

FIG. 5 shows a voltage waveform diagram of internal signals employed for supplying the voltages VSS, ⅓ VCC, ⅔ VCC and VCC to the word lines WL and the bit lines BL of the memory according to the first embodiment. Referring to FIG. 5, a clock signal CLK is input from the clock generation circuit 15 (see FIG. 1) in the state machine circuit 11, while an inverted chip selection signal CSB is externally input in the state machine circuit 11. This inverted chip selection signal CSB goes low thereby activating the state machine circuit 11. The state machine circuit 11 generates state signals STT1 to STT5 and supplies the same to the word line source driver 12 and the bit line source driver 13. The state machine circuit 11 also generates a count-up signal CUP and an inverted count-up signal CUPB respectively.

The word line source driver 12 (see FIG. 1) supplied with the state signals STT1 to STT5 generates word line source control signals XSE3B, XSE1 and XSE0 for selecting the voltages VSS, ⅓ VCC and VCC and supplying the same to the selected word line WL3 respectively. The word line source driver 12 also generates further word line source control signals XUE2B, XUE1 and XUE0 for selecting the voltages VSS, ⅓ VCC and ⅔ VCC and supplying the same to the nonselected word lines WL0 to WL2 and WL4 to WL7 respectively, similarly to the word line source control signals XSE3B, XSE1 and XSE0.

The bit line source driver 13 (see FIG. 1) supplied with the state signals STT1 to STT5 generates bit line source control signals YHE3B, YHE1 and YHE0 for selecting the voltages VSS, ⅓ VCC and VCC and supplying the same to the "1" reading bit lines BL3 and BL5 reading high-level data through the sense amplifier 14. The bit line source driver 13 supplied with the state signals STT1 to STT5 further generates bit line source control signals YLE2B, YLE1 and YLE0 for selecting the voltages VSS, ⅓ VCC and ⅔ VCC and supplying the same to the "1" reading bit lines BL3 and BL5 reading low-level data through the sense amplifier 14. In the voltage waveform diagram shown in FIG. 5, the aforementioned internal signals are so constituted that the word lines WL and the bit lines BL make a transition from the standby state (period T0) to operating states (periods T1 to T62) if the inverted chip selection signal CSB is at a low level when the memory activates the clock signal CLK.

The operations of the internal signals are now described with reference to FIG. 5. When the inverted chip selection signal CSB is at a low level, the clock signal CLK goes high so that the state signal STT1 also goes high. The state signals STT2 to STT4 successively go high in response to the clock signal CLK successively going high. After the state signal STT4 goes high, the state signal STT5 goes high in response to a second high-level clock signal CLK. In other words, the leading edge of the state signal STT5 delays from that of the state signal STT4 by two high-level clock signals CLK. Thus, the delay of the leading edge of the state signal STT5 is twice that of the state signals STT2 to STT4 each delaying from the preceding state signal by a single high-level clock signal CLK. The state signals STT2 to STT4 are examples of the "first signal" in the present invention, and the state signals STT4 and STT5 are examples of the "second signal" in the present invention.

The state signal STT1 goes low in response to a high-level clock signal CLK subsequent to the clock signal CLK activating the state signal STT5, and the state signal STT2 goes low in response to another high-level clock signal CLK further subsequent to this clock signal CLK. After the state signal STT2 goes low, the state signal STT3 goes low in response to a second high-level clock signal CLK subsequent to the fall of the state signal STT2. In other words, the trailing edge of the state signal STT3 delays from that of the state signal STT2 by two high-level clock signals CLK. Thus, the delay of the trailing edge of the state signal STT3 is twice the delay of the trailing edges of the state signals STT1 and STT2 each delaying from the precedent state signal by the single high-level clock signal CLK.

Thereafter the state signals STT4 and STT5 successively go low in response to the clock signal CLK successively going high. Thus, the state signals STT1 to STT5 go high or low in response to the clock signal CLK in 10 combinations in periods A to J as shown in FIG. 5. The 10 combinations A to J of the state signals STT1 to STT5 specify the aforementioned periods T0 to T62. The word line source driver 12 and the bit line source driver 13 generate the word line source control signals XSE3B, XSE1, XSE0, XUE2B, XUE1 and XUE0 and the bit line source control signals YHE3B, YHE1, YHE0, YLE2B, YLE1 and YLE0 responsive to the specified periods T0 to T62 respectively.

According to the first embodiment, as hereinabove described, the memory activates the voltages of the "0" reading bit lines BL0 to BL2, BL4, BL6 and BL7 by the value ⅓ VCC in two stages in the periods T21 and T22 preceding the period T3 for the first rewrite operation so that the voltages of the "0" reading bit lines BL0 to BL2, BL4, BL6 and BL7 can be already set to the level ⅔ VCC for the rewrite operation when activating the voltage of the selected word line WL3 to the level VCC in the period T3 for the first rewrite operation, whereby potential difference between the selected word line WL3 and the "0" reading bit lines BL0 to BL2, BL4, BL6 and BL7 can be inhibited from exceeding the potential difference (⅓ VCC) between the selected word line WL3 and the "0" reading bit lines BL0 to BL2, BL4, BL6 and BL7 at the time of the rewrite operation also when voltage transmission through the "0" reading bit lines BL0 to BL2, BL4, BL6 and BL7 slightly delays. Therefore, the memory can inhibit the memory cells of the first cell regions from application of a voltage larger than the voltage ⅓ VCC applied in the rewrite operation. Thus, the memory can inhibit the memory cells of the first cell regions from disturbance resulting from application of a voltage larger than the voltage ⅓ VCC applied in the rewrite operation.

According to the first embodiment, the memory applies the voltages ⅓ VCC and −⅓ VCC to the memory cells of the first and third cell regions and the memory cells of the fourth cell regions in the first rewrite operation (period T3) respectively while applying the voltages −⅓ VCC and ⅓ VCC to the memory cells of the first and third cell regions and the memory cells of the fourth cell regions in the second rewrite operation (period T5) respectively for applying voltages of opposite directions (±⅓ VCC) to the memory cells of the first, third and fourth cell regions single times respectively, thereby inhibiting the memory cells of the first, third and fourth cell regions from polarization deterioration throughout the read and rewrite operations. Thus, the memory cells of the first, third and fourth cell regions can be inhibited from disturbance throughout the read and rewrite operations.

According to the first embodiment, the memory sets the length of the periods T3 and T5 for the rewrite operations to twice that of the periods T1 to T22 so that a period of a length necessary for performing rewriting on the memory cells of the second cell regions (see FIG. 3) can be ensured also when the pulse width of the clock signal CLK for generating the periods T1 to T62 is reduced and the lengths of the periods T1 to T62 are reduced in order to increase the speed for the read and rewrite operations of the memory. Thus, the memory can reliably rewrite data in the memory cells of the second cell regions while increasing the operating speed thereof.

Figure 6:
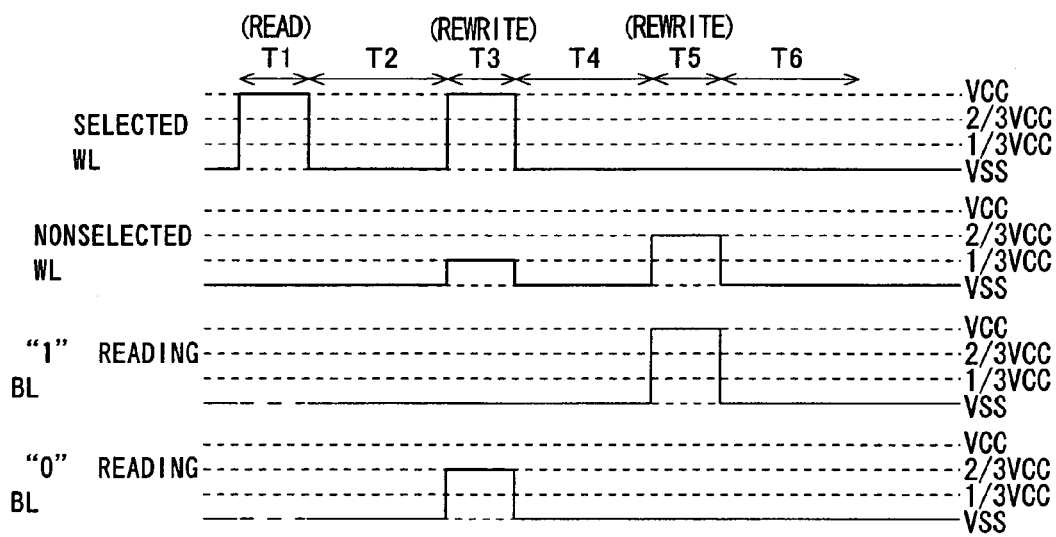
FIG. 6 is a voltage waveform diagram showing another exemplary method of applying voltages to the word lines and the bit lines of the memory according to the first embodiment of the present invention.
Figure 7:
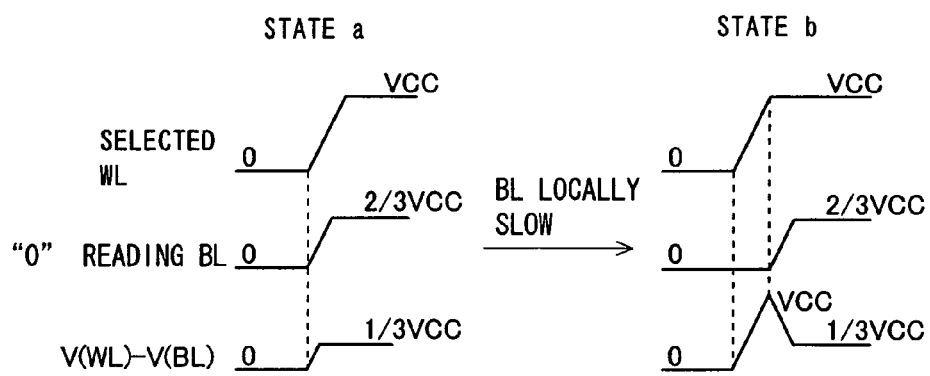
FIG. 7 is a diagram for illustrating a problem in the rewrite operation in the voltage waveform diagram shown in FIG. 6.

As another method of voltage application to the word lines WL and the bit lines BL, the memory may conceivably set the voltages of the selected word line WL3 and the "0" reading bit lines BL0 to BL2, BL4, BL6 and BL7 (see FIG. 3) to the level VSS in the period T2 subsequent to the period T1 for the read operation while simultaneously setting the voltages of the selected word line WL3 and the "0" reading bit lines BL0 to BL2, BL4, BL6 and BL7 to the levels VCC and ⅔ VCC respectively when making the transition from the period T2 to the period T3 for the rewrite operation, as shown in FIG. 6. In this case, the potential difference V(WL)−V(BL) between the selected word line WL3 and the "0" reading bit lines BL0 to BL2, BL4, BL6 and BL7 does not exceeds the level ⅓ VCC when the memory steps up the voltages of the selected word line WL3 and the "0" reading bit lines BL0 to BL2, BL4, BL6 and BL7 completely at the same timing as in a state a shown in FIG. 7. In this state a, therefore, the memory applies no voltage exceeding the level ⅓ VCC to the memory cells of the first cell regions connected to the selected word line WL3 and the "0" reading bit lines BL0 to BL2, BL4, BL6 and BL7.

Figure 30:
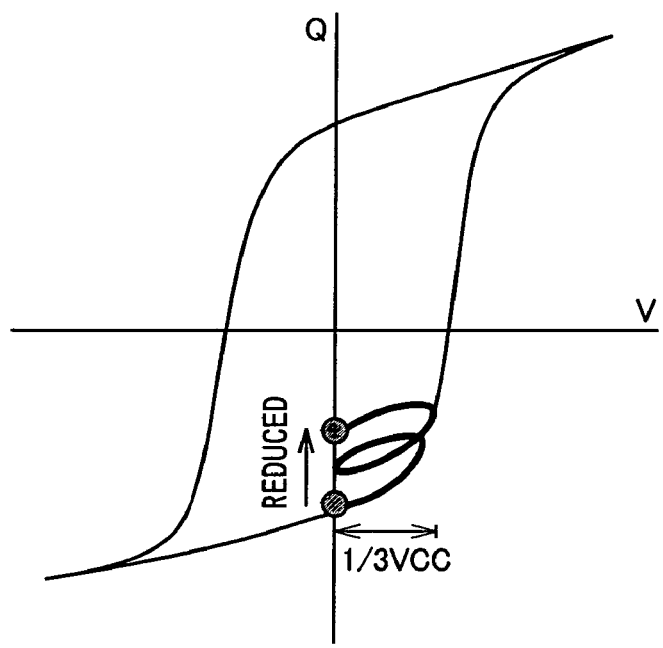
FIG. 30 is a hysteresis diagram for illustrating disturbance in the conventional simple matrix ferroelectric memory.
Figure 31:
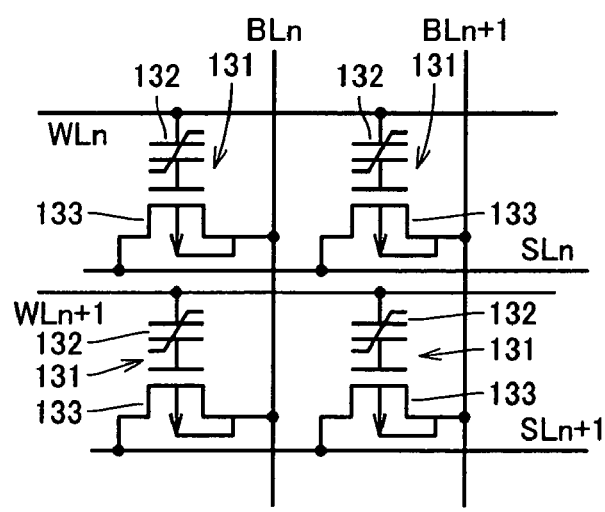
FIG. 31 is an equivalent circuit diagram showing memory cells of a conventional one-transistor ferroelectric memory.
Figure 32:
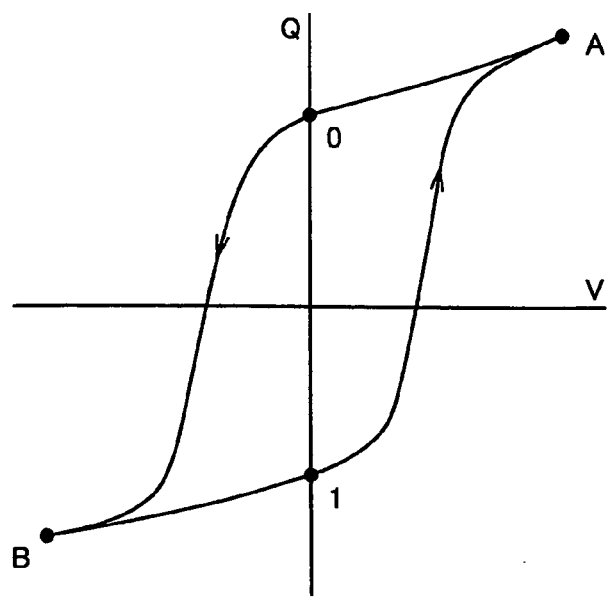
FIG. 32 is a hysteresis diagram for illustrating operations of the conventional one-transistor ferroelectric memory.
Figure 33:
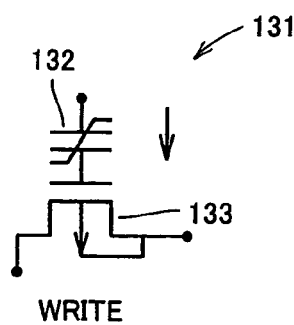
FIG. 33 is an equivalent circuit diagram for illustrating a voltage application state in writing in the conventional one-transistor ferroelectric memory shown in FIG. 31.
Figure 34:
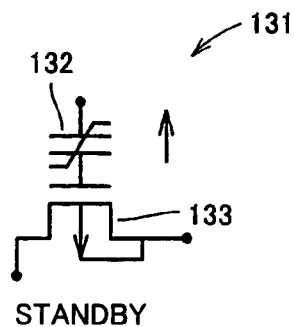
FIG. 34 is an equivalent circuit diagram for illustrating a voltage application state in a standby state in the conventional one-transistor ferroelectric memory shown in FIG. 31.

In practice, however, the memory requires a certain degree of time for transmitting the voltage supplied to an end of the "0" reading bit lines BL0 to BL2, BL4, BL6 and BL7 from the bit line source driver 13 through the sense amplifier 14 to the central portion "0" due to prescribed lengths of the reading bit lines BL0 to BL2, BL4, BL6 and BL7. Thus, the voltage application timing slightly delays in those of the memory cells connected to the central portion of the "0" reading bit lines BL0 to BL2, BL4, BL6 and BL7 as compared with those connected to the end thereof. In this case, the potential difference V(WL)−V(BL) between the selected word line WL3 and the "0" reading bit lines BL0 to BL2, BL4, BL6 and BL7 reaches a level (VCC at the maximum) exceeding the level ⅓ VCC as in a state b shown in FIG. 7, and hence the memory applies a voltage exceeding the level ⅓ VCC to the memory cells connected to the central portion of the "0" reading bit lines BL0 to BL2, BL4, BL6 and BL7. Thus, the memory applies the voltage exceeding the level ⅓ VCC every time performing the rewrite operation in the example shown in FIG. 6, and hence data are destroyed due to disturbance in the memory cells connected to the central portion of the "0" reading bit lines BL0 to BL2, BL4, BL6 and BL7 as shown in FIG. 30.

According to the first embodiment performing the data read-rewrite operations along the voltage waveform diagrams shown in FIGS. 4 and 5, on the other hand, the memory steps up the voltages of the "0" reading bit lines BL0 to BL2, BL4, BL6 and BL7 to the level ⅔ VCC in the period T22 subsequent to the period T3 (see FIG. 5) for the rewrite operation as hereinabove described, whereby the potential difference between the selected word line WL3 and the "0" reading bit lines BL0 to BL2, BL4, BL6 and BL7 does not exceed the level ⅓ VCC also when voltage transmission slightly delays, dissimilarly to the other voltage application method shown in FIG. 6. Thus, the memory according to the first embodiment can inhibit the memory cells of the first cell regions from disturbance resulting from application of a voltage exceeding the level ⅓ VCC.

Figure 8:
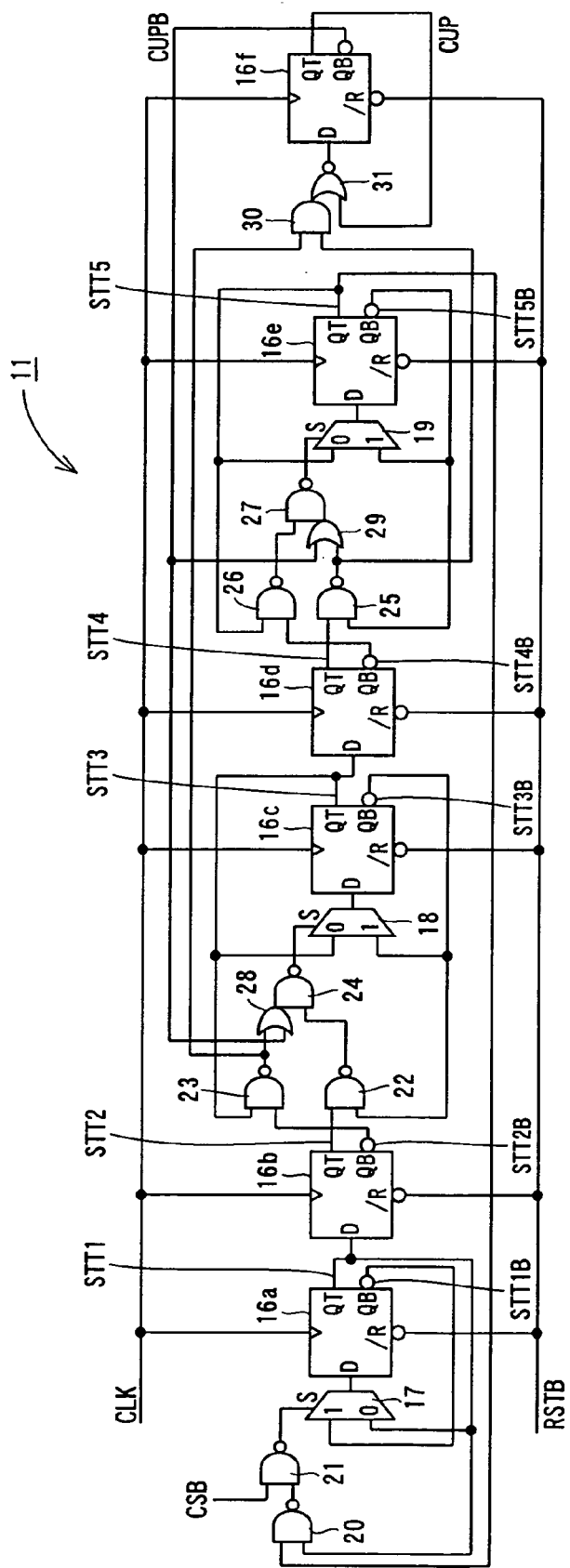
FIG. 8 is a circuit diagram showing the structure of a state machine circuit generating state signals according to the first embodiment of the present invention.

The structures of the state machine circuit 11, the word line source driver 12 and the bit line source driver 13 for generating the aforementioned internal signals, i.e., the state signal STT1 to STT5, the count-up signal CUP, the inverted count-up signal CUPB, the word line source control signals XSE3B to XSE0 and XUE2B to XUE0 and the bit line source control signals YHE3B to YHE0 and YLE2B to YLE0 respectively are now described. FIG. 8 is a circuit diagram showing the structure of the state machine circuit 11 generating the count-up signal CUP and the inverted count-up signal CUPB. This state machine circuit 11 is an example of the "control circuit" and the "clock control circuit part" in the present invention. As shown in FIG. 8, the state machine circuit 11 includes six delayed flip-flop circuits (hereinafter referred to as DFF circuits) 16a to 16f, three selector circuits 17 to 19, eight NAND circuits 20 to 27, two OR circuits 28 and 29, an AND circuit 30 and a NOR circuit 31.

The DFF circuits 16a to 16f are supplied with the clock signal CLK and an inverted reset signal RSTB respectively. The inverted reset signal RSTB is input from input terminals /R of the DFF circuits 16a to 16f. An output signal of the selector circuit 17 is input in an input terminal D of the DFF circuit 16a. The state signal STT1 is output from an output terminal QT of the DFF circuit 16a. The state signal STT1 is input in a "0" side of the selector circuit 17, the NAND circuit 18 and the subsequent DFF circuit 16b. An inverted state signal STT1B is output from another output terminal QB of the DFF circuit 16a. This inverted state signal STT1B is input in a "1" side of the selector circuit 17. The state signal STT2 and an inverted state signal STT2B are output from output terminals QT and QB of the DFF circuit 16b respectively. The state signal STT2 and the inverted state signal STT2B are input in the NAND circuits 22 and 23 respectively. An output signal of the NAND circuit 22 is input in the NAND circuit 24. An output signal of the NAND circuit 23 is input in the OR circuit 28 and the NAND circuit 30 while an output of the OR circuit 28 is input in the NAND circuit 24. An output signal of the NAND circuit 24 is input in the selector circuit 18. An output signal of the selector circuit 18 is input in an input terminal D of the DFF circuit 16c.

The state signal STT3 and an inverted state signal STT3B are output from output terminals QT and QB of the DFF circuit 16c respectively. The state signal STT3 is input in a "0" side of the selector circuit 18 and an input terminal D of the DFF circuit 16d while the inverted state signal STT3B is input in the NAND circuit 22 and a "1" side of the selector circuit 18. The state signal STT4 and an inverted state signal STT4B are output from output terminals QT and QB of the DFF circuit 16d respectively. The state signal STT4 and the inverted state signal STT4B are input in the NAND circuits 25 and 26 respectively. An output signal of the NAND circuit 25 is input in the OR circuit 29 and the NAND circuit 30, while an output of the OR circuit 29 is input in the NAND circuit 27. An output signal of the NAND circuit 27 is input in the selector circuit 19. An output signal of the selector circuit 19 is input in an input terminal D of the DFF circuit 16e.

The state signal STT5 and an inverted state signal STT5B are output from output terminals QT and QB of the DFF circuit 16e respectively. The state signal STT5 is input in the NAND circuit 26, a "0" side of the selector circuit 19 and the NAND circuit 20, while the inverted state signal STT5B is input in the NAND circuit 25 and a "1" side of the selector circuit 19. An output signal of the AND circuit 30 is input in the NOR circuit 31. An output signal of the NOR circuit 31 is input in an input terminal D of the DFF circuit 16f. The count-up signal CUP and the inverted count-up signal CUPB are output from output terminals QT and QB of the DFF circuit 16f respectively. The count-up signal CUP is input in the NOR circuit 31 while the inverted count-up signal CUPB is input in the OR circuits 28 and 29. The state signals STT1 to STT5 are output from the output terminals of the DFF circuits 16a to 16e respectively, while the inverted state signals STT1B to STT5B are output from the output terminals QB of the DFF circuits 16a to 16e respectively.

Operations of the state machine circuit 11 according to the first embodiment are now described with reference to FIGS. 5 and 8.

In the state machine circuit 11 according to the first embodiment, a low-level inverted reset signal RSTB is input in the DFF circuits 16a to 16f in a standby state, whereby the state signals STT1 to STT5 and the count-up signal CUP output from the DFF circuits 16a to 16f go low. At this time, the NAND circuit 20 receiving the low-level state signals STT1 and STT5 inputs a high-level signal in the NAND circuit 21. In this case, a high-level inverted chip selection signal CSB is input in the NAND circuit 21. Thus, the NAND circuit 21 inputs a low-level signal in the selector circuit 17. Therefore, the input of the selector circuit 17 is switched to the "0" side, for supplying the low-level state signal STT1 output from the DFF circuit 16a to the DFF circuit 16a through the selector circuit 17. Thus, the state signal STT1 output from the DFF circuit 16a is held at the low level, whereby the state signal STT2 output from the DFF circuit 16b receiving the state signal STT1 is also held at the low level. In this standby state, the state signals STT3 to STT5 and the count-up signal CUP output from the DFF circuits 16c to 16f respectively are also held at the low levels. On the other hand, the inverted state signals STT1B to STT5B and the inverted count-up signal CUPB output from the DFF circuits 16a to 16f respectively are held at high levels.

While the NAND circuit 20 inputs the high-level signal in the NAND circuit 21, a low-level inverted chip selection signal CSB is input in the NAND circuit 21. Thus, the NAND circuit 21 inputs a high-level signal in the selector circuit 17. Therefore, the input of the selector circuit 17 is switched to the "1" side, for supplying the high-level inverted state signal STT1B output from the DFF circuit 16a to the DFF circuit 16a through the selector circuit 17. Thereafter the DFF circuit 16a receiving a high-level clock signal CLK outputs a high-level state signal STT1, which in turn is input in the DFF circuit 16b. A clock signal CLK subsequently input in the DFF circuit 16b goes low and thereafter goes high so that the DFF circuit 16b outputs a high-level state signal STT2.

The high-level state signal STT2 is input in the NAND circuit 22. The NAND circuit 22 also receiving the high-level inverted state signal STT3B from the DFF circuit 16c inputs a low-level signal in the NAND circuit 24. On the other hand, the DFF circuit 16b inputs a low-level inverted state signal STT2B in the NAND circuit 23. The NAND circuit 23 also receiving the low-level state signal STT3 from the DFF circuit 16c inputs a high-level signal in the OR circuit 28. At this time, the OR circuit 28 also receiving the high-level inverted count-up signal CUPB from the DFF circuit 16f inputs a high-level signal in the NAND circuit 24. Therefore, the NAND circuit 24 inputs a high-level signal in the selector circuit 18. Thus, the input of the selector circuit 18 is switched to the "1" side, for supplying the high-level inverted state signal STT3B output from the DFF circuit 16c to the DFF circuit 16c through the selector circuit 18. A clock signal CLK subsequently input in the DFF circuit 16c goes low and thereafter goes high so that the DFF circuit 16c outputs a high-level state signal STT3. This high-level state signal STT3 is input in the DFF circuit 16d. Then, A clock signal CLK subsequently input in the DFF circuit 16d goes low and thereafter goes high so that the DFF circuit 16d outputs a high-level state signal STT4.

This high-level state signal STT4 is input in the NAND circuit 25. The NAND circuit 25 also receiving the high-level inverted state signal STT5B from the DFF circuit 16e outputs a low-level signal to the OR circuit 29. At this time, the OR circuit 29 also receiving the high-level inverted count-up signal CUPB from the DFF circuit 16f outputs a high-level signal in the NAND circuit 27. On the other hand, the DFF circuit 16d inputs a low-level state signal STT4B in the NAND circuit 26. The NAND circuit 26 also receiving the low-level state signal STT5 from the DFF circuit 16e inputs a high-level signal in the NAND circuit 27. Therefore, the NAND circuit 27 inputs a low-level signal in the selector circuit 19. Thus, the input of the selector circuit 19 is held at the "0" side, thereby supplying the low-level state signal STT5 output from the DFF circuit 16e to the DFF circuit 16e through the selector circuit 19. Thus, the state signal STT5 output from the DFF circuit 16e is held at the low level also when a clock signal CLK subsequently input in the DFF circuit 16e goes low and thereafter goes high.

The low-level signal output from the NAND circuit 25 is also input in the AND circuit 30. At this time, the AND circuit 30 also receiving the high-level output signal from the NAND circuit 25 inputs a low-level signal in the NOR circuit 31. The NOR circuit 31 receiving the low-level count-up signal CUP from the DFF circuit 16f inputs a high-level signal in the DFF circuit 16f. Thus, the high-level clock signal CLK for holding the state signal STT5 at the low level is input in the DFF circuit 16f, which in turn outputs a high-level count-up signal CUP and a low-level inverted count-up signal CUPB.

The low-level inverted count-up signal CUPB is input in the OR circuit 29. The OR circuit 29 also receiving the low-level signal from the NAND circuit 25 inputs a low-level signal in the NAND circuit 27. The NAND circuit 27 also receiving the high-level signal from the NAND circuit 26 inputs a high-level signal in the selector circuit 19. Thus, the input of the selector circuit 19 is switched to the "1" side, for supplying the high-level inverted state signal STT5B output from the DFF circuit 16e to the DFF circuit 16e through the selector circuit 19. Thus, the high-level clock signal CLK for holding the state signal STT3 at the high level is input in the DFF circuit 16f and a clock signal CLK subsequently input in the DFF circuit 16e goes low and thereafter goes high so that the DFF circuit 16e outputs a high-level state signal STT5. Thus, the leading edge of the state signal STT5 delays from the leading edge of the state signal STT4 by the period corresponding to two high-level clock signals CLK.

The DFF circuit 16e outputs a low-level inverted state signal STT5B, which in turn is input in the NAND circuit 25. The NAND circuit 25 also receiving the high-level state signal STT4 from the DFF circuit 16d inputs a high-level signal in the AND circuit 30. The AND circuit 30 also receiving the high-level signal from the NAND circuit 23 inputs a high-level signal in the NOR circuit 31. The NOR circuit 31 also receiving the high-level count-up signal CUP from the DFF circuit 16f inputs a low-level signal in the DFF circuit 16f. Thus, the high-level clock signal CLK for activating the state signal STT4 is input in the DFF circuit 16f, which in turn outputs a low-level count-up signal CUP and a high-level inverted count-up signal CUPB.

On the other hand, the high-level state signal STT5 output from the DFF circuit 16e is input in the NAND circuit 20. The NAND circuit 20 also receiving the high-level state signal STT1 from the DFF circuit 16a outputs a low-level signal. Thus, the NAND circuit 21 receiving the low-level signal from the NAND circuit 20 and a high-level inverted chip selection signal CSB inputs a high-level signal in the selector circuit 17. Thus, the input of the selector circuit 17 is switched to the "1" side, thereby supplying the low-level inverted state signal STT1B output from the DFF circuit 16a to the DFF circuit 16a through the selector circuit 17. Thereafter a clock signal CLK subsequently input in the DFF circuit 16a goes low and thereafter goes high so that the DFF circuit 16a outputs a low-level state signal STT1. This low-level state signal STT1 is input in the DFF circuit 16b. Then, a clock signal CLK subsequently input in the DFF circuit 16b goes low and thereafter goes high so that the DFF circuit 16b outputs a low-level state signal STT2 and a high-level inverted state signal STT2B.

The low-level state signal STT2 is input in the NAND circuit 22. This NAND circuit 22 also receiving the low-level inverted state signal STT3B from the DFF circuit 16c inputs a high-level signal in the NAND circuit 24. On the other hand, the high-level inverted state signal STT2B output from the DFF circuit 16b is input in the NAND circuit 23. The NAND circuit 23 also receiving the high-level state signal STT3 from the DFF circuit 16c inputs a low-level signal in the OR circuit 28. At this time, the OR circuit 28 also receiving the high-level inverted count-up signal CUPB from the DFF circuit 16f inputs a high-level signal in the NAND circuit 24. Therefore, the NAND circuit 24 inputs a low-level signal in the selector circuit 18. Thus, the input of the selector circuit 18 is held on the "0" side, thereby supplying the high-level state signal STT3 output from the DFF circuit 16c to the DFF circuit 16c through the selector circuit 18. Therefore, the state signal STT3 output from the DFF circuit 16c is held at the high level also when a clock signal CLK subsequently input in the DFF circuit 16c goes low and thereafter goes high.

The low-level signal output from the NAND circuit 23 is also input in the AND circuit 30. At this time, the AND circuit 30 also receiving the high-level signal from the NAND circuit 25 inputs a low-level signal in the NOR circuit 31. This NOR circuit 31 also receiving the low-level count-up signal CUP from the DFF circuit 16f inputs a high-level signal in the DFF circuit 16f. Thus, the high-level clock signal CLK for holding the state signal STT3 at the high level is input in the DFF circuit 16f, which in turn outputs a high-level count-up signal CUP and a low-level inverted count-up signal CUPB.

The low-level inverted count-up signal CUPB is input in the OR circuit 28. The OR circuit 28 also receiving the low-level signal from the NAND circuit 23 inputs a low-level signal in the NAND circuit 24. The NAND circuit 24 also receiving the high-level signal from the NAND circuit 22 inputs a high-level signal in the selector circuit 18. Thus, the input of the selector circuit 18 is switched to the "1" side, for supplying the low-level inverted state signal STT3B output from the DFF circuit 16c in the DFF circuit 16c through the selector circuit 18. Then, a clock signal CLK subsequently input in the DFF circuit 16c goes low and thereafter goes high, so that the DFF circuit 16c outputs a low-level state signal STT3. Thus, the trailing edge of the state signal STT3 delays from the trailing edge of the state signal STT2 by the period corresponding to two high-level clock signals CLK.

Thereafter the state machine circuit 11 inactivates the state signal STT4 with delay by one clock period from the trailing edge of the state signal STT3 and inactivates the state signal STT5 with further delay by one clock period similarly to the aforementioned operation of activating the state signals STT4 and STT5. In this case, however, the state machine circuit 11 switches the high and low levels of the signals in the aforementioned operation of activating the state signals STT4 and STT5 respectively.

Figure 9:
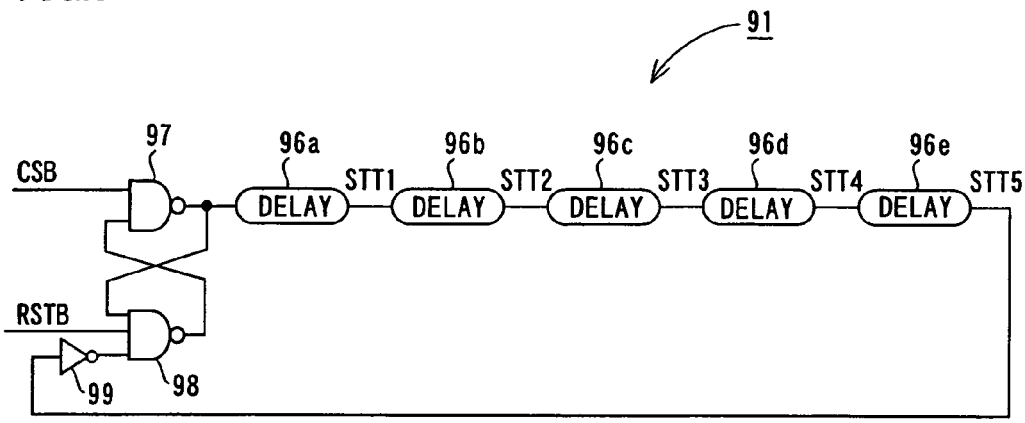
FIGS. 9 to 13 are circuit diagrams for illustrating the structure of a modification of the state machine circuit according to the first embodiment shown in FIG. 8.

The memory according to the first embodiment can alternatively employ a state machine circuit 91 shown in FIG. 9 in place of the state machine circuit 11 shown in FIG. 8. This state machine circuit 91 is an example of the "control circuit" in the present invention. The state machine circuit 91 is so constituted that subsequent ones of delay circuits 96a to 96e successively generate output signals delaying from those of precedent ones of the delay circuits 96a to 96e in response to supply of a low-level inverted chip selection signal CSB without employing clock signals in the delay circuits 96a to 96e constituting the state machine circuit 91 respectively, dissimilarly to the aforementioned synchronous clock state machine circuit 11 (see FIG. 8). The delay circuits 96a to 96e are examples of the "delay circuit part" in the present invention.

More specifically, the state machine circuit 91 is constituted of the five delay circuits 96a to 96e, two NAND circuits 97 and 98 and an inverter circuit 99, as shown in FIG. 9. State signals STT1 to STT4 output from the delay circuits 96a to 96d are input in the subsequent delay circuits 96b to 96e respectively. The delay circuit 96a receives an output signal of the NAND circuit 97. A state signal STT5 output from the delay circuit 96e is input in the inverter circuit 99. An output signal of the inverter circuit 99, an inverted reset signal RSTB and an output signal of the NAND circuit 97 are input in the NAND circuit 98. The NAND circuit 97 receives an output signal of the NAND circuit 98 and an inverted chip selection signal CSB.

Figure 10:
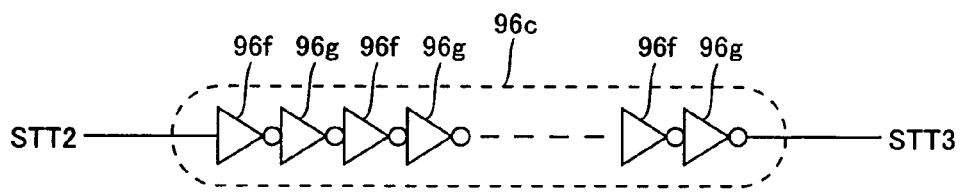
Figure 11:
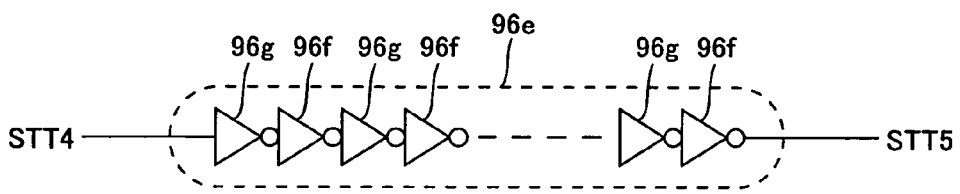

As shown in FIG. 10, the delay circuit 96c is constituted by alternately serially connecting two types of inverter circuits 96f and 96g having different structures with each other while arranging one of the inverter circuit 96f on an input side for the state signal STT2. As shown in FIG. 11, the delay circuit 96*e* is constituted by alternately serially connecting two types of inverter circuits 96*f* and 96*g* with each other while arranging one of the inverter circuit 96*g* on an input side for the state signal STT4.

Figure 12:
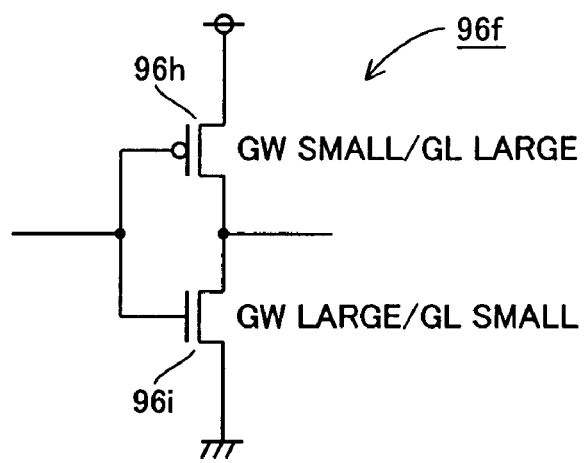
Figure 13:
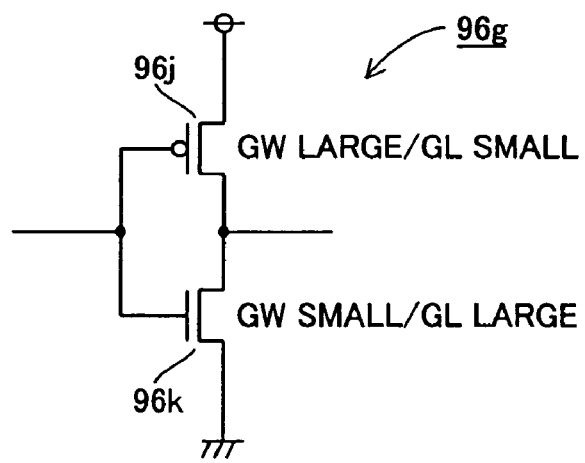

As shown in FIG. 12, each inverter circuit 96*f* is constituted of a CMOS inverter consisting of a p-channel transistor 96*h* and an n-channel transistor 96*i*. The p-channel transistor 96*h* is so constituted that the gate width (GW) is smaller than the gate length (GL), while the n-channel transistor 96*i* is so constituted that the gate width (GW) is larger than the gate length (GL). Thus, the inverter circuit 96*f* is so constituted that the leading edge of an output signal delays from the trailing edge of an input signal while the trailing edge of the output signal precedes the leading edge of the input signal. On the other hand, the inverter circuit 96*h* is constituted of a CMOS inverter consisting of a p-channel transistor 96*j* and an n-channel transistor 96*k*, as shown in FIG. 13. The p-channel transistor 96*j* is so constituted that the gate width (GW) is larger than the gate length (GL), while the n-channel transistor 96*k* is so constituted that the gate width (GW) is smaller than the gate length (GL). Thus, the inverter circuit 96*g* is so constituted that the leading edge of an output signal precedes the trailing edge of an input signal while the trailing edge of the output signal delays from the leading edge of the input signal. According to this structure, the delay of the trailing edge of the output signal (state signal STT3) from the trailing edge of the input signal (state signal STT2) is increased to about twice the delay of the leading edge of the output signal (state signal STT3) from the leading edge of the input signal (state signal STT2). In the delay circuit 96*e*, on the other hand, the delay of the leading edge of the output signal (state signal STT5) from the leading edge of the input signal (state signal STT4) is increased to about twice the delay of the trailing edge of the output signal (state signal STT5) from the trailing edge of the input signal (state signal STT4).

Each of the delay circuits 96*a*, 96*b* and 96*d* is constituted of a CMOS inverter consisting of p- and n-channel transistors having substantially identical gate lengths (GL) and gate widths (GW). Thus, the delay of the leading edge of an output signal from the trailing edge of an input signal and that of the trailing edge of the output signal from the leading edge of the input signal are substantially identical to each other in each of the delay circuits 96*a*, 96*b* and 96*d*. The delay of the leading edge of the output signal (state signal STT5) from the leading edge of the input signal (state signal STT4) in the delay circuit 96*e* is about twice the delay of the leading edge of the output signal (state signal STT2, STT3 or STT4) from the leading edge of the input signal (state signal STT1, STT2 or STT3) in each of the delay circuits 96*b* to 96*d*. Further, the delay of the trailing edge of the output signal (state signal STT3) from the trailing edge of the input signal (state signal STT2) in the delay circuit 96*c* is substantially twice the delay of the leading edge of the output signal (state signal STT2, STT3 or STT4) from the leading edge of the input signal (state signal STT1, STT2 or STT3) in each of the delay circuits 96*b* to 96*d* and the delay of the trailing edge of the output signal (state signal STT2, STT4 or STT5) from the trailing edge (state signal STT1, STT3 or STT4) in each of the delay circuits 96*b*, 96*d* and 96*e*.

When employing the state machine circuit 91 according to the modification of the first embodiment, the memory can set the delay of the leading edge of the state signal STT5 setting the end point of the period 3 for rewriting from the leading edge of the state signal STT4 setting the starting point and the delay of the trailing edge of the state signal STT3 setting the end point of the period T5 from the trailing edge of the state signal STT2 setting the starting point to about twice the delay of the leading edges of the subsequent state signals STT2 to STT4 setting the end points of the periods T1 to T22 from the leading edges of the precedent state signals STT1 to STT3 setting the starting points respectively. Thus, the length of the periods T3 and T5 for rewriting can be set to about twice the length of the periods T1 to T22, whereby the memory can ensure a period of a length required for rewriting data in the memory cells of the second cell regions by increasing the length of the periods for rewriting data in the memory cells of the second cell regions while increasing the speed for the read and rewrite operations of the memory due to the short transition period (each of the periods T1 to T62). Thus, the memory can reliably rewrite data in the memory cells of the second cell regions while increasing the operating speed thereof.

Figure 14:
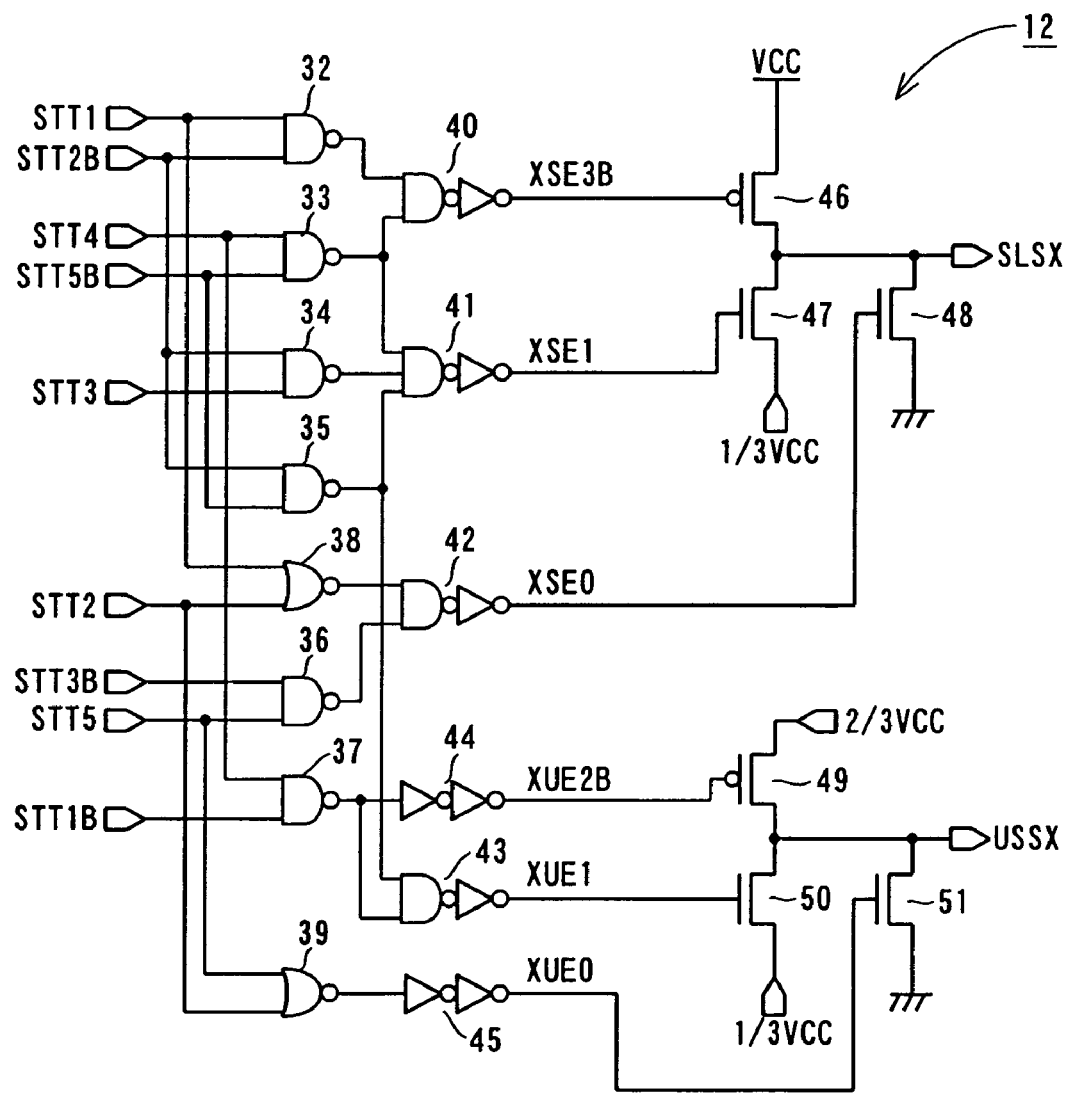
FIG. 14 is a circuit diagram showing the structure of a word line source driver generating word line source control signals.

FIG. 14 is a circuit diagram showing the structure of the word line source driver 12 generating the word line source control signals XSE3B to XSE0 and XUE2B to XUE0. As shown in FIG. 14, the word line source driver 12 combines the state signals STT1 to STT5 and the inverted state signals STT1B to STT5B supplied from the state machine circuit 11 with each other thereby generating the word line source control signals XSE3B to XSE0 and XUE2B to XUE0. Further, the word line source driver 12 is constituted to output a word line source signal SLSX of any of the voltages VSS (0 V), ⅓ VCC and VCC from a first output terminal in response to the combination of the generated word line source control signals XSE3B to XSE0 while outputting another word line source signal USSX of any of the voltages VSS (0 V), ⅓ VCC and ⅔ VCC from a second output terminal in response to the combination of the generated word line source control signals XUE2B to XUE0.

More specifically, the word line source driver 12 is constituted of six NAND circuits 32 to 37, two NOR circuits 38 and 39, four NAND-inverter circuits 40 to 43, two two-stage inverter circuits 44 and 45, two p-channel transistors 46 and 49 and four n-channel transistors 47, 48, 50 and 51. The NAND circuit 32 receives the state signal STT1 and the inverted state signal STT2B. The NAND circuit 33 receives the state signal STT4 and the inverted state signal STT5B. The NAND circuit 34 receives the inverted state signal STT2B and the state signal STT3. The NAND circuit 35 receives the inverted state signals STT2B and STT5B. The NAND circuit 36 receives the inverted state signal STT3B and the state signal STT5. The NAND circuit 37 receives the state signal STT4 and the inverted state signal STT1B. The NOR circuit 38 receives the state signals STT1 and STT2. The NOR circuit 39 receives the state signals STT2 and STT5.

The NAND-inverter circuit 40 receives output signals from the NAND circuits 32 and 33. The NAND-inverter circuit 41 receives output signals from the NAND circuits 33 to 35. The NAND-inverter circuit 42 receives output signals from the NAND circuit 36 and the NOR circuit 38. The NAND-inverter circuit 43 receives output signals from the NAND circuits 35 and 37. The two-stage inverter circuit 44 receives an output signal from the NAND circuit 37. The two-stage inverter circuit 45 receives an output signal from the NOR circuit 39.

An output signal (word line source control signal XSE3B) of the NAND-inverter circuit 40 is supplied to the gate of the p-channel transistor 46. An output signal (word line source control signal XSE1) of the NAND-inverter circuit 41 is supplied to the gate of the n-channel transistor 47. An output signal (word line source control signal XSE0) of the NAND-inverter circuit 42 is supplied to the gate of the n-channel transistor 48. An output signal (word line source control signal XUE1) of the NAND-inverter circuit 43 is supplied to the gate of the n-channel transistor 50. An output signal (word line source control signal XUE2B) of the two-stage inverter circuit 44 is supplied to the gate of the p-channel transistor 49. An output signal (word line source control signal XUE0) of the two-stage inverter circuit 45 is supplied to the gate of the n-channel transistor 51.

The p-channel transistor 46 has a source supplied with the voltage VCC and a drain connected to the drains of the n-channel transistors 47 and 48. The n-channel transistors 47 and 48 have sources supplied with the voltages ⅓ VCC and VSS (GND potential: 0 V) respectively.

The p-channel transistor 49 has a source supplied with the voltage ⅔ VCC and a drain connected to the drains of the n-channel transistors 50 and 51. The n-channel transistors 50 and 51 have sources supplied with the voltages ⅓ VCC and VSS (GND potential: 0 V) respectively.

In operation, the word line source driver 12 receives low-level state signals STT1 to STT5 and high-level inverted state signals STT1B to STT5B in the period T0 (see FIG. 5) so that the NAND circuits 32 to 34, 36 and 37 and the NOR circuits 38 and 39 output high-level signals respectively while the NAND circuit 35 outputs a low-level signal. Thus, the NAND-inverter circuits 40 an 42 and the two-stage inverter circuits 44 and 45 output high-level word line source control signals XSE3B, XSE0, XUE2B and XUE0 respectively while the NAND circuits 41 and 43 output low-level word line source control signals XSE1 and XUE1 respectively. Therefore, the p-channel transistor 46 and the n-channel transistor 47 are turned off and the n-channel transistor 48 is turned on for outputting a word line source signal SLSX of the voltage VSS through the n-channel transistor 48. Further, the p-channel transistor 49 and the n-channel transistor 50 are turned off and the n-channel transistor 51 is turned on for outputting a word line source signal USSX of the voltage VSS through the n-channel transistor 51.

Then, the memory makes a transition to the period T1 (see FIG. 5) so that the state signal STT1 and the inverted state signal STT1B go high and low respectively, whereby the NAND circuits 32 and 35 and the NOR circuit 38 output low-level signals and the NAND circuits 33, 34, 36 and 37 and the NOR circuit 39 output high-level signals. Thus, the word line source control signals XSE3B to XSE0 output from the NAND-inverter circuits 40 to 42 and 43 go low while the word line source control signals XUE2B and XUE0 output from the two-stage inverter circuits 44 and 45 are held at the high levels. Therefore, the p-channel transistor 46 is turned on and the n-channel transistors 47 and 48 are turned off for outputting a word line source signal SLSX of the voltage VCC through the p-channel transistor 46. Further, the p-channel transistor 49 and the n-channel transistor 50 are held in the OFF states and the n-channel transistor 51 is held in the ON state, for continuously outputting the word line source signal USSX of the voltage VSS through the n-channel transistor 51.

Then, the memory makes a transition to the period T21 (see FIG. 5), so that the state signal STT2 and the inverted state signal STT2B go high and low respectively, whereby the NAND circuits 32 to 37 output high-level signals respectively while the NOR circuits 38 and 39 output low-level signals respectively. Thus, the NAND-inverter circuits 40, 41 and 43 and the two-stage inverter circuit 44 output high-level word line source control signals XSE3B, XSE1, XUE1 and XEU2B respectively while the NAND-inverter circuit 42 and the two-stage inverter circuit 45 output low-level word line source control signals XSE0 and XUE0 respectively. Therefore, the p-channel transistor 46 and the n-channel transistor 48 are turned off and the n-channel transistor 47 is turned on for outputting a word line source signal SLSX of the voltage ⅓ VCC through the n-channel transistor 47. Further, the p-channel transistor 49 and the n-channel transistor 51 are turned off and the n-channel transistor 50 is turned on for outputting a word line source signal USSX of the voltage ⅓ VCC through the n-channel transistor 50.

Then, the memory makes a transition to the period T22 (see FIG. 5) so that the state signal STT3 and the inverted state signal STT3B go high and low respectively, whereby the NAND circuits 32 to 37 output high-level signals respectively while the NOR circuits 38 and 39 output low-level signals respectively. Thus, the word line source signals SLSX of USSX of the voltages ⅓ VCC and ⅓ VCC are continuously output through an operation similar to that in the aforementioned period T21.

Then, the memory makes a transition to the period T3 (see FIG. 5) so that the state signal STT4 and the inverted state signal STT4B go high and low respectively, whereby the NAND circuits 32 and 34 to 37 output high-level signals respectively while the NAND circuit 33 and the NOR circuits 38 and 39 output low-level signals respectively. Thus, the NAND-inverter circuits 40 to 42 and the two-stage inverter circuit 45 output low-level word line source control signals XSE3B to XSE0 and XUE0 respectively while the NAND-inverter circuit 43 and the two-stage inverter circuit 44 output high-level word line source control signals XUE2B and XUE1 respectively. Therefore, the p-channel transistor 46 is turned on and the n-channel transistors 47 and 48 are turned off for outputting a word line source signal SLSX of the voltage VCC through the p-channel transistor 46. Further, the p-channel transistor 49 and the n-channel transistor 51 are held in the OFF states and the n-channel transistor 50 is held in the ON state, for continuously outputting the word line source signal USSX of the voltage ⅓ VCC through the n-channel transistor 50.

Then, the memory makes a transition to the period T41 (see FIG. 5) so that the state signal STT5 and the inverted state signal STT5B go high and low respectively, whereby the NAND circuits 32 to 37 output high-level signals while the NOR circuits 38 and 39 output low-level signals respectively. Thus, word line source signals SLSX and USSX of the voltage ⅓ VCC are output through an operation similar to that in the aforementioned period T21.

Then, the memory makes a transition to the period T42 (see FIG. 5) so that the state signal STT1 and the inverted state signal STT1B go low and high respectively, whereby the NAND circuits 32 to 36 output high-level signals while the NAND circuit 37 and the NOR circuits 38 and 39 output low-level signals respectively. Thus, the NAND-inverter circuits 40 and 41 output high-level word line source control signals XSE3B and XSE1 respectively while the NAND-inverter circuits 42 an 43 and the two-stage inverter circuits 44 and 45 output low-level word line source control signals XSE0, XUE1, XUE2B and XUE0 respectively. Therefore, the p-channel transistor 46 and the n-channel transistor 48 are turned off and the n-channel transistor 47 is turned on for continuously outputting the word line source signal SLSX of the voltage ⅓ VCC through the n-channel transistor 47. Further, the p-channel transistor 49 is turned on and the n-channel transistors 50 and 51 are turned off for outputting a word line source signal USSX of the voltage ⅔ VCC through the p-channel transistor 49.

Then, the memory makes a transition to the period T5 (see FIG. 5) so that the state signal STT2 and the inverted state signal STT2B go low and high respectively, whereby the NAND circuits 32, 33, 35 and 36 and the NOR circuit 38 output high-level signals respectively while the NAND circuits 34 and 37 and the NOR circuit 39 output low-level signals respectively. Thus, the NAND-inverter circuits 40 and 42 output high-level word line source control signals XSE3B and XSE0 respectively while the NAND-inverter circuits 41 and 43 and the two-stage inverter circuits 44 and 45 output low-level word line source control signals XSE1, XUE1, XUE2B and XUE0 respectively. Therefore, the n-channel transistor 48 is turned on and the p-channel transistor 46 and the n-channel transistor 47 are turned off for outputting a word line source signal SLSX of the voltage VSS through the n-channel transistor 48. Further, the p-channel transistor 49 is held in the ON state and the n-channel transistors 50 and 51 are held in the OFF states, for continuously outputting the word line source signal USSX of the voltage ⅔ VCC through the p-channel transistor 49.

Then, the memory makes a transition to the period T61 (see FIG. 5) so that the state signal STT3 and the inverted state signal STT3B go low and high respectively, whereby the NAND circuits 32 to 35 and the NOR circuit 38 output high-level signals while the NAND circuits 36 and 37 and the NOR circuit 39 output low-level signals respectively. Thus, the NAND-inverter circuits 40 and 41 output high-level word line source control signals XSE3B and XSE1 while the NAND-inverter circuits 42 and 43 and the two-stage inverter circuits 44 and 45 output low-level word line source control signals XSE0, XUE1, XUE2B and XUE0 respectively. Therefore, the p-channel transistor 46 and the n-channel transistor 48 are turned off and the n-channel transistor 47 is turned on for outputting a word line source signal SLSX of the voltage ⅓ VCC through the n-channel transistor 47. Further, the p-channel transistor 49 is held in the ON state while the n-channel transistor 50 and 51 are held in the OFF states, for continuously outputting the word line source signal USSX of the voltage ⅔ VCC through the p-channel transistor 49.

Then, the memory makes a transition to the period T62 (see FIG. 5) so that the state signal STT4 and the inverted state signal STT4B go low and high respectively, whereby the NAND circuits 32 to 35 and 37 and the NOR circuit 38 output high-level signals while the NAND circuit 36 and the NOR circuit 39 output low-level signals respectively. Thus, the NAND-inverter circuits 40, 41 and 43 and the two-stage inverter circuit 44 output high-level word line source control signals XSE3B, XSE1, XUE1 and XUE2B respectively while the NAND-inverter circuit 42 and the two-stage inverter circuit 45 output low-level word line source control signals XSE0 and XUE0 respectively. Therefore, the p-channel transistor 46 and the n-channel transistor 48 are held in the OFF states while the n-channel transistor 47 is held in the ON state, for continuously outputting the word line source signal SLSX of the voltage ⅓ VCC through the n-channel transistor 47. Further, the p-channel transistor 49 and the n-channel transistor 51 are turned off and the n-channel transistor 50 is turned on for outputting a word line source signal USSX of the voltage ⅓ VCC through the n-channel transistor 50.

Finally, the memory makes a transition to the period T0 (see FIG. 5) again so that the state signal STT5 and the inverted state signal STT5B go low and high respectively, whereby all state signals STT1 to STT5 and all inverted state signals STT1B to STT5B go low and high respectively.

Thus, word line source signals SLSX and USSX of the voltage VSS are output by an operation similar to that in the aforementioned initial period T0.

Figure 15:
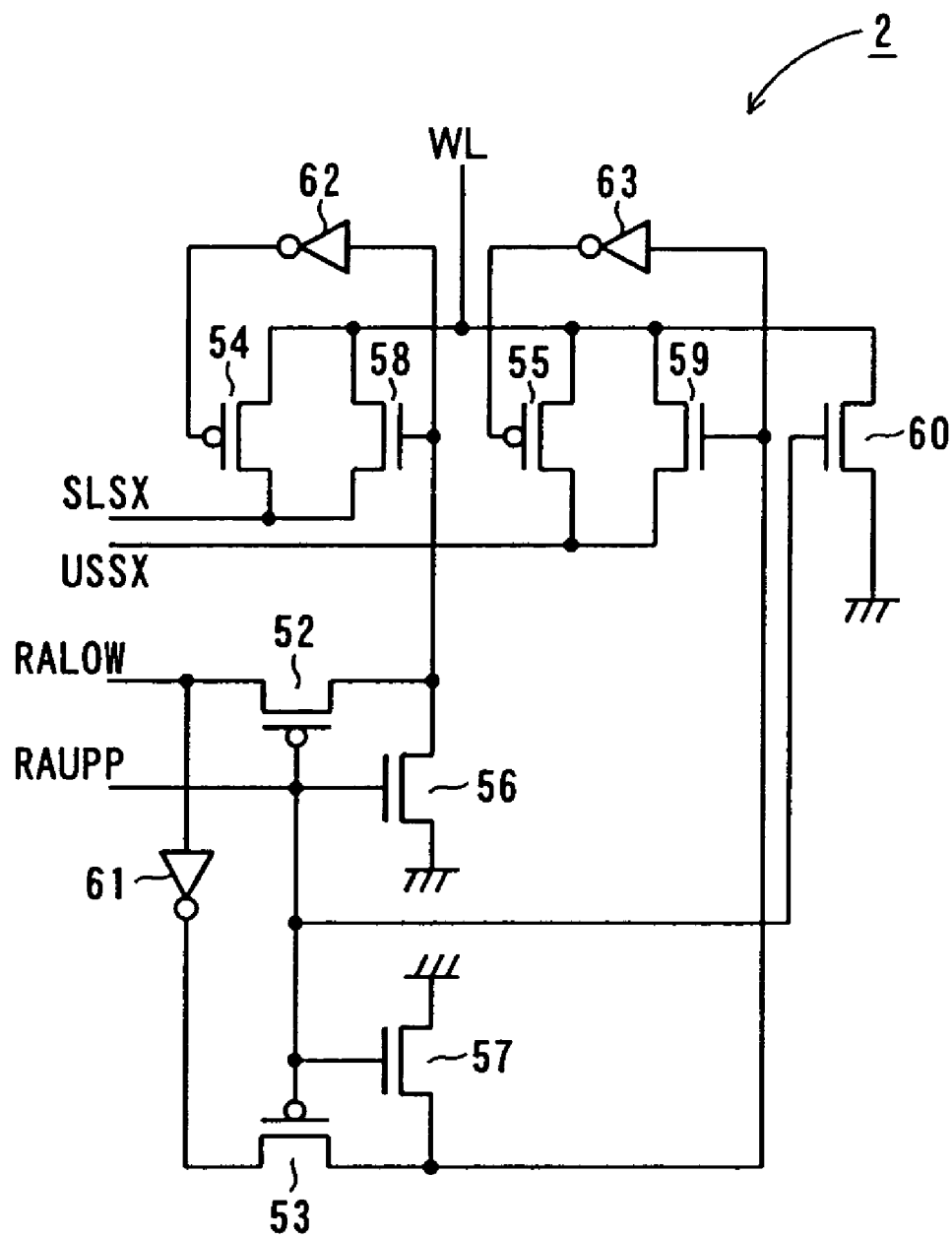
FIG. 15 is a circuit diagram showing the structure of a row decoder of the memory according to the first embodiment of the present invention shown in FIG. 1.

The structure of the row decoder 2 supplied with the word line source signals SLSX and USSX from the word line source driver 12 is described with reference to FIG. 15. The row decoder 2 according to the first embodiment is constituted of four p-channel transistors 52 to 55, five n-channel transistors 56 to 60 and three inverter circuits 61 to 63. The p-channel transistor 52 has a source supplied with an address signal RALOW from the row address buffer 4 (see FIG. 1) and a gate supplied with another address signal RAUPP. The n-channel transistor 56 has a source supplied with the voltage VSS (GND potential: 0 V) and a gate supplied with the address signal RAUPP from the row address buffer 4 (see FIG. 1). The drains of the p-channel transistor 52 and the n-channel transistor 56 are connected to the gate of the n-channel transistor 58 and also to the gate of the p-channel transistor 54 through the inverter circuit 62. The sources of the p-channel transistor 54 and the n-channel transistor 58 are supplied with the word line source signal SLSX from the word line source driver 12 (see FIGS. 1 an 14). The drains of the p-channel transistor 54 and the n-channel transistor 58 are connected to the word lines WL.

The p-channel transistor 53 has a source supplied with the address signal RALOW from the row address buffer 4 (see FIG. 1) through the inverter circuit 61 and a gate supplied with the address signal RAUPP from the row address buffer 4 (see FIG. 1). The n-channel transistor 57 has a source supplied with the voltage VSS (GND potential: 0 V) and a gate supplied with the address signal RAUPP from the row address buffer 4 (FIG. 1). The drains of the p-channel transistor 53 and the n-channel transistor 57 are connected to the gate of the n-channel transistor 59 and also to the gate of the p-channel transistor 55 through the inverter circuit 63. The sources of the p-channel transistor 55 and the n-channel transistor 59 are supplied with the word line source signal USSX from the word line source driver 12 (see FIGS. 1 and 14). The drains of the p-channel transistor 55 and the n-channel transistor 59 are connected to the word lines WL. The n-channel transistor 60 has a source supplied with the voltage VSS (GND potential: 0 V) and a gate supplied with the address signal RAUPP from the row address buffer 4 (see FIG. 1). The drain of the n-channel transistor 60 is connected to the word lines WL.

In operation, the row decoder 2 is supplied with low- and high-level address signals RALOW and RAUPP from the row address buffer 4 (see FIG. 1) in the period T0 (see FIG. 5) of the standby state. Thus, the p-channel transistors 52 and 53 are turned off and the n-channel transistors 56, 57 and 60 are turned on. Therefore, the voltage VSS (low level) is supplied to the gate of the n-channel transistor 58 through the n-channel transistor 56 while a high-level signal inverted through the inverter circuit 62 is supplied to the gate of the p-channel transistor 54. Thus, the n-channel transistor 58 and the p-channel transistor 54 are turned off. Further, the voltage VSS (low level) is supplied to the gate of the n-channel transistor 59 through the n-channel transistor 57 while a high-level signal inverted through the inverter circuit 63 is supplied to the gate of the p-channel transistor 55. Thus, the n-channel transistor 59 and the p-channel transistor 55 are turned off. Further, the voltage VSS is supplied to the word lines WL through the n-channel transistor 60.

Then, the memory makes a transition to the periods T1 to T62 (see FIG. 5) of the operating state. In order to select any of the word lines WL in the operating periods T1 to T62, the address signals RALOW and RAUPP go high and low respectively. Thus, the p-channel transistors 52 and 53 are turned on while the n-channel transistors 56, 57 and 60 are turned off. Therefore, the high-level address signal RALOW is supplied to the gate of the n-channel transistor 58 through the n-channel transistor 52 while a low-level address signal RALOW inverted through the inverter circuit 62 is supplied to the gate of the p-channel transistor 54. Thus, the n-channel transistor 58 and the p-channel transistor 54 are turned on for supplying the word line source signal SLSX to the word lines WL through the n-channel transistor 58 and the p-channel transistor 54. Further, a low-level address signal RALOW inverted by the inverter circuit 61 is supplied to the gate of the n-channel transistor 59 through the p-channel transistor 53 while a high-level address signal RALOW further inverted through the inverter circuit 63 is supplied to the gate of the p-channel transistor 55. Thus, the n-channel transistor 59 and the p-channel transistor 55 are turned off for supplying no word line source signal USSX to the word lines WL.

In order to select no word lines WL in the operating periods T1 to T62 (see FIG. 5), both of the address signals RALOW and RAUPP go low. Thus, the p-channel transistors 52 and 53 are turned on while the n-channel transistors 56, 57 and 60 are turned off. Therefore, the low-level address signal RALOW is supplied to the gate of the n-channel transistor 58 through the p-channel transistor 52 while a high-level address signal RALOW inverted through the inverter circuit 62 is supplied to the gate of the p-channel transistor 54. Thus, the n-channel transistor 58 and the p-channel transistor 54 are turned off for supplying no word line source signal SLSX to the word lines WL. Further, a high-level address signal RALOW inverted by the inverter circuit 61 is supplied to the gate of the n-channel transistor 59 through the p-channel transistor 53 while a low-level address signal RALOW further inverted through the inverter circuit 63 is supplied to the gate of the p-channel transistor 55. Thus, the n-channel transistor 59 and the p-channel transistor 55 are turned on, for supplying the word line source signal USSX to the word lines WL through the n-channel transistor 59 and the p-channel transistor 55.

Figure 16:
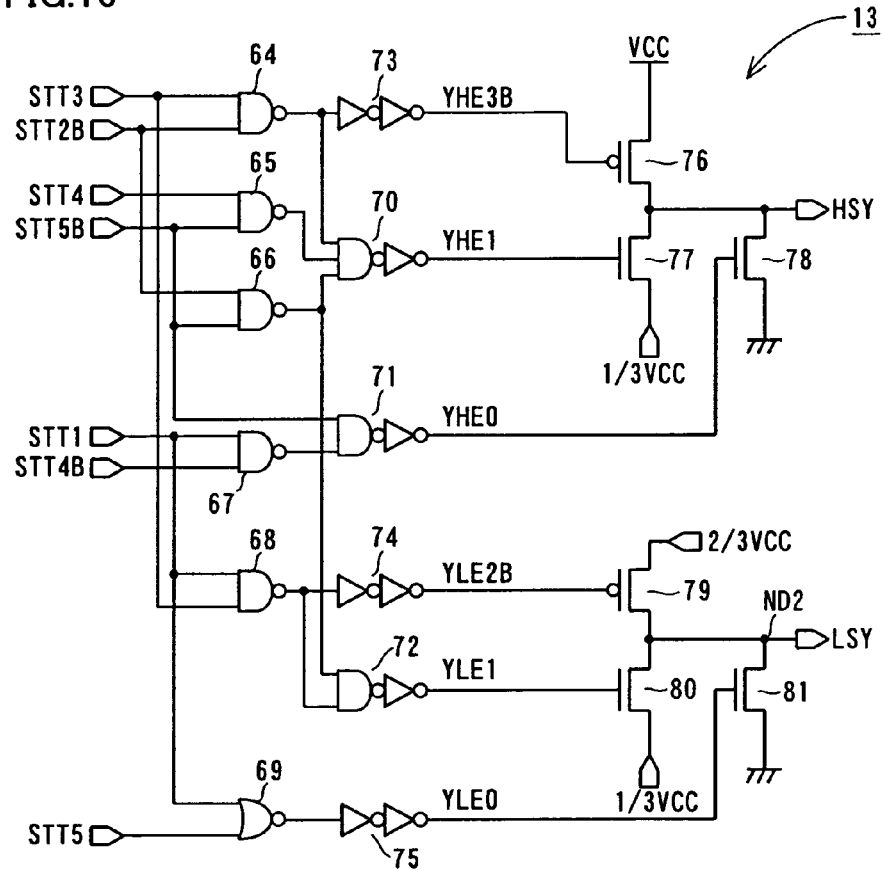
FIG. 16 is a circuit diagram showing the structure of a bit line source driver generating bit line source control signals.

FIG. 16 is a circuit diagram showing the structure of the bit line source driver 13 generating the bit line source control signals YHE3B to YHE0 and YLE2B to YLE0. As shown in FIG. 16, the bit line source driver 13 combines the state signals STT1 and STT3 to STT5 and the inverted state signals STT2B, STT4B and STT5B supplied from the state machine circuit 11 with each other thereby generating the bit line source control signals YHE3B to YHE0 and YLE2B to YLE0. Further, the bit line source driver 13 combines the generated bit line source control signals YHE3B to YHE0 with each other thereby outputting a bit line source signal HSY of any of the voltages VSS, ⅓ VCC and VCC from a first output terminal while combining the generated bit line source signals YLE2B to YLE0 with each other thereby outputting another bit line source signal LSY of any of the voltages VSS, ⅓ VCC and VCC from a second output terminal.

More specifically, the bit line source driver 13 is constituted of five NAND circuits 64 to 68, a NOR circuit 69, three NAND-inverter circuits 70 to 72, three two-stage inverter circuits 73 to 75, two p-channel transistors 76 and 79 and four n-channel transistors 77, 78, 80 and 81. The NAND circuit 64 receives the state signal STT3 and the inverted state signal STT2B. The NAND circuit 65 receives the state signal STT4 and the inverted state signal STT5B. The NAND circuit 66 receives the inverted state signals STT2B and STT5B. The NAN circuit 67 receives the state signal STT1 and the inverted state signal STT4B. The NAND circuit 68 receives the state signal STT1 and STT3. The NOR circuit 69 receives the state signals STT1 and STT5.

The NAND-inverter circuit 70 receives output signals from the NAND circuits 64, 65 and 66. The NAND-inverter circuit 71 receives the inverted state signal STT5B and an output signal from the NAND circuit 67. The NAND-inverter circuit 72 receives output signals from the NAND circuits 66 and 68. The two-stage inverter circuit 73 receives an output signal from the NAND circuit 64. The two-stage inverter circuit 74 receives an output signal from the NAND circuit 68. The two-stage inverter circuit 75 receives an output signal from the NOR circuit 69.

An output signal (bit line source control signal YHE1) of the NAND-inverter circuit 70 is supplied to the gate of the n-channel transistor 77. An output signal (bit line source control signal YHE0) of the NAND-inverter circuit 71 is supplied to the gate of the n-channel transistor 78. An output signal (bit line source control signal YLE1) of the NAND-inverter circuit 72 is supplied to the gate of the n-channel transistor 80. An output signal (bit line source control signal YHE3B) of the two-stage inverter circuit 73 is supplied to the gate of the p-channel transistor 76. An output signal (bit line source control signal YLE2B) of the two-stage inverter circuit 74 is supplied to the gate of the p-channel transistor 79. An output signal (bit line source control signal YLE0) of the two-stage inverter circuit 75 is supplied to the gate of the n-channel transistor 81. The remaining structure of the bit line source driver 13 is similar to that of the aforementioned word line source driver 12.

In operation, the bit line source driver 13 receives low-level state signals STT1 and STT3 to STT5 and high-level inverted state signals STT2B, STT4B and STT5B so that the NAND circuits 64, 65, 67 and 68 and the NOR circuit 69 output high-level signals while the NAND circuit 66 outputs a low-level signal respectively. Thus, the NAND-inverter circuits 70 and 72 output low-level bit line source control signals YHE1 and YLE1 respectively while the NAND circuit 71 and the two-stage inverter circuits 73 to 75 output high-level bit line source control signals YHE0, YHE3B, YLE2B and YLE0 respectively. Therefore, the p-channel transistor 76 and the n-channel transistor 77 are turned off and the n-channel transistor 78 is turned on for outputting a bit line source signal HSY of the voltage VSS through the n-channel transistor 78. Further, the p-channel transistor 79 and the n-channel transistor 80 are turned off and the n-channel transistor 81 is turned on for outputting a bit line source signal LSY of the voltage VSS through the n-channel transistor 81.

Then, the memory makes a transition to the period T1 (see FIG. 5) so that the state signal STT1 goes high, whereby the NAND circuits 64, 65 and 68 output high-level signals while the NAND circuits 66 and 67 and the NOR circuit 69 output low-level signals respectively. Thus, the bit line source control signals YHE1, YHE0, YLE1 and YLE0 output from the NAND-inverter circuits 70 and 72 and the two-stage inverter circuit 75 respectively go low while the bit line source control signals YHE3B and YLE2B output from the two-stage inverter circuits 73 and 74 respectively go high. Therefore, all of the p-channel transistors 76 and 79 and the n-channel transistors 77, 78, 80 and 81 are turned off. Thus, nodes ND1 and ND2 for outputting the bit line source signals HSY and LSY respectively enter open states (floating states), whereby the bit line source signals HSY and LSY enter high impedance states respectively.

Then, the memory makes a transition to the period T21 (see FIG. 5) so that the state signal STT2 goes high and hence the inverted state signal STT2B goes low, whereby the NAND circuits 64 to 66 and 68 output high-level signals while the NAND circuit 67 and the NOR circuit 69 output low-level signals respectively. Thus, the NAND-inverter circuits 70 and 72 and the two-stage inverter circuits 73 and 74 output high-level bit line source control signals YHE1, YLE1, YHE3B and YLE2B respectively while the NAND-inverter circuit 71 and the two-stage inverter circuit 75 output low-level bit line source control signals YHE0 and YLE0 respectively. Therefore, the p-channel transistor 76 and the n-channel transistor 78 are turned off and the n-channel transistor 77 is turned on for outputting a bit line source signal HSY of the voltage ⅓ VCC through the n-channel transistor 77. Further, the p-channel transistor 79 and the n-channel transistor 81 are turned off and the n-channel transistor 80 is turned on for outputting a bit line source signal LSY of the voltage ⅓ VCC through the n-channel transistor 80.

Then, the memory makes a transition to the period T22 (see FIG. 5) so that the state signal STT3 goes high, whereby the NAND circuits 64 to 66 output high-level signals while the NAND circuits 67 and 68 and the NOR circuit 69 output low-level signals respectively. Thus, the two-stage inverter circuit 73 and the NAND-inverter circuit 70 output high-level bit line source control signals YHE3B and YHE1 while the NAND-inverter circuits 71 and 72 and the two-stage inverter circuits 74 and 75 output low-level bit line source control signals YHE0, YLE1, YLE2B and YLE0 respectively. Therefore, the p-channel transistor 76 and the n-channel transistor 78 are held in the OFF states while the n-channel transistor 77 is held in the ON state for outputting a bit line source signal HSY of the voltage ⅓ VCC through the n-channel transistor 77. Further, the p-channel transistor 79 and the n-channel transistors 80 and 81 are turned off, whereby the bit line source signal LSY enters a high impedance state.

Then, the memory makes a transition to the period T3 (see FIG. 5) so that the state signal STT4 and the inverted state signal STT4B go high and low respectively, whereby the NAND circuits 64, 66 and 67 output high-level signals while the NAND circuits 65 and 68 and the NOR circuit 69 output low-level signals respectively. Thus, the NAND-inverter circuits 70 and 72 and the two-stage inverter circuits 74 and 75 output low-level bit line source control signals YHE1, YLE1, YLE2B and YLE0 respectively while the NAND-inverter circuit 71 and the two-stage inverter circuit 73 output high-level bit line source control signals YHE0 and YHE3B respectively. Therefore, the p-channel transistor 76 and the n-channel transistor 77 are turned off and the n-channel transistor 78 is turned on for outputting a bit line source signal HSY of the voltage VSS through the n-channel transistor 78. Further, the p-channel transistor 79 and the n-channel transistors 80 and 81 are held in the OFF states, whereby the bit line source signal LSY is held in the high impedance state.

Then, the memory makes a transition to the period T41 (see FIG. 5) so that the state signal STT5 and the inverted state signal STT5B go high and low respectively, whereby the NAND circuits 64 to 67 output high-level signals while the NAND circuit 68 and the NOR circuit 69 output low-level signals respectively. Thus, the NAND-inverter circuit 70 an the two-stage inverter circuit 73 output high-level bit line source control signals YHE1 and YHE3B while the NAND-inverter circuits 71 and 72 and the two-stage inverter circuits 74 and 75 output low-level bit line source control signals YHE0, YLE1, YLE2B and YLE0 respectively. Therefore, the p-channel transistor 76 and the n-channel transistor 78 are turned off and the n-channel transistor 77 is turned on for outputting a bit line source signal HSY of the voltage ⅓ VCC through the n-channel transistor 77. Further, the p-channel transistor 79 and the n-channel transistors 80 and 81 are held in the OFF states, whereby the bit line source signal LSY is held in the high impedance state.

Then, the memory makes a transition to the period T42 (see FIG. 5) so that the state signal STT1 goes low, whereby the NAND circuits 64 to 68 output high-level signals while the NOR circuit 69 outputs a low-level signal respectively. Thus, the NAND-inverter circuits 70 and 72 and the two-stage inverter circuits 73 and 74 output high-level bit line source control signals YHE1, YLE1, YHE3B and YLE2B while the NAND-inverter circuit 71 and the two-stage inverter circuit 75 output low-level bit line source control signals YHE0 and YLE0 respectively. Therefore, the p-channel transistor 76 and the n-channel transistor 78 are turned off and the n-channel transistor 77 is turned on for continuously outputting the bit line source signal HSY of the voltage ⅓ VCC through the n-channel transistor 77. Further, the p-channel transistor 79 and the n-channel transistor 81 are turned off and the n-channel transistor 80 is turned on for outputting a bit line source signal LSY of the voltage ⅓ VCC through the n-channel transistor 80.

Then, the memory makes a transition to the period T5 (see Fit. 5) so that the state signal STT2 goes low and hence the inverted state signal STT2B goes high, whereby the NAND circuit 64 and the NOR circuit 69 output low-level signals while the NAND circuits 65 to 68 output high-level signals respectively. Thus, the NAND-inverter circuits 70 and 71 and the two-stage inverter circuits 73 and 75 output low-level bit line source control signals YHE1, YHE0, YHE3B and YLE0 while the NAND-inverter circuit 72 and the two-stage inverter circuit 74 output high-level word line source control signals YLE1 and YLE2B respectively. Therefore, the p-channel transistor 76 and the n-channel transistors 77 and 78 are turned off, whereby the bit line source signal HSY enters a high impedance state. Further, the p-channel transistor 79 and the n-channel transistor 81 are held in the OFF states and the n-channel transistor 80 is held in the ON state for continuously outputting the bit line source signal LSY of the voltage ⅓ VCC through the n-channel transistor 80.

Then, the memory makes a transition to the period T61 (see FIG. 5) so that the state signal STT3 goes low, whereby the NAND circuits 64 to 68 output high-level signals while the NOR circuit 69 outputs a low-level signal respectively. Thus, the bit line source signals HSY and LSY of the voltage ⅓ VCC are output through an operation similar to that in the aforementioned period T42.

Then, the memory makes a transition to the period T62 (see FIG. 5) so that the state signal STT4 and the inverted state signal STT4B go low and high respectively, whereby the NAND circuits 64 to 68 output high-level signals while the NOR circuit 69 outputs a low-level signal respectively. Thus, the bit line source signals HSY and LSY of the voltage ⅓ VCC are continuously output.

Finally, the memory makes a transition to the period T0 (see FIG. 5) again so that the state signal STT5 and the inverted state signal STT5B go low and high respectively, whereby the state signals STT1 and STT3 to STT5 and the inverted state signals STT2B, STT4B and STT5B go low and high respectively. Thus, bit line source signals HSY and LSY of the voltage VSS are output through an operation similar to that in the aforementioned initial period T0.

The structure of the sense amplifier 14 supplied with the bit line source signals HSY and LSY from the bit line source driver 13 is described with reference to FIG. 17. The sense amplifier 14 according to the first embodiment has a function of amplifying voltages corresponding to data of memory cells read from bit lines BL (BLT and BLB) and determining whether the read data is high ("1") or low ("0"). Further, the sense amplifier 14 is so constituted as to supply the bit line source signal HSY to either bit line BL from which data determined as high is read while supplying the bit line source signal LSY to either bit line BL from which data determined as low is read.

Figure 17:
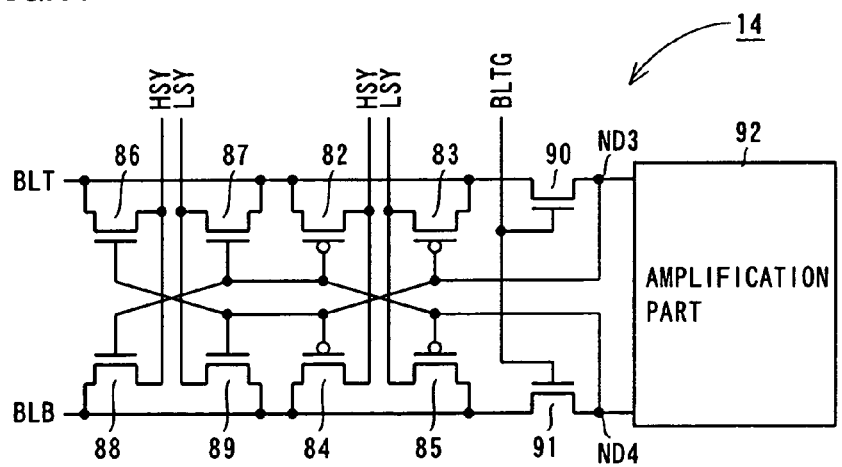
FIG. 17 is a circuit diagram showing the structure of a sense amplifier of the memory according to the first embodiment of the present invention shown in FIG. 1.

More specifically, the sense amplifier 14 according to the first embodiment is constituted of four p-channel transistors 82 to 85, six n-channel transistors 86 to 91 and an amplification part 92 as shown in FIG. 17. The sources of the p-channel transistors 82 and 84 are supplied with the bit line source signal HSY from the bit line source driver 13 (see FIGS. 1 and 16) while the sources of the p-channel transistors 83 and 85 are supplied with the bit line source signal LSY from the bit line source driver 13 (see FIGS. 1 and 16) respectively. The drains of the p-channel transistors 82 and 83 are connected to the bit line BLT while the drains of the p-channel transistors 84 and 85 are connected to the bit line BLB respectively. The gates of the p-channel transistors 82 to 85 are connected to the amplification part 92 respectively.

The drains of the n-channel transistors 86 and 88 are supplied with the bit line source signal HSY from the bit line source driver 13 while the drains of the n-channel transistors 87 and 89 are supplied with the bit line source signal LSY from the bit line source driver 13 (see FIGS. 1 and 16) respectively. The sources of the n-channel transistors 86 and 87 are connected to the bit line BLT while the sources of the n-channel transistors 88 and 89 are connected to the bit line BLB respectively. Further, the gates of the n-channel transistors 86 to 89 are connected to the amplification part 92 respectively. The n-channel transistor 90 has a drain connected to the bit line BLT and a source connected to the amplification part 92. The n-channel transistor 91 has a drain connected to the bit line BLB and a source connected to the amplification part 92. The gates of the n-channel transistors 90 and 91 are externally supplied with a bit line selection signal BLTG respectively. The amplification part 92 can be constituted of an amplifier such as a cross-coupled amplifier formed by cross-coupling a p-channel transistor and an n-channel transistor with each other or a current-mirror amplifier.

In operation, the sense amplifier 14 controls a potential output from the amplification part 92 thereby turning on the p-channel transistors 82 to 85 or the n-channel transistors 86 to 89 in the period T0 (see FIG. 5) of the standby state. Thus, bit line source signals HSY and LSY of the voltage VSS are supplied from the bit line source driver 13 (see FIGS. 1 and 16) to the bit line BLT through the p-channel transistors 82 and 83 or the n-channel transistors 86 and 87 respectively. Further, bit line source signals HSY and LSY of the voltage VSS are supplied from the bit line source driver 13 (see FIGS. 1 and 16) to the bit line BLB through the p-channel transistors 84 and 85 or the n-channel transistors 88 and 89 respectively. Thus, the voltages of the bit lines BLT and BLB reach the level VSS in the standby state. Alternatively, the voltages of the bit lines BLT and BLB may be set to the level VSS by supplying the voltage VSS from a separately provided precharge circuit.

Then, the memory makes a transition to the periods T1 to T62 (see FIG. 5) of the operating states so that the word lines WL (see FIG. 1) rise for transmitting potentials responsive to the data of the memory cells from the memory cells to the bit lines BLT and BLB. At this time, the bit line selection signal BLTG goes high. Thus, the n-channel transistors 90 and 91 are turned on for transmitting the potentials responsive to the data of the memory cells transmitted to the bit lines BLT and BLB from the bit lines BLT and BLB to the amplification part 92 through the n-channel transistors 90 and 91 respectively. Thereafter the bit line selection signal BLTG goes low so that the n-channel transistors 90 and 91 are turned on, whereby a current is inhibited from backwardly flowing from the amplification part 92 to the bit lines BLT and BLB. The amplification part 92 is activated for amplifying the voltages of the data of the memory cells and comparing the amplified voltages of the data of the memory cells with a reference potential therein, thereby ascertaining the data of the memory cell as high ("1") or low ("0"). Thus, the amplification part 92 supplies a high- or low-level potential to the gates of the p-channel transistors 82 to 85 and the n-channel transistors 86 to 89.

When ascertaining the data as high, the amplification part 92 supplies the nodes ND3 and ND4 with high- and low-level potentials respectively. Thus, the p-channel transistors 83 and 84 having the gates connected to the nodes ND3 are turned off while the n-channel transistors 86 and 89 are turned on. Further, the p-channel transistors 82 and 85 having the gates connected to the node ND4 are turned on while the n-channel transistors 87 an 88 are turned off. Thus, the bit line BLT is supplied with the bit line source signal HSY through the p-channel transistor 82 and the n-channel transistor 86 while the bit line BLB is supplied with the bit line source signal LSY through the p-channel transistor 85 and the n-channel transistor 89.

When ascertaining the data as low, on the other hand, the amplification part 92 supplies the nodes ND3 and ND4 with low- and high-level potentials respectively. Thus, the p-channel transistors 83 an 84 having the gates connected to the node ND3 are turned on while the n-channel transistors 86 and 89 are turned off. Further, the p-channel transistors 82 and 85 having the gates connected to the node ND4 are turned off while the n-channel transistors 87 and 88 are turned on. Thus, the bit line BLB is supplied with the bit line source signal LSY through the p-channel transistor 83 and the n-channel transistor 87 while the bit line BLB is supplied with the bit line source signal HSY through the p-channel transistor 84 and the n-channel transistor 88. Therefore, the memory applies the voltages VSS, 1/3 VCC, 2/3 VCC and VCC to the bit lines BLT and BLB (the "1" reading bit lines BL3 and BL5 and the "0" reading bit lines BL0 to BL2, BL4, BL6 and BL7) in the voltage waveforms shown in FIG. 5.

Second Embodiment

Figure 18:
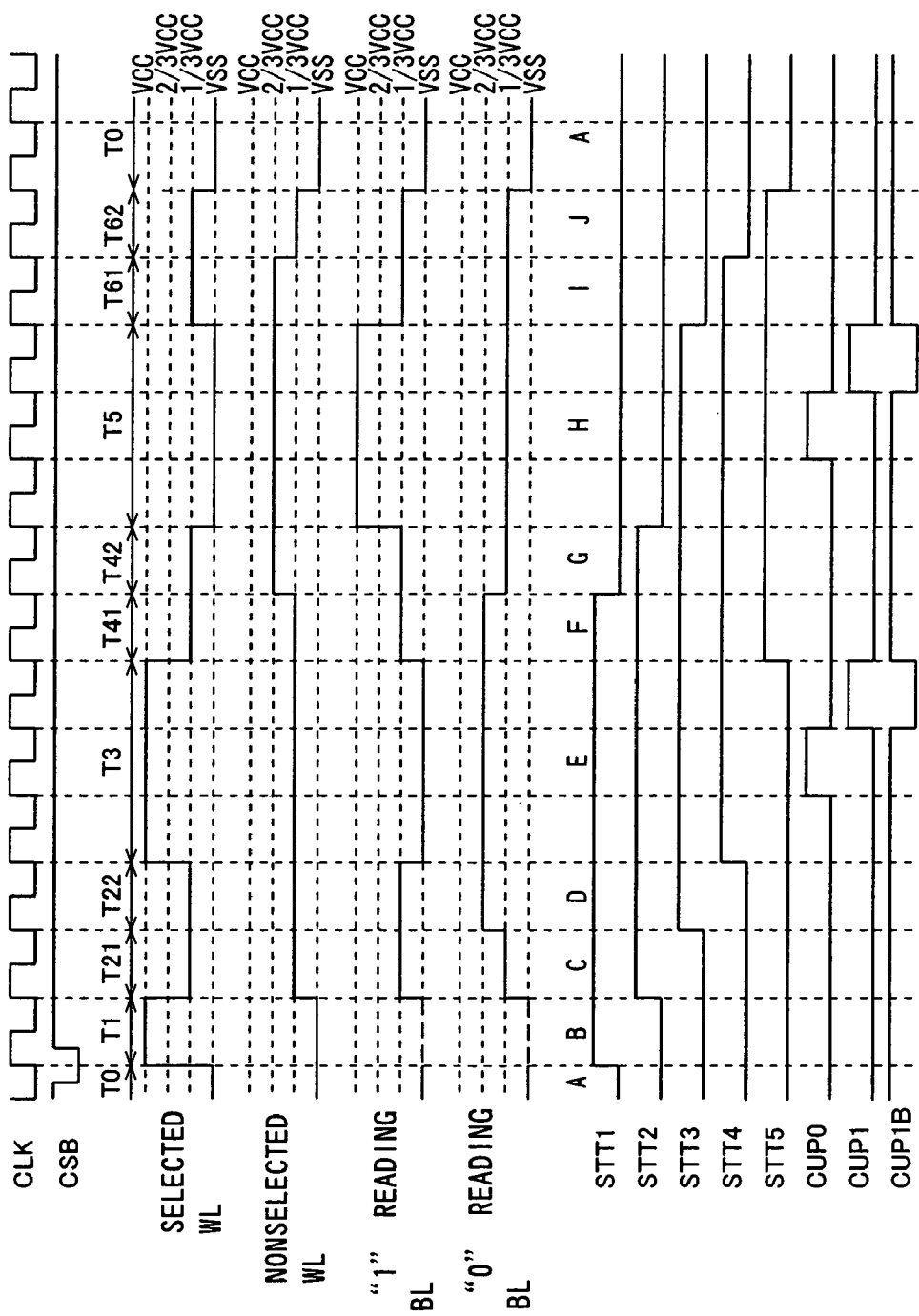
FIG. 18 is a waveform diagram showing a method of applying voltages to word lines and bit lines of a memory according to a second embodiment of the present invention.

Read and rewrite operations of a memory according to a second embodiment of the present invention are now described with reference to FIG. 18.

The memory according to the second embodiment sets the length of periods T3 and T5 for rewrite operations to three times the length of periods T1 to T22, dissimilarly to the memory according to the aforementioned first embodiment. In other words, the memory according to the second embodiment can more reliably rewrite data "0" in memory cells of second cell regions (see FIG. 3) in the period T3 while more reliably rewriting data "1" in the memory cells of the second cell regions (see FIG. 3) in the period T5. The remaining read and rewrite operations of the memory according to the second embodiment are similar to those of the memory according to the aforementioned first embodiment.

Figure 19:
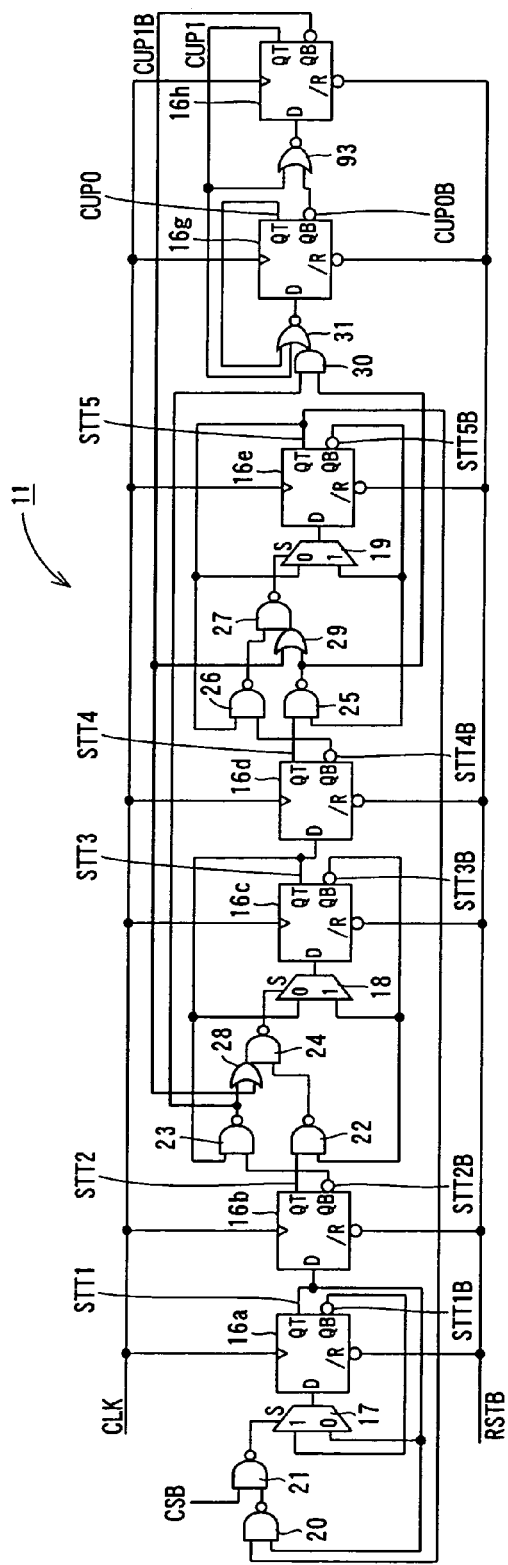
FIG. 19 is a circuit diagram showing the structure of a state machine circuit generating state signals in the memory according to the second embodiment of the present invention.

Referring to FIG. 19, a state machine circuit 11 of the memory according to the second embodiment includes seven DFF circuits 16a, 16b, 16c, 16d, 16e, 16g and 16h dissimilarly to the state machine circuit 11 according to the aforementioned first embodiment. The DFF circuits 16g and 16h receive a clock signal CLK and an inverted reset signal RSTB respectively. The DFF circuit 16g further receives an output signal from a NOR circuit 31 in its input terminal D, and outputs a count-up signal CUP0 and an inverted count-up signal CUP0B from its output terminals QT and QB respectively. The count-up signal CUP0 and the inverted count-up signal CUP0 are input in NOR circuits 31 and 93 respectively. An output signal of the NOR circuit 93 is input in an input terminal D of the DFF circuit 16h. The DFF circuit 16h outputs a count-up signal CUP1 and an inverted count-up signal CUP1B from its output terminals QT and QB respectively. The count-up signal CUP1 is input in the NOR circuit 31 and 93 while the inverted count-up signal CUP1B is input in OR circuits 28 and 29 respectively. The remaining structure of the state machine circuit 11 according to the second embodiment is similar to that of the state machine circuit 11 according to the aforementioned first embodiment. Further, the remaining structure of the memory according to the second embodiment other than the state machine circuit 11 is similar to that of the memory according to the aforementioned first embodiment.

Operations of the state machine circuit 11 according to the second embodiment of the present invention are now described with reference to FIGS. 18 and 19. The state machine circuit 11 according to the second embodiment successively outputs high-level state signals STT1 to STT4 in response to a clock signal CLK successively going high, similarly to the state machine circuit 11 according to the aforementioned first embodiment. The high-level state signal STT4 is input in a NAND circuit 25. The NAND circuit 25 also receiving a high-level inverted state signal STT5B from the DFF circuit 16e inputs a low-level signal in the OR circuit 29. The OR circuit 29 also receiving a high-level inverted count-up signal CUP1B from the DFF circuit 16h inputs a high-level signal in the NAND circuit 27. On the other hand, a NAND circuit 26 receives a low-level inverted state signal STT4B from the DFF circuit 16d. The NAND circuit 26 also receiving a low-level state signal STT5 from the DFF circuit 16e inputs a high-level signal in the NAND circuit 27. Thus, the NAND circuit 27 inputs a low-level signal in a selector circuit 19, for holding the input of the selector circuit 19 on a "0" side. Thus, the low-level state signal STT output from the DFF circuit 16e is supplied to the DFF circuit 16e through the selector circuit 19. Thereafter the state signal STT5 output from the DFF circuit 16e is held at the low level also when a clock signal CLK subsequently input in the DFF circuit 16e goes low and thereafter goes high.

The low-level signal output from the NAND circuit 25 is also input in an AND circuit 30. The AND circuit 30 also receiving a high-level signal from the NAND circuit 23 inputs a low-level signal in the NOR circuit 31. The NOR circuit 31 also receiving low-level count-up signals CUP0 and CUP1 from the DFF circuits 16g and 16h respectively inputs a high-level signal in the DFF circuit 16g. Thus, the high-level clock signal CLK for holding the aforementioned state signal STT5 at the low level is input in the DFF circuit 16g, which in turn outputs a high-level count-up signal CUP0 and a low-level inverted count-up signal CUP0B.

The low-level inverted count-up signal CUP0B is input in the NOR circuit 93. The NOR circuit 93 also receiving a low-level count-up signal CUP1 from the DFF circuit 16h inputs a high-level signal in the DFF circuit 16h. Thus, a clock signal CLK subsequently input in the DFF circuit 16h goes low and thereafter goes high so that the DFF circuit 16h outputs a high-level count-up signal CUP1 and a low-level inverted count-up signal CUP1B.

The low-level inverted count-up signal CUP1B is input in the OR circuit 29. The OR circuit 29 also receiving the low-level signal from the NAND circuit 25 inputs a low-level signal in the NAND circuit 27. The NAND circuit 27 also receiving the high-level signal from the NAND circuit 26 inputs a high-level signal in the selector circuit 19. Thus, the input of the selector circuit 19 is switched to a "1" side, whereby the high-level inverted state signal STT5B output from the DFF circuit 16e is supplied to the DFF circuit 16e through the selector circuit 19. Therefore, a clock signal CLK subsequently input in the DFF circuit 16e goes low and thereafter goes high so that the DFF circuit 16e outputs a high-level state signal STT5 and a low-level inverted state signal STT5B. Thus, the leading edge of the state signal STT5 delays from the leading edge of the state signal STT4 by the period corresponding to three high-level clock signals CLK.

Thereafter the state signals STT1 and STT2 successively go low in response to the clock signal CLK successively going high, similarly to the state machine circuit 11 according to the aforementioned first embodiment. After the aforementioned high-level state signal STT4 is output, the DFF circuit 16b outputs a low-level state signal STT2 in response to a third high-level clock signal CLK through an operation similar to that for outputting the high-level state signal STT5 and the DFF circuit 16c thereafter outputs a low-level state signal STT3 in response to the third high-level clock signal CLK. Thus, the trailing edge of the state signal STT3 delays from the trailing edge of the state signal STT2 by the period corresponding to three high-level clock signals CLK.

Thereafter the state signals STT4 and STT5 successively go low in response to the clock signal CLK successively going high, similarly to the state machine circuit 11 according to the aforementioned first embodiment.

As hereinabove described, the leading edge of the state signal STT5 delays by the period corresponding to three clock signals CLK, i.e., three times the delay of the leading edges of the state signals STT2 to STT4 corresponding to the period of one clock signal CLK. Thus, the length of the period T3 for rewriting set in response to the period between the leading edges of the state signals STT4 and STT5 is three times the length of the period T1 corresponding to the interval between the leading edges of the state signals STT1 and STT2, the period T21 corresponding to the interval between the leading edges of the state signals STT2 and STT3 and the period T22 corresponding to the interval between the leading edges of the state signals STT3 and STT4. Further, the trailing edge of the state signal STT3 delays by the period corresponding to three clock signals CLK, i.e., three times the delay of the trailing edges of the state signals STT2 to STT4 corresponding to one clock signal CLK. Thus, the length of the period T5 for rewriting set in response to the period between the trailing edges of the state signals STT2 and STT3 is three times the length of the period T1 corresponding to the interval between the leading edges of the state signals STT1 and STT2, the period T21 corresponding to the interval between the leading edges of the state signals STT2 and STT3 and the period T22 corresponding to the interval between the leading edges of the state signals STT3 and STT4.

According to the second embodiment, as hereinabove described, the memory sets the length of the periods T3 and T5 for rewriting to three times the length of the periods T1 to T22 so that a period of a length required for rewriting data in the memory cells of the second cell regions (see FIG. 3) can be ensured also when the pulse width of the clock signal CLK for generating the periods T1 to T62 is reduced and the length of the periods T1 to T62 is also reduced. Thus, the memory can reliably rewrite data in the memory cells of the second cell regions while increasing the operating speed thereof.

The remaining effects of the memory according to the second embodiment are similar to those of the memory according to the aforementioned first embodiment.

Third Embodiment

Read and rewrite operations of a memory according to a third embodiment of the present invention are now described with reference to FIG. 20.

Figure 20:
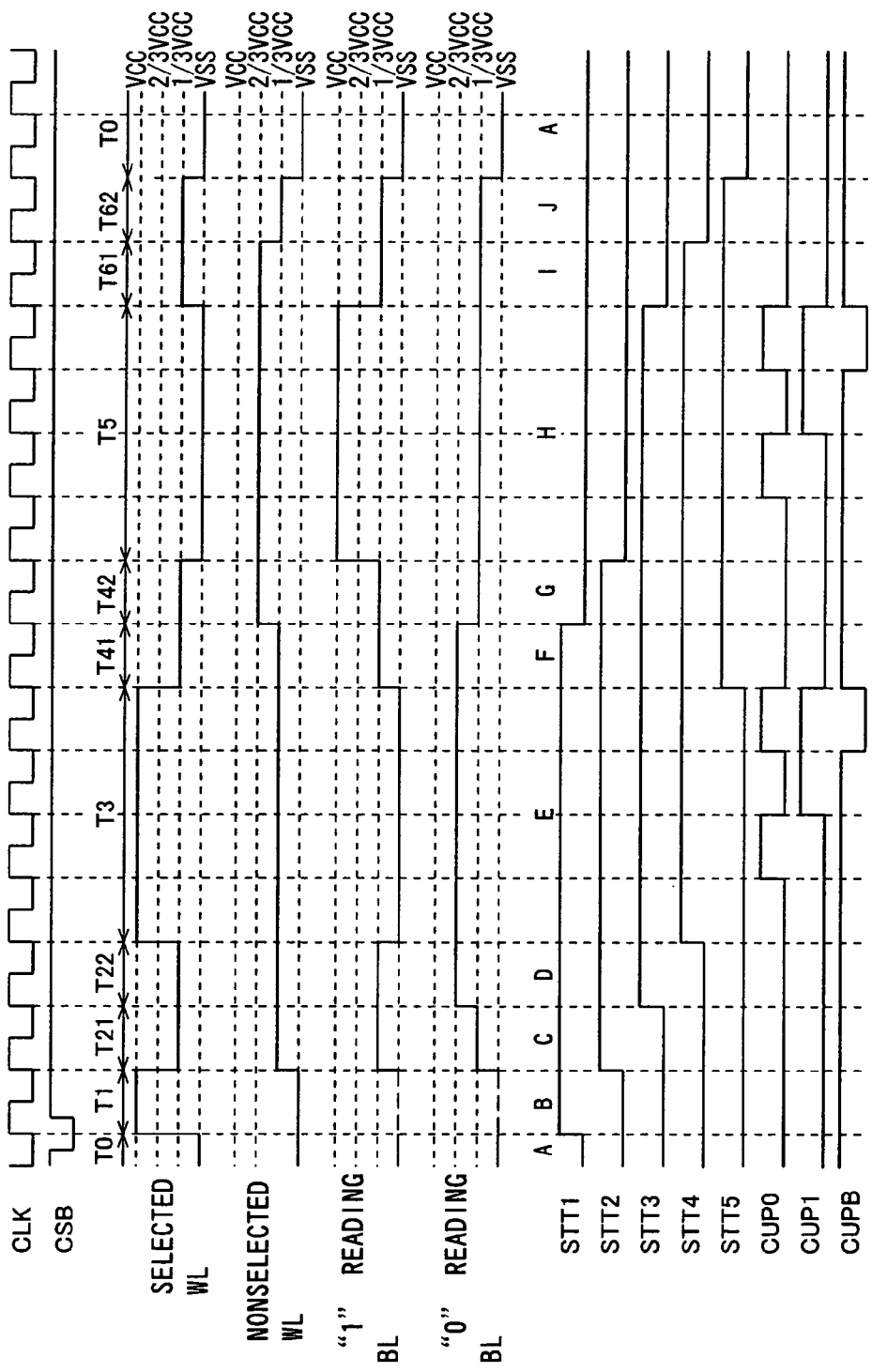
FIG. 20 is a waveform diagram showing a method of applying voltages to word lines and bit lines of a memory according to a third embodiment of the present invention.

The memory according to the third embodiment sets the length of periods T3 and T5 for rewriting to four times the length of periods T1 to T22 as shown in FIG. 20, dissimilarly to the memory according to the aforementioned first embodiment. In other words, the memory according to the third embodiment can more reliably rewrite data "0" in memory cells of second cell regions (see FIG. 3) in the period T3 while more reliably rewriting data "1" in the memory cells of the second cell regions (see FIG. 3) in the period T5. The remaining read and rewrite operations of the memory according to the third embodiment are similar to those of the memory according to the aforementioned first embodiment.

Figure 21:
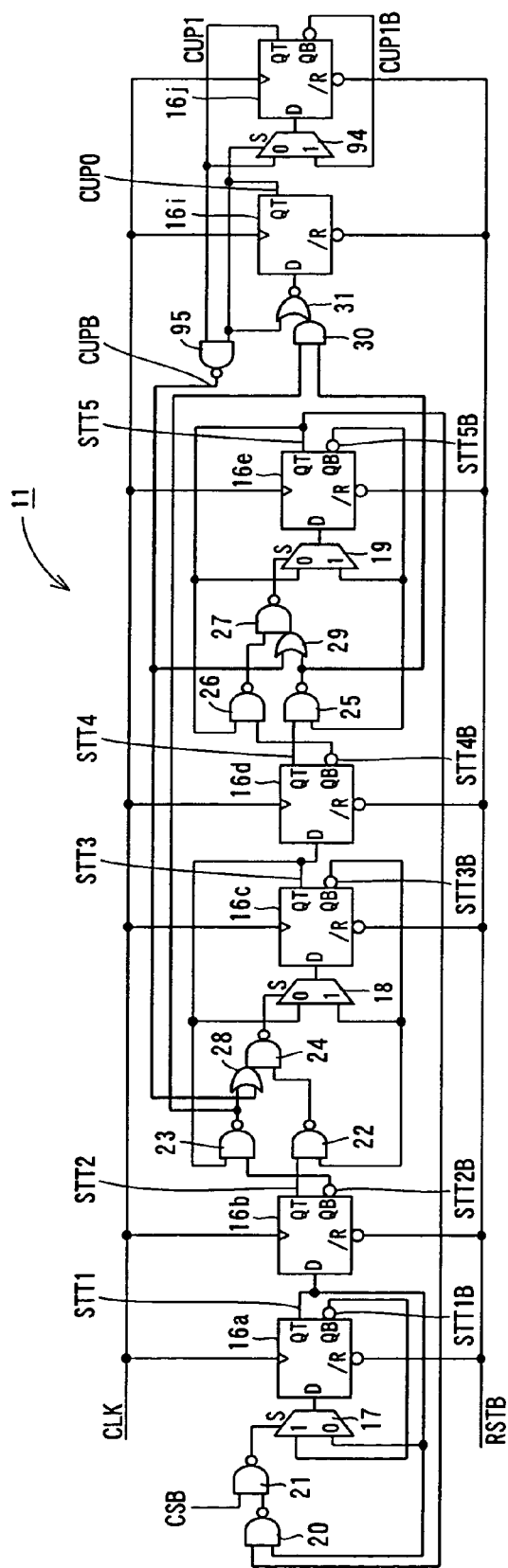
FIG. 21 is a circuit diagram showing the structure of a state machine circuit generating state signals in the memory according to the third embodiment of the present invention.

Referring to FIG. 21, a state machine circuit 11 of the memory according to the third embodiment includes seven DFF circuits 16a, 16b, 16c, 16d, 16e, 16i and 16j, dissimilarly to the state machine circuit 11 according to the aforementioned first embodiment. The DFF circuits 16i and 16j receive a clock signal CLK and an inverted reset signal RSTB respectively. The DFF circuit 16i further receives an output signal from a NOR circuit 31 in its input terminal D while outputting a count-up signal CUP0 from its output terminal QT. This count-up signal CUP0 is input in a NAND circuit 95 and a selector circuit 94. An output signal of the selector circuit 94 is input in an input terminal D of the DFF circuit 16i. The DFF circuit 16j outputs a count-up signal CUP1 and an inverted count-up signal CUP1B from its output terminals QT and QB respectively. The count-up signal CUP1 is input in the NAND circuit 95 and a "0" side of the selector circuit 94, while the inverted count-up signal CUP1B is input in a "1" side of the selector circuit 94. The NAND circuit 95 outputs an inverted count-up signal CUPB, which is input in OR circuits 28 and 29. The remaining structure of the state machine circuit 11 according to the third embodiment is similar to that of the state machine circuit 11 according to eh aforementioned first embodiment.

Operations of the state machine circuit 11 according to the third embodiment are now described with reference to FIGS. 20 and 21. The state machine circuit 11 according to the third embodiment successively outputs high-level state signals STT1 to STT4 in response to the clock signal CLK successively going high, similarly to the state machine circuit 11 according to the aforementioned first embodiment. In a period up to the leading edge of the state signal STT4, signals input in an AND circuit 30 from NAND circuits 23 and 25 are held at high levels. Thus, the AND circuit 30 inputs a high-level signal in a NOR circuit 31. The NOR circuit 31 also receiving a low-level count-up signal CUP0 from the DFF circuit 16i holds the count-up signal CUP0 output from the DFF circuit 16i at the low level. The low-level count-up signal CUP0 is input in the selector circuit 94, so that an input of the selector circuit 94 is held on the "0" side. Thus, a low-level count-up signal CUP1 output from the DFF circuit 16j is supplied to the DFF circuit 16j through the selector circuit 94, whereby the count-up signal CUP1 output from the DFF circuit 16j is held at the low level. Thus, the NAND circuit 95 receives the low-level count-up signals CUP0 and CUP1 from the DFF circuits 16i and 16j respectively, whereby the count-up signal CUPB output from the NAND circuit 95 is held at a high level in the period up to the leading edge of the state signal STT4. The high-level count-up signal CUPB is input in the OR circuit 29, whereby the state signal STT5 output from the DFF circuit 16e is held at the low level in the period up to the leading edge of the state signal STT4, similarly to the aforementioned first embodiment.

When the start signal STT4 goes high, the high-level state signal STT4 and a high-level inverted state signal STT5B are input in the NAND circuit 25, which in turn outputs a low-level signal. Thus, the AND circuit 30 receives the low-level signal from the NAND circuit 25 and a high-level signal from the NAND circuit 23, for inputting a low-level signal in the NOR circuit 31. The NOR circuit 31 also receiving the low-level count-up signal CUP0 from the DFF circuit 16i inputs a high-level signal in the DFF circuit 16i. Thus, a clock signal CLK subsequently input in the DFF circuit 16i goes low and thereafter goes high so that the DFF circuit 16i outputs a high-level count-up signal CUP0.

The high-level count-up signal CUP0 is input in the selector circuit 94, for switching the input of the selector circuit 94 to the "1" side. Thus, the high-level inverted count-up signal CUP1B output from the DFF circuit 16j is supplied to the DFF circuit 16j through the selector circuit 94. Therefore, a clock signal CLK subsequently input in the DFF circuit 16j goes low and thereafter goes high so that the DFF circuit 16j outputs a high-level count-up signal CUP1. The high-level count-up signal CUP0 is also input in the NOR circuit 31. The NOR circuit 31 also receiving the low-level signal from the AND circuit 30 inputs a low-level signal in the DFF circuit 16i. Thus, the DFF circuits 16i outputs a low-level count-up signal CUP0 due to the high-level clock signal CLK for the high-level count-up signal CUP1 output from the DFF circuit 16j. Therefore, the NAND circuit 95 receives the high- and low-level count-up signals CUP1 and CUP0, whereby the inverted count-up signal CUPB output from the NAND circuit 95 is held at the high level.

The low-level count-up signal CUP0 is input in the NOR circuit 31. The NOR circuit 31 also receiving the low-level signal from the AND circuit 30 inputs a high-level signal in the DFF circuit 16i. Thus, a clock signal CLK subsequently input in the DFF circuit 16i goes low and thereafter goes high so that the DFF circuit 16i outputs a high-level count-up signal CUP0. At this time, the count-up signal CUP1 output from the DFF circuit 16j is held at the high level, whereby the NAND circuit 95 receiving the high-level count-up signals CUP0 and CUP1 outputs a low-level inverted count-up signal CUPB.

The low-level inverted count-up signal CUPB is input in the OR circuit 29. The OR circuit 29 also receiving the low-level signal from the NAND circuit 25 inputs a low-level signal in the NAND circuit 27. The NAND circuit 27 also receiving the high-level signal from the NAND circuit 26 inputs a high-level signal in the selector circuit 19. Thus, the input of the selector circuit 19 is switched to the "1" side. Therefore, the high-level inverted state signal STT5B output from the DFF circuit 16e is supplied to the DFF circuit 16e through the selector circuit 19. Therefore, a clock signal CLK subsequently input in the DFF circuit 16e goes low and thereafter goes high so that the DFF circuit 16e outputs a high-level state signal STT5. Thus, the leading edge of the state signal STT5 delays from the leading edge of the state signal STT4 by the period corresponding to four high-level clock signals CLK.

Thereafter the state signals STT1 and STT2 successively go low in response to the clock signal CLK successively going high, similarly to the state machine circuit 11 according to the aforementioned first embodiment. After the aforementioned high-level state signal STT4 is output, the DFF circuit 16b outputs a low-level state signal STT2 in response to a fourth high-level clock signal CLK through an operation similar to that for outputting the high-level state signal STT5 and the DFF circuit 16c thereafter outputs a low-level state signal STT3 in response to the fourth high-level clock signal CLK. Thus, the trailing edge of the state signal STT3 delays from the trailing edge of the state signal STT2 by the period corresponding to four high-level clock signals CLK.

Thereafter the state signals STT4 and STT5 successively go low in response to the clock signal CLK successively going high, similarly to the state machine circuit 11 according to the aforementioned first embodiment.

As hereinabove described, the leading edge of the state signal STT5 delays by the period corresponding to four clock signals CLK, i.e., four times the delay of the leading edges of the state signals STT2 to STT4 corresponding to the period of one clock signal CLK. Thus, the length of the period T3 for rewriting set in response to the period between the leading edges of the state signals STT4 and STT5 is four times the length of the period T1 corresponding to the interval between the leading edges of the state signals STT1 and STT2, the period T21 corresponding to the interval between the leading edges of the state signals STT2 and STT3 and the period T22 corresponding to the interval between the leading edges of the state signals STT3 and STT4. Further, the trailing edge of the state signal STT3 delays by the period corresponding to four clock signals CLK, i.e., four times the delay of the trailing edges of the state signals STT2 to STT4 corresponding to the period of one clock signal CLK. Thus, the length of the period T5 for rewriting set in response to the period between the trailing edges of the state signals STT2 and STT3 is four times the length of the period T1 corresponding to the interval between the leading edges of the state signals STT1 and STT2, the period T21 corresponding to the interval between the leading edges of the state signals STT2 and STT3 and the period T22 corresponding to the interval between the leading edges of the state signals STT3 and STT4.

According to the third embodiment, as hereinabove described, the memory sets the length of the periods T3 and T5 for rewriting to four times the length of the periods T1 to T22 so that the period of the length required for rewriting data in the memory cells of the second cell regions (see FIG. 3) can be ensured also when the pulse width of the clock signal CLK for generating the periods T1 to T62 is reduced and the length of the periods T1 to T62 is also reduced. Thus, the memory can reliably rewrite data in the memory cells of the second cell regions while increasing the operating speed thereof.

The remaining effects of the memory according to the third embodiment are similar to those of the memory according to the aforementioned first embodiment.

Although the present invention has been described and illustrated in detail, it is clearly understood that the same is by way of illustration and example only and is not to be taken by way of limitation, the spirit and scope of the present invention being limited only by the terms of the appended claims.

For example, while the memory according to each of the aforementioned embodiments activates the bit lines BL stepwise before activating the word lines WL for rewriting, the present invention is not restricted to this but the memory may alternatively activate the word lines WL stepwise before activating the bit lines BL.

While the memory according to each of the aforementioned embodiments activates the bit lines BL by ⅓ VCC in two stages, the present invention is not restricted to this but the memory may alternatively activate the bit lines BL by not more than ⅓ VCC in at least three stages. Further alternatively, the memory may smoothly gradually activate the bit lines BL. Also in the case of activating the bit lines BL in this manner, effects similar to those of the aforementioned embodiments can be attained.

Figure 22:
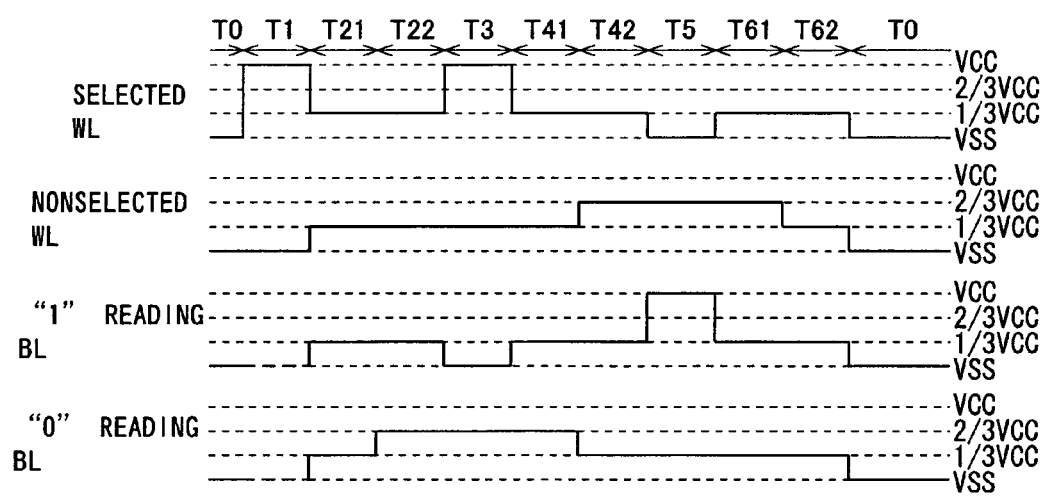
FIG. 22 is a voltage waveform diagram showing a method of applying voltages to word lines and bit lines of a memory according to a modification of the present invention.
Figure 23:
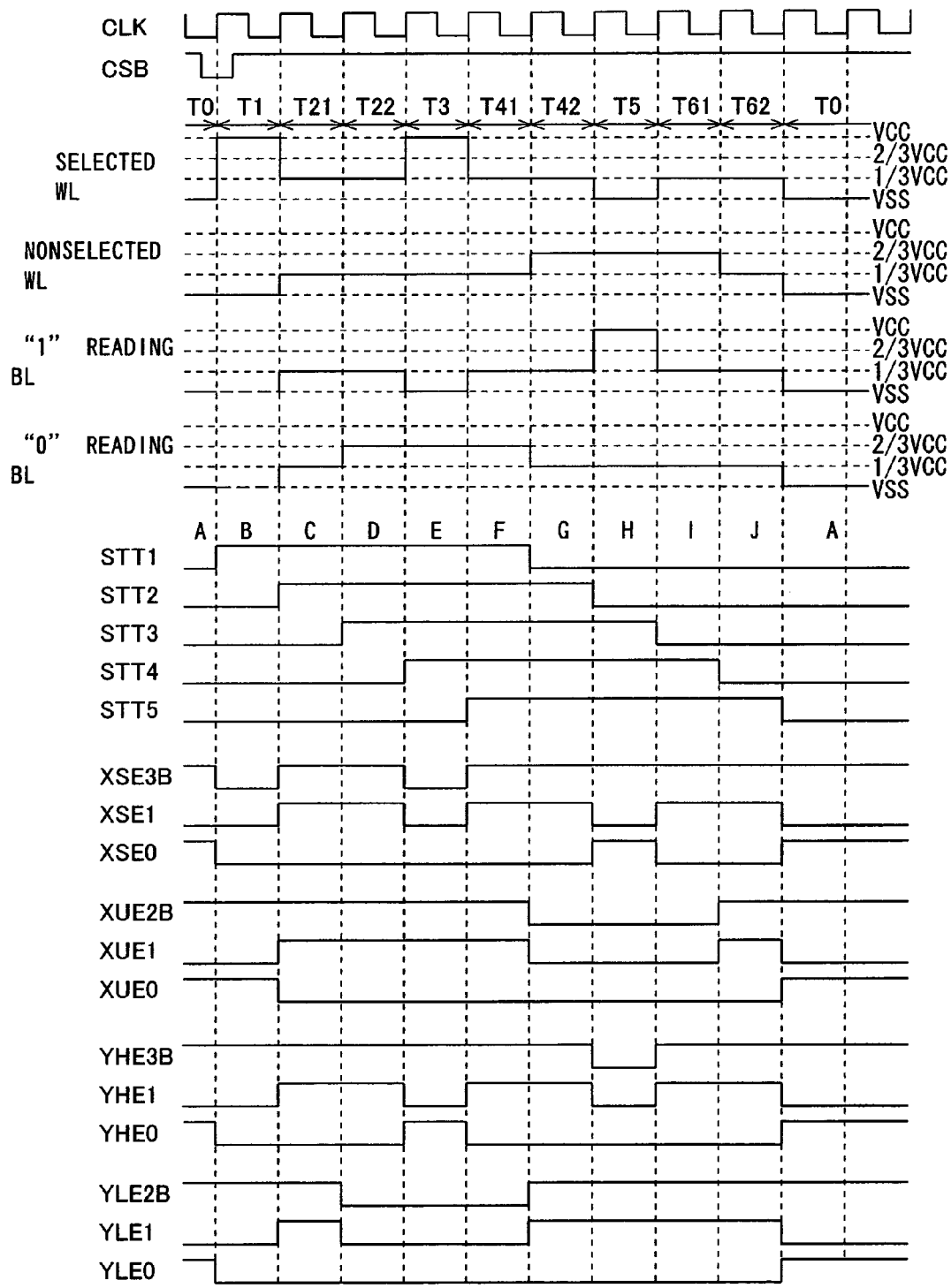
FIG. 23 is a voltage waveform diagram of internal signals employed for supplying voltages to word lines WL and bit lines BL of the memory according to the modification of the present invention.

While the memory according to each of the aforementioned embodiments sets the length of the periods T3 and T5 for rewriting larger than the length of the remaining periods T1 to T22, the present invention is not restricted to this but the memory may alternatively set the length of the periods T3 and T5 for rewriting substantially identical to the length of the remaining periods T1 to T22. FIG. 22 is a voltage waveform diagram showing a method of voltage application to word lines WL and bit lines BL in a memory according to a modification of the present invention. FIG. 23 is a voltage waveform diagram of internal signals employed for supplying voltages to the word lines WL and the bit lines BL in the memory according to the modification of the present invention. In the method of voltage application in the memory according to this modification, the length of periods T3 and T5 for rewriting is set identical to the length of periods T1 to T22, as shown in FIG. 22. Thus, the length of the periods T3 and T5 in the internal signals, i.e., state signals STT1 to STT5, word line source control signals XSE3B to XSE0 and XUE2B to XUE0 and bit line source control signals YHE3B to YHE0 and YLE2B to YLE0, is also set identical to the period of the corresponding periods T1 to T22. The remaining structure of the method of voltage application in the memory according to the modification of the present invention is similar to that of the memory according to the aforementioned first embodiment.

The memory according to the modification of the present invention activates "0" reading bit lines BL0 to BL2, BL4, BL6 and BL7 (see FIG. 3) by ⅓ VCC stepwise as hereinabove described so that potential difference between a selected word line WL3 (see FIG. 3) and the "0" reading bit lines BL0 to BL2, BL4, BL6 and BL7 corresponding to unrewritten memory cells of first cell regions (see FIG. 3) can be inhibited from exceeding the level ⅓ VCC, whereby the unrewritten memory cells of the first cell regions can be inhibited from disturbance resulting from application of potential difference exceeding the level ⅓ VCC.

Figure 24:
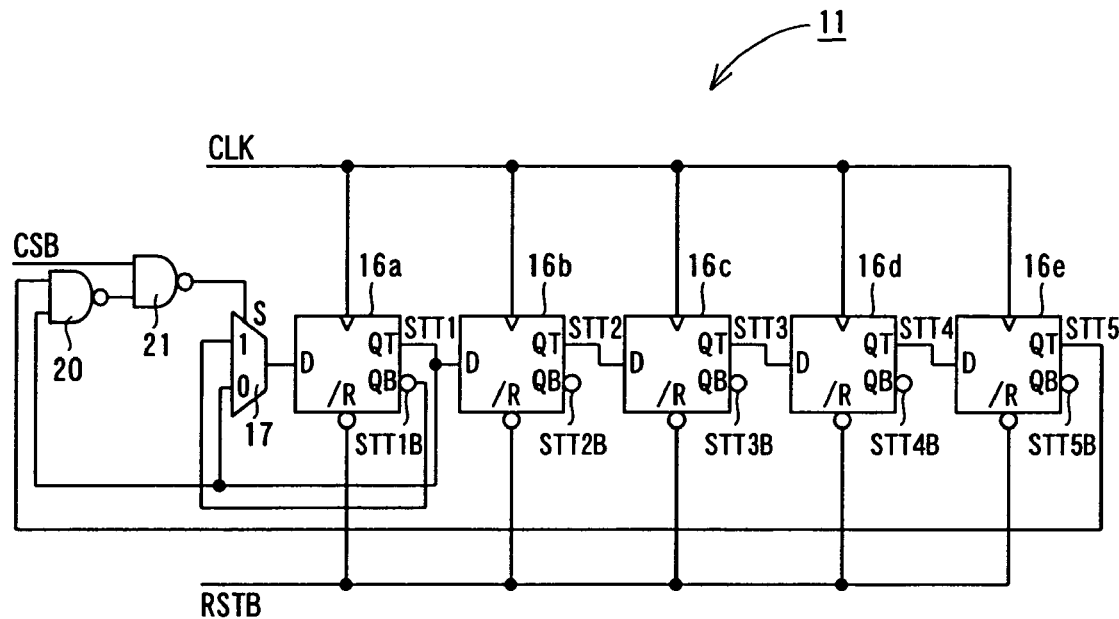
FIG. 24 is a circuit diagram showing the structure of a state machine circuit generating state signals in the memory according to the modification of the present invention shown in FIG. 23.
Figure 25:
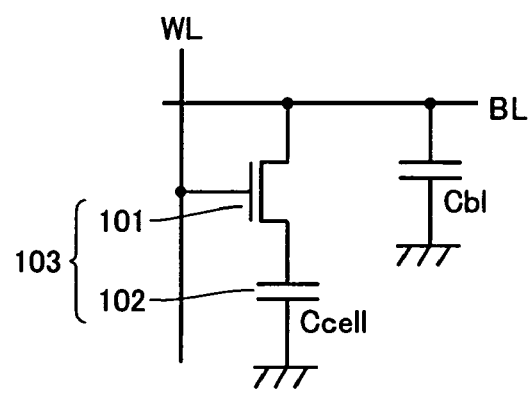
FIG. 25 illustrates the structure of each memory cell of a conventional DRAM.
Figure 26:
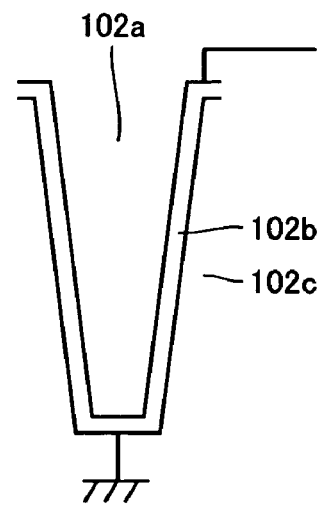
FIG. 26 is a sectional view showing the structure of each trench capacitor of the conventional DRAM.
Figure 27:
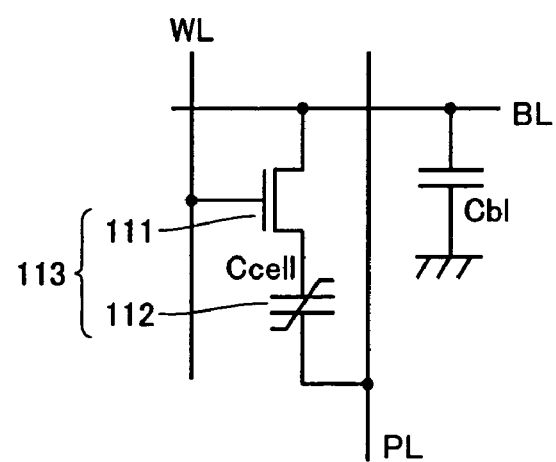
FIG. 27 is an equivalent circuit diagram showing each memory cell of a conventional one-transistor one-capacitor ferroelectric memory.
Figure 28:
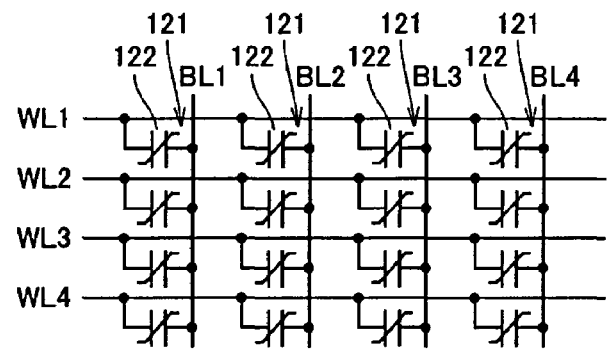
FIG. 28 is an equivalent circuit diagram showing a memory cell array of a conventional simple matrix ferroelectric memory.
Figure 29:
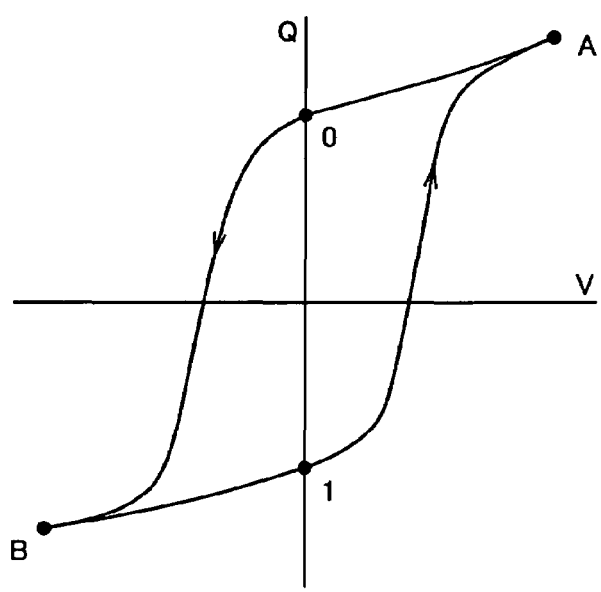
FIG. 29 is a hysteresis diagram for illustrating operations of the conventional simple matrix ferroelectric memory.

FIG. 24 is a circuit diagram showing the structure of a state machine circuit 11 generating the state signals STT1 to STT5 in the memory according to the modification of the present invention shown in FIG. 23. The state machine circuit 11 of the memory according to the modification has the structure of a synchronous clock 5-bit Johnson counter. More specifically, the state machine circuit 11 includes five DFF circuits 16a to 16e, a selector circuit 17 and two NAND circuits 20 and 21, as shown in FIG. 24.

The DFF circuits 16a to 16e are supplied with a clock signal CLK and an inverted reset signal RSTB respectively. The inverted reset signal RSTB is input from input terminals /R of the DFF circuits 16a to 16e. An output signal from the selector circuit 17 is input in another input terminal D of the DFF circuit 16a. The DFF circuit 16a outputs the state signal STT1 from its output terminal QT. This state signal STT1 is input in a "0" side of the selector circuit 17, the NAND circuit 20 and the subsequent DFF circuit 16b. Similarly, the state signals STT1 to STT4 from the precedent DFF circuits 16b to 16d are input in the subsequent DFF circuits 16c to 16e respectively. The state signal STT5 output from the DFF circuit 16e is input in the NAND circuit 20. The DFF circuits 16a to 16e output inverted state signals STT1B to STT5B from output terminals QB thereof. The inverted state signal STT1B output from the output terminal QB of the DFF circuit 16a is input in a "1" side of the selector circuit 17. The NAND circuit 21 receives an externally supplied inverted chip selection signal CSB and an output of the NAND circuit 20. An output of the NAND circuit 21 is input in the selector circuit 17.

In operation, the state machine circuit 11 of the memory according to the modification of the present invention inputs a low-level inverted reset signal RSTB in the DFF circuits 16a to 16e so that all state signals STT1 to STT5 output from the DFF circuits 16a to 16e go low. At this time, the NAND circuit 20 receiving the low-level state signals STT1 and STT5 inputs a high-level signal in the NAND circuit 21. When a high-level inverted chip selection signal CSB is input in the NAND circuit 21 in this state, the NAND circuit 21 inputs a low-level signal in the selector circuit 17. Thus, the input of the selector circuit 17 is switched to the "0" side, whereby the low-level state signal STT1 output from the DFF circuit 16a is supplied to the DFF circuit 16a through the selector circuit 17. Thus, the state signal STT1 output from the DFF circuit 16a is held at the low level, whereby the state signal STT2 output from the DFF circuit 16b receiving the state signal STT1 is also held at the low level. Thus, the DFF circuits 16c to 16e receiving output signals from the precedent DFF circuits 16b to 16d respectively continuously output the low-level state signals STT3 to STT5.

When a low-level inverted chip selection signal CSB is input in the NAND circuit 21 receiving the high-level signal from the NAND circuit 20, on the other hand, the NAND circuit 21 inputs a high-level signal in the selector circuit 17. Thus, the input of the selector circuit 17 is switched to the "1" side, whereby a high-level inverted state signal STT1B output from the DFF circuit 16a is supplied to the DFF circuit 16a through the selector circuit 17.

Then, the clock signal CLK goes high, whereby the state signal STT1 output from the DFF circuit 16a goes high. On the other hand, state signals STT2 to STT5 output from the DFF circuits 16b to 16e respectively are held at low levels. A high-level state signal STT1 output from the DFF circuit 16a is input in the subsequent DFF circuit 16b. The high-level state signal STT1 output from the DFF circuit 16a is also input in the NAND circuit 20. Thus, the NAND circuit 20 inputs a high-level signal in the NAND circuit 21. At this time, the inverted chip selection signal CSB input in the NAND circuit 21 is held at a high level, whereby the signal input from the NAND circuit 21 in the selector circuit 17 is held at a low level. Thus, the input of the selector circuit 17 is held on the "0" side, whereby the high-level state signal STT1 output from the DFF circuit 16a is input in the DFF circuit 16a through the selector circuit 17 so that the DFF circuit 16a continuously outputs the high-level state signal STT1.

Then, the clock signal CLK goes high again, whereby the state signal STT2 output from the DFF circuit 16b goes high. At this time, the state signal STT1 output from the DFF circuit 16a is held at the high level, while the state signals STT3 to STT5 output from the DFF circuits 16c to 16e are held at the low levels. Thereafter the state signals STT3 to STT5 output from the DFF circuits 16c to 16e successively go high in response to the clock signal CLK successively going high through similar operations. Thereafter the state signals STT1 to STT5 further successively go high in response to the clock signal CLK successively going high through operations similar to the above.

While the state machine circuit 11 is so constituted as to delay the leading edge of the state signal STT5 and the trailing edge of the state signal STT3 by the period corresponding to two, three or four clock signals CLK in the memory according to each of the aforementioned embodiments, the present invention is not restricted to this but the state machine circuit 11 may alternatively be constituted to delay the leading edge of the state signal STT5 and the trailing edge of the state signal STT3 by a period corresponding to at least five clock signals CLK. The state machine circuit 11 can delay the leading edge of the state signal STT5 and the trailing edge of the state signal STT3 by the period corresponding to at least five clock signals CLK by increasing the numbers of stages of the DFF circuits 16g and 16h of the state machine circuit 11 (see FIG. 19) according to the second embodiment while adding a proper logic circuit thereby delaying the timing for outputting the high-level count-up signal CUP1B, for example.

While the voltages VCC employed for the read and rewrite operations respectively are identical to each other in the memory according to each of the aforementioned embodiments, the present invention is not restricted to this but the voltages VCC employed for the read and rewrite operations respectively may be different from each other. For example, the voltages VCC for the read and rewrite operations may alternatively set to about 3.3 V and about 3.0 V respectively. In this case, the voltages ⅓ VCC in the read and rewrite operations are about 1.1 V and about 1.0 V respectively.

What is claimed is:

1. A memory comprising:
a plurality of bit lines;
a plurality of word lines arranged to intersect with said plurality of bit lines; and
a plurality of storage means, each connected at an intersection of said plurality of bit lines and said plurality of word lines,
wherein a selected at least one of said plurality of word lines and a selected at least one of said plurality of bit lines corresponding to non-rewritten one of said plurality of storage means are activated while keeping a potential difference therebetween at a level not more than a prescribed value, and
wherein a length of a period is differentiated for applying a voltage for rewriting to said selected at least one of said plurality of word lines and to said selected at least one of said plurality of bit lines corresponding to a rewritten one of said plurality of storage means from the length of a transition period of the potential of at least either said selected one of said plurality of word lines or said selected one of said plurality of bit lines corresponding to said non-rewritten one of said plurality of storage means, when performing a read operation on a selected one of said plurality of said storage means connected to said selected one of said plurality of word lines, and thereafter performing a rewrite operation on at least one of selected plurality of storage means or performing no rewrite operation on said selected one of said plurality of storage means.

2. The memory according to claim 1, wherein the length of said period for applying said voltage is larger than the length of said transition period of the voltage of at least either said selected one of said plurality of word lines or said selected one of said plurality of bit lines corresponding to said non-rewritten one of said plurality of storage means.

3. The memory according to claim 1, wherein said rewrite operation consists of a plurality of operations including:
a first electric field is supplied in a first direction and a second electric field is supplied opposite to said first direction, to at least non-selected plurality of storage means with the same frequencies respectively throughout said read operation and said rewrite operation.

4. The memory according to claim 1, wherein a first voltage applied to at least either said selected one of said plurality of word lines or applied to said selected one of said plurality of bit lines corresponding to said non-rewritten one of said plurality of storage means gradually rises to a second voltage applied to said non-rewritten one of said plurality of storage means.

5. The memory according to claim 4, wherein said first voltage rises stepwise by not more than ⅓ of potential difference of the second voltage applied to said non-rewritten one of said plurality of storage means.

6. The memory according to claim 1, wherein a first voltage applied to said selected one of said plurality of bit lines corresponding to said non-rewritten one of said plurality of storage means rises to a second voltage applied to said non-rewritten one of said plurality of storage means while keeping said potential difference between said selected one of said plurality of bit lines and said selected one of said plurality of word lines at a level not more than a prescribed value before said selected one of said plurality of word lines rises.

7. The memory according to claim 6, wherein said first voltage rises by ⅓ of potential difference of said second voltage applied to said non-written one of said plurality of storage means as a first stage and thereafter rises by ⅓ of said potential difference of said second voltage applied to said rewritten one of said plurality of storage means as a second stage.

8. The memory according to claim 7, wherein ⅓ of said potential difference is applied to said rewritten one of said plurality of storage means also to said selected one of said plurality of word lines when said one of said plurality of bit lines corresponding to said unrewritten one of said plurality of storage means rises by ⅓ of said potential difference.

9. The memory according to claim 1, further includes:
a plurality of ferroelectric films, each ferroelectric film arranged at the intersection between said plurality of word lines and said plurality of bit lines.

10. A memory comprising:
a plurality of bit lines;
a plurality of word line lines arranged to intersect with said plurality of bit lines; and
a plurality of storage means, each connected at an intersection of said plurality of bit lines and plurality of said word lines,
wherein a selected one of said plurality of word lines and a selected one of said plurality of bit lines corresponding to non-rewritten one of said plurality of storage means are activated while keeping a potential difference therebetween at a level not more than a prescribed value, and
wherein at least either said selected one of said plurality of word lines or said selected one of said plurality of said bit line lines corresponding to said non-rewritten one of said plurality of storage means are activated by applying stepwise of not more than ⅓ of potential difference as applied to a rewritten one of said plurality of said storage means when performing a read operation on a selected one of said plurality of storage means and thereafter performing a rewrite operation on a plurality of said selected said plurality of storage means or performing no rewrite operation on all said selected said plurality of storage means.

11. The memory according to claim 10, wherein a first voltage of said plurality of bit lines corresponding to said non-rewritten one of said plurality of storage means rises to a second voltage applied to said non-rewritten one of said plurality of storage means while keeping said potential difference between said plurality of bit lines and said plurality of word lines at a level not more than a prescribed value before said selected one of said plurality of word lines rises.

12. The memory according to claim 11, wherein said first voltage rises by ⅓ of potential difference applied to said rewritten one of said plurality of storage means as a first stage and thereafter rises by ⅓ of said potential difference applied to said rewritten one of said plurality of storage means as a second stage.

13. The memory according to claim 12, wherein ⅓ of said potential difference is applied to said rewritten one of said plurality of storage means also to said selected one of said plurality of word lines when said one of said plurality of bit lines corresponding to said unrewritten one of said plurality of storage means rises by ⅓ of said potential difference.

14. The memory according to claim 10, further includes:
a plurality of ferroelectric films, each ferroelectric film arranged at the intersection between said plurality of word lines and said plurality of bit lines.

15. A memory comprising:
a plurality of bit lines;
a plurality of word line lines arranged to intersect with said plurality of bit lines; and
a plurality of storage means, each connected at an intersection of said plurality of bit lines and plurality of said word lines; and
a control circuit for activating a selected one of said plurality of word lines and a selected one of said plurality of bit lines corresponding to a non-rewritten one of said plurality of storage means while keeping a potential difference therebetween at a level not more than a prescribed value, and for differentiating a length of a period for applying a voltage for rewriting to a selected one of said plurality of word lines and to a selected one of said plurality of bit lines corresponding to a rewritten one of said plurality of storage means from the length of a transition period of the potential of at least either said selected one of said plurality of word lines or said selected one of said plurality of bit lines corresponding to said non-rewritten one of said plurality of storage means, when performing a read operation on said selected one of said plurality of said storage means connected to said selected one of said plurality of word lines, and thereafter performing a rewrite operation on at least one of selected plurality of storage means or performing no rewrite operation on a selected one of said plurality of storage means.

16. The memory according to claim 15, wherein
said control circuit includes a clock control circuit for generating a first signal for setting a first starting point and a first end point of a transition period of the potential of at least either said plurality of word lines or said plurality bit lines corresponding to said non-rewritten one of said plurality of storage means, and for generating a second signal for setting a second starting point and a second end point of a period for applying a voltage for rewriting to each of said selected one of said plurality of word lines and said selected one of said plurality of bit lines corresponding to said rewritten one of said plurality of storage means.

17. The memory according to claim 15, wherein
said control circuit includes a delay circuit for generating a first signal for setting a first starting point and a first end point of a transition period of the potential of at least either said plurality of word lines or said plurality of bit lines corresponding to said non-rewritten one of said plurality of storage means, and for generating a second signal for setting a second starting point and a second end point of a period for applying a voltage for rewriting to each of said selected one of said plurality word lines and said selected one of said plurality of bit lines corresponding to said rewritten one of said plurality of storage means.

18. The memory according to claim 15, wherein
the length of said period for applying said voltage is larger than the length of said transition period of the voltage of at least either said one of said plurality of word lines or said one of said plurality of bit lines corresponding to said unrewritten one of said plurality of storage means.

19. The memory according to claim 15, wherein
said rewrite operation consists of a plurality of operations including:
a first electric field is supplied in a first direction and a second electric field is supplied opposite to said first direction, to at least non-selected plurality of storage means with the same frequencies respectively throughout said read operation and said rewrite operation.

20. The memory according to claim 15, wherein
a first voltage applied to at least either said selected one of said plurality of word lines or applied to said selected on of said plurality of bit lines corresponding to said non-rewritten one of said plurality of storage means gradually rises to a second voltage applied to said non-rewritten one of said plurality of storage means.

21. The memory according to claim 20, wherein
said first voltage rises stepwise by not more than ⅓ of potential difference of the second voltage applied to said non-rewritten one of said plurality of storage means.

22. The memory according to claim 15, wherein
a first voltage applied to said selected one of said plurality of bit lines corresponding to said non-rewritten one of said plurality of storage means rises to a second voltage applied to said non-rewritten one of said plurality of storage means while keeping said potential difference between said selected one of said plurality of bit lines and said selected one of said plurality of word lines at a level not more than a prescribed value before said selected one of said plurality of word lines rises.

23. The memory according to claim 22, wherein
said first voltage rises by ⅓ of potential difference of said second voltage applied to said non-rewritten one of said plurality of storage means as a first stage and thereafter rises by ⅓ of said potential difference of said second voltage applied to said rewritten one of said plurality of storage means as a second stage.

24. The memory according to claim 23, wherein ⅓ of said potential difference is applied to said rewritten one of said plurality of storage means also to said selected one of said plurality of word lines when said one of said plurality of bit lines corresponding to said unrewritten one of said plurality of storage means rises by ⅓ of said potential difference.

25. The memory according to claim 15, further includes:
a plurality of ferroelectric films, each ferroelectric film arranged at the intersection between said plurality of word lines and said plurality of bit lines.

* * * * *